United States Patent
Kagan et al.

(10) Patent No.: US 12,332,967 B2
(45) Date of Patent: Jun. 17, 2025

(54) SYSTEMS AND METHODS FOR COLLECTING, ANALYZING, BILLING, AND REPORTING DATA FROM INTELLIGENT ELECTRONIC DEVICES

(71) Applicant: EI ELECTRONICS LLC, Westbury, NY (US)

(72) Inventors: Erran Kagan, Great Neck, NY (US); Luna A. Koval, Commack, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 1064 days.

(21) Appl. No.: 16/395,692

(22) Filed: Apr. 26, 2019

(65) Prior Publication Data

US 2019/0251641 A1 Aug. 15, 2019

Related U.S. Application Data

(63) Continuation of application No. 13/831,708, filed on Mar. 15, 2013, now Pat. No. 10,275,840, which is a
(Continued)

(51) Int. Cl.
*G06F 16/958* (2019.01)
*G01D 4/00* (2006.01)
(Continued)

(52) U.S. Cl.
CPC ........... *G06F 16/972* (2019.01); *G01D 4/004* (2013.01); *G06Q 50/06* (2013.01); *H04L 67/06* (2013.01);
(Continued)

(58) Field of Classification Search
CPC ....... G06F 16/972; H04W 4/38; G01D 4/004; G01D 4/002; G06Q 50/06; H04L 67/06;
(Continued)

(56) References Cited

U.S. PATENT DOCUMENTS

| | | |
|---|---|---|
| 2,883,255 A | 4/1959 | Anderson |
| 2,987,704 A | 6/1961 | Gimpel et al. |

(Continued)

FOREIGN PATENT DOCUMENTS

| | | |
|---|---|---|
| CN | 101799681 A | 8/2010 |
| CN | 111444240 A | 7/2020 |

(Continued)

OTHER PUBLICATIONS

Wikipedia, Dojo Toolkit, https://web.archive.org/web/20130201004903/https://en.wikipedia.org/wiki/Dojo_Toolkit, Feb. 1, 2013, 10 pp. (Year: 2013).*

(Continued)

*Primary Examiner* — Marc S Somers
(74) *Attorney, Agent, or Firm* — Robinson + Cole LLP

(57) ABSTRACT

Systems and methods for collecting, analyzing, billing and reporting data from intelligent electronic devices are provided. The intelligent electronic devices include at least one sensor configured to measure at least one parameter of an electrical distribution system and output a signal indicative of the measured at least one parameter; at least one analog-to-digital converter configured to receive the output signals and convert the output signal to a digital signal; and at least one processing device configured to execute a plurality on instructions to implement a general purpose operating system for executing at least two applications, each application configured to implement a predetermined functionality based on the at least one parameter of the electrical distribution system, wherein each of the applications is independent of the other application. In one aspect, the intelligent electronic devices include a network discovery module configured to detect communication settings of a network.

22 Claims, 19 Drawing Sheets

Related U.S. Application Data continuation-in-part of application No. 13/644,877, filed on Oct. 4, 2012, now abandoned.

(60) Provisional application No. 61/542,935, filed on Oct. 4, 2011.

(51) Int. Cl.

| | | |
|---|---|---|
| *G01R 19/25* | (2006.01) | |
| *G01R 22/06* | (2006.01) | |
| *G06Q 50/06* | (2024.01) | |
| *H04L 67/06* | (2022.01) | |
| *H04W 4/38* | (2018.01) | |

(52) U.S. Cl.
CPC .............. *H04W 4/38* (2018.02); *G01D 4/002* (2013.01); *G01R 19/2513* (2013.01); *G01R 22/063* (2013.01); *Y02B 90/20* (2013.01); *Y04S 20/30* (2013.01)

(58) Field of Classification Search
CPC .. G01R 19/2513; G01R 22/063; Y02B 90/20; Y04S 20/30
See application file for complete search history.

(56) References Cited

U.S. PATENT DOCUMENTS

| | | |
|---|---|---|
| 3,142,820 A | 7/1964 | Daniels |
| 3,453,540 A | 7/1969 | Dusheck, Jr. |
| 3,824,441 A | 7/1974 | Heyman et al. |
| 4,246,623 A | 1/1981 | Sun |
| 4,466,071 A | 8/1984 | Russell |
| 4,489,386 A | 12/1984 | Breddan |
| 4,884,021 A | 11/1989 | Hammond et al. |
| 4,996,646 A | 2/1991 | Farrington |
| 5,014,229 A | 5/1991 | Mofachern |
| 5,166,887 A | 11/1992 | Farrington et al. |
| 5,170,360 A | 12/1992 | Porter et al. |
| 5,185,705 A | 2/1993 | Farrington |
| 5,212,441 A | 5/1993 | McEachern et al. |
| 5,224,054 A | 6/1993 | Wallis |
| 5,233,538 A | 8/1993 | Wallis |
| 5,237,511 A | 8/1993 | Caird et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,122 A | 4/1994 | Halpern |
| 5,302,890 A | 4/1994 | McEachern et al. |
| 5,307,009 A | 4/1994 | McEachern et al. |
| 5,315,527 A | 5/1994 | Beckwith |
| 5,347,464 A | 9/1994 | McEachern et al. |
| 5,544,064 A | 8/1996 | Beckwith |
| 5,559,719 A | 9/1996 | Johnson et al. |
| 5,574,654 A | 11/1996 | Bingham et al. |
| 5,581,173 A | 12/1996 | Yalla et al. |
| 5,706,204 A | 1/1998 | Cox et al. |
| 5,724,556 A | 3/1998 | Souder et al. |
| 5,764,523 A | 6/1998 | Yoshinaga et al. |
| 5,774,366 A | 6/1998 | Beckwith |
| 5,796,977 A | 8/1998 | Sarangdhar et al. |
| 5,801,643 A | 9/1998 | Williams et al. |
| 5,819,203 A | 10/1998 | Moore et al. |
| 5,822,165 A | 10/1998 | Moran |
| 5,832,210 A | 11/1998 | Akiyama et al. |
| 5,874,903 A | 2/1999 | Shuey et al. |
| 5,898,387 A | 4/1999 | Davis et al. |
| 5,899,960 A | 5/1999 | Moore et al. |
| 5,986,574 A | 11/1999 | Colton |
| 6,018,690 A | 1/2000 | Saito et al. |
| 6,028,857 A | 2/2000 | Poor |
| 6,038,516 A | 3/2000 | Alexander et al. |
| 6,073,169 A | 6/2000 | Shuey et al. |
| 6,098,175 A | 8/2000 | Lee |
| 6,100,817 A | 8/2000 | Mason, Jr. et al. |
| 6,121,593 A | 9/2000 | Mansbery et al. |
| 6,151,653 A | 11/2000 | Lin et al. |
| 6,157,329 A | 12/2000 | Lee et al. |
| 6,167,329 A | 12/2000 | Engel et al. |
| 6,195,614 B1 | 2/2001 | Kochan |
| 6,279,037 B1 | 8/2001 | Tams et al. |
| 6,289,267 B1 | 9/2001 | Alexander et al. |
| 6,343,299 B1 | 1/2002 | Huang et al. |
| 6,393,458 B1 | 5/2002 | Gigliotti et al. |
| 6,396,839 B1 | 5/2002 | Ardalan et al. |
| 6,405,128 B1 | 6/2002 | Bechtolsheim et al. |
| 6,437,692 B1 | 8/2002 | Petite et al. |
| 6,487,457 B1 | 11/2002 | Hull et al. |
| 6,493,644 B1 | 12/2002 | Jonker et al. |
| 6,496,511 B1 | 12/2002 | Wang et al. |
| 6,519,537 B1 | 2/2003 | Yang |
| 6,528,957 B1 | 3/2003 | Luchaco |
| 6,560,608 B1 | 5/2003 | Tomm et al. |
| 6,564,332 B1 | 5/2003 | Nguyen et al. |
| 6,565,608 B1 | 5/2003 | Fein et al. |
| 6,615,147 B1 | 9/2003 | Jonker et al. |
| 6,636,030 B1 | 10/2003 | Rose et al. |
| 6,657,552 B2 | 12/2003 | Belski et al. |
| 6,671,654 B1 | 12/2003 | Forth et al. |
| 6,671,802 B1 | 12/2003 | Ott |
| 6,717,394 B2 | 4/2004 | Elms |
| 6,735,535 B1 | 5/2004 | Kagan et al. |
| 6,751,563 B2 | 6/2004 | Spanier et al. |
| 6,836,737 B2 | 12/2004 | Petite et al. |
| 6,842,707 B2 | 1/2005 | Raichle et al. |
| 6,900,738 B2 | 5/2005 | Crichlow |
| 6,904,385 B1 | 6/2005 | Budike |
| 6,957,158 B1 | 10/2005 | Hancock et al. |
| 6,972,364 B2 | 12/2005 | Diedrichsen |
| 6,985,087 B2 | 1/2006 | Soliman |
| 7,006,934 B2 | 2/2006 | Jonker et al. |
| 7,010,438 B2 | 3/2006 | Hancock et al. |
| 7,043,459 B2 | 5/2006 | Peevey |
| 7,049,975 B2 | 5/2006 | Vanderah et al. |
| 7,050,808 B2 | 5/2006 | Janusz et al. |
| 7,072,779 B2 | 7/2006 | Hancock et al. |
| 7,085,824 B2 | 8/2006 | Forth et al. |
| 7,085,938 B1 | 8/2006 | Pozzuoli et al. |
| 7,126,493 B2 | 10/2006 | Junker et al. |
| 7,129,848 B2 | 10/2006 | Milliot et al. |
| 7,203,319 B2 | 4/2007 | Ben-Zur et al. |
| 7,243,050 B2 | 7/2007 | Armstrong |
| 7,249,265 B2 | 7/2007 | Carolsfeld et al. |
| 7,271,996 B2 | 9/2007 | Kagan et al. |
| 7,299,308 B2 | 11/2007 | Kondo et al. |
| 7,304,586 B2 | 12/2007 | Wang et al. |
| 7,337,081 B1 | 2/2008 | Kagan |
| 7,342,507 B2 | 3/2008 | Jonker et al. |
| 7,436,687 B2 | 10/2008 | Patel |
| 7,444,454 B2 | 10/2008 | Yancey et al. |
| 7,511,468 B2 | 3/2009 | McEachern et al. |
| 7,514,907 B2 | 4/2009 | Rajda et al. |
| 7,616,656 B2 | 11/2009 | Wang et al. |
| 7,668,663 B2 | 2/2010 | Kurnik et al. |
| 7,702,779 B1 | 4/2010 | Gupta et al. |
| 7,739,728 B1 | 6/2010 | Koehler et al. |
| 7,813,822 B1 | 10/2010 | Hoffberg |
| 7,899,630 B2 | 3/2011 | Kagan |
| 7,916,015 B1 | 3/2011 | Evancich et al. |
| 7,916,060 B2 | 3/2011 | Zhu et al. |
| 7,921,199 B1 | 4/2011 | Shirriff et al. |
| 7,961,736 B2 | 6/2011 | Ayyagari |
| 7,962,298 B2 | 6/2011 | Przydatek et al. |
| 7,999,696 B2 | 8/2011 | Wang et al. |
| 8,019,836 B2 | 9/2011 | Elliott et al. |
| 8,024,073 B2 | 9/2011 | Imes et al. |
| 8,037,173 B2 | 10/2011 | Tuckey et al. |
| 8,078,418 B2 | 12/2011 | Banhegyesi et al. |
| 8,160,824 B2 | 4/2012 | Spanier et al. |
| 8,190,381 B2 | 5/2012 | Spanier et al. |

(56) References Cited

U.S. PATENT DOCUMENTS

| | | |
|---|---|---|
| 8,193,929 B1 | 6/2012 | Siu et al. |
| 8,250,246 B2 | 8/2012 | Brockmann et al. |
| 8,335,936 B2 | 12/2012 | Jonsson et al. |
| 8,402,267 B1 | 3/2013 | Graham et al. |
| 8,599,036 B2 | 12/2013 | Wang et al. |
| 8,635,036 B2 | 1/2014 | Pamulaparthy et al. |
| 8,700,347 B2 | 4/2014 | Spanier et al. |
| 8,717,007 B2 | 5/2014 | Banhegyesi |
| 8,812,979 B2 | 8/2014 | Khanke et al. |
| 8,933,815 B2 | 1/2015 | Kagan et al. |
| 8,949,990 B1 | 2/2015 | Hsieh et al. |
| 9,080,894 B2 | 7/2015 | Spanier et al. |
| 9,094,227 B2 | 7/2015 | Park |
| 9,161,102 B2 | 10/2015 | Millstein et al. |
| 9,268,552 B1 | 2/2016 | Kiiskila et al. |
| 9,310,792 B2 | 4/2016 | Lu et al. |
| 9,660,994 B2 | 5/2017 | McQuillan et al. |
| 10,303,860 B2 | 5/2019 | Koval et al. |
| 10,510,000 B1 | 12/2019 | Commons |
| 10,678,964 B2 | 6/2020 | Kawai |
| 10,972,556 B1 | 4/2021 | Cheng et al. |
| 11,276,395 B1 | 3/2022 | Jones et al. |
| 2002/0024453 A1 | 2/2002 | Maeda |
| 2002/0032535 A1 | 3/2002 | Alexander et al. |
| 2002/0048269 A1 | 4/2002 | Hong et al. |
| 2002/0052972 A1 | 5/2002 | Yim |
| 2002/0065872 A1 | 5/2002 | Genske et al. |
| 2002/0073211 A1 | 6/2002 | Lin et al. |
| 2002/0105435 A1 | 8/2002 | Yee et al. |
| 2002/0120723 A1 | 8/2002 | Forth et al. |
| 2002/0129342 A1 | 9/2002 | Kil et al. |
| 2002/0133504 A1 | 9/2002 | Vlahos et al. |
| 2002/0162014 A1 | 10/2002 | Przydatek et al. |
| 2002/0169570 A1 | 11/2002 | Spanier et al. |
| 2002/0174223 A1 | 11/2002 | Childers et al. |
| 2002/0188706 A1 | 12/2002 | Richards et al. |
| 2003/0005130 A1 | 1/2003 | Cheng |
| 2003/0014200 A1 | 1/2003 | Jonker et al. |
| 2003/0065757 A1 | 4/2003 | Mentze et al. |
| 2003/0084280 A1 | 5/2003 | Bryan et al. |
| 2003/0093429 A1 | 5/2003 | Nishikawa et al. |
| 2003/0110380 A1 | 6/2003 | Carolsfeld et al. |
| 2003/0163508 A1 | 8/2003 | Goodman |
| 2003/0178982 A1 | 9/2003 | Elms |
| 2003/0179714 A1 | 9/2003 | Gilgenbach et al. |
| 2003/0187550 A1 | 10/2003 | Wilson et al. |
| 2003/0200285 A1 | 10/2003 | Hansen et al. |
| 2003/0204756 A1 | 10/2003 | Ransom et al. |
| 2003/0226058 A1 | 12/2003 | Miller et al. |
| 2004/0078474 A1 | 4/2004 | Ramaswamy |
| 2004/0088408 A1 | 5/2004 | Tsyganskiy |
| 2004/0098459 A1 | 5/2004 | Leukert-Knapp et al. |
| 2004/0107025 A1 | 6/2004 | Ransom et al. |
| 2004/0122833 A1 | 6/2004 | Forth et al. |
| 2004/0127775 A1 | 7/2004 | Miyazaki et al. |
| 2004/0128260 A1 | 7/2004 | Amedure et al. |
| 2004/0138834 A1 | 7/2004 | Blackett et al. |
| 2004/0162642 A1 | 8/2004 | Gasper et al. |
| 2004/0170181 A1 | 9/2004 | Bogdon et al. |
| 2004/0172207 A1 | 9/2004 | Hancock et al. |
| 2004/0177062 A1 | 9/2004 | Urquhart et al. |
| 2004/0187028 A1 | 9/2004 | Perkins et al. |
| 2004/0193329 A1 | 9/2004 | Ransom et al. |
| 2004/0208182 A1 | 10/2004 | Boles et al. |
| 2004/0243735 A1 | 12/2004 | Rosenbloom et al. |
| 2004/0250059 A1 | 12/2004 | Ramelson et al. |
| 2005/0027464 A1 | 2/2005 | Jonker et al. |
| 2005/0033956 A1 | 2/2005 | Krempl |
| 2005/0060110 A1 | 3/2005 | Jones et al. |
| 2005/0093571 A1 | 5/2005 | Suaris et al. |
| 2005/0138421 A1 | 6/2005 | Fedronic et al. |
| 2005/0138432 A1 | 6/2005 | Ransom et al. |
| 2005/0144437 A1 | 6/2005 | Ransom et al. |
| 2005/0169309 A1 | 8/2005 | Tripathi et al. |
| 2005/0183128 A1 | 8/2005 | Assayag et al. |
| 2005/0187725 A1 | 8/2005 | Cox |
| 2005/0202808 A1 | 9/2005 | Fishman et al. |
| 2005/0234837 A1 | 10/2005 | Ramachandran et al. |
| 2005/0240540 A1 | 10/2005 | Borleske et al. |
| 2005/0253682 A1 | 11/2005 | Kato et al. |
| 2005/0273280 A1 | 12/2005 | Cox |
| 2005/0273281 A1 | 12/2005 | Wall et al. |
| 2006/0020788 A1 | 1/2006 | Han et al. |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0083260 A1 | 4/2006 | Wang et al. |
| 2006/0085419 A1 | 4/2006 | Rosen |
| 2006/0089932 A1 | 4/2006 | Buehler et al. |
| 2006/0145890 A1 | 7/2006 | Junker et al. |
| 2006/0155422 A1 | 7/2006 | Uy et al. |
| 2006/0155442 A1 | 7/2006 | Luo et al. |
| 2006/0161360 A1 | 7/2006 | Yao et al. |
| 2006/0161400 A1 | 7/2006 | Kagan |
| 2006/0200599 A1 | 9/2006 | Manchester et al. |
| 2006/0206433 A1 | 9/2006 | Scoggins |
| 2006/0265720 A1 | 11/2006 | Cai et al. |
| 2006/0267560 A1 | 11/2006 | Rajda et al. |
| 2006/0274899 A1 | 12/2006 | Zhu et al. |
| 2007/0047735 A1 | 3/2007 | Celli et al. |
| 2007/0058634 A1 | 3/2007 | Gupta et al. |
| 2007/0061786 A1 | 3/2007 | Zhou et al. |
| 2007/0067119 A1 | 3/2007 | Loewen et al. |
| 2007/0067121 A1 | 3/2007 | Przydatek et al. |
| 2007/0096765 A1 | 5/2007 | Kagan |
| 2007/0096942 A1 | 5/2007 | Kagan et al. |
| 2007/0106618 A1 | 5/2007 | Wu et al. |
| 2007/0114987 A1 | 5/2007 | Kagan |
| 2007/0120705 A1 | 5/2007 | Kiiskila et al. |
| 2007/0136236 A1 | 6/2007 | Kussmaul et al. |
| 2007/0152058 A1 | 7/2007 | Yeakley et al. |
| 2007/0186111 A1 | 8/2007 | Durand |
| 2007/0240159 A1 | 10/2007 | Sugiyama |
| 2007/0255861 A1 | 11/2007 | Kain et al. |
| 2007/0263643 A1 | 11/2007 | Wadhawan |
| 2007/0266004 A1 | 11/2007 | Wall et al. |
| 2008/0028395 A1 | 1/2008 | Motta et al. |
| 2008/0033786 A1 | 2/2008 | Boaz et al. |
| 2008/0033920 A1 | 2/2008 | Colclasure et al. |
| 2008/0046205 A1 | 2/2008 | Gilbert et al. |
| 2008/0052384 A1 | 2/2008 | Marl et al. |
| 2008/0071482 A1 | 3/2008 | Zweigle et al. |
| 2008/0074285 A1 | 3/2008 | Guthrie |
| 2008/0077806 A1 | 3/2008 | Cui et al. |
| 2008/0086222 A1 | 4/2008 | Kagan |
| 2008/0103631 A1 | 5/2008 | Koliwad et al. |
| 2008/0104149 A1 | 5/2008 | Vishniac et al. |
| 2008/0130639 A1 | 6/2008 | Costa-Requena et al. |
| 2008/0147334 A1 | 6/2008 | Kagan |
| 2008/0168434 A1 | 7/2008 | Gee et al. |
| 2008/0172192 A1 | 7/2008 | Banhegyesi |
| 2008/0187116 A1 | 8/2008 | Reeves et al. |
| 2008/0195562 A1 | 8/2008 | Worth et al. |
| 2008/0195794 A1 | 8/2008 | Banker |
| 2008/0201723 A1 | 8/2008 | Bottaro et al. |
| 2008/0215264 A1 | 9/2008 | Spanier et al. |
| 2008/0228830 A1 | 9/2008 | Hawtin |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0243404 A1 | 10/2008 | Banhegyesi |
| 2008/0291054 A1 | 11/2008 | Groft |
| 2009/0012728 A1 | 1/2009 | Spanier et al. |
| 2009/0037163 A1 | 2/2009 | Kong et al. |
| 2009/0055912 A1 | 2/2009 | Choi et al. |
| 2009/0070168 A1 | 3/2009 | Thompson et al. |
| 2009/0070447 A1 | 3/2009 | Jubinville et al. |
| 2009/0082879 A1 | 3/2009 | Dooley et al. |
| 2009/0082980 A1 | 3/2009 | Thurmond et al. |
| 2009/0094317 A1 | 4/2009 | Venkitaraman |
| 2009/0096654 A1 | 4/2009 | Zhu et al. |
| 2009/0115626 A1 | 5/2009 | Vaswani et al. |

(56) References Cited

U.S. PATENT DOCUMENTS

| | | |
|---|---|---|
| 2009/0119476 A1 | 5/2009 | Jernigan et al. |
| 2009/0172519 A1 | 7/2009 | Xu et al. |
| 2009/0190486 A1 | 7/2009 | LaVigne et al. |
| 2009/0196187 A1 | 8/2009 | Ooba et al. |
| 2009/0196206 A1 | 8/2009 | Weaver et al. |
| 2009/0228224 A1 | 9/2009 | Spanier et al. |
| 2009/0235075 A1 | 9/2009 | Cho et al. |
| 2009/0235090 A1 | 9/2009 | Chang |
| 2009/0276102 A1 | 11/2009 | Smith et al. |
| 2009/0292894 A1 | 11/2009 | Henry et al. |
| 2009/0300165 A1 | 12/2009 | Tuckey et al. |
| 2009/0307178 A1 | 12/2009 | Kuhns et al. |
| 2009/0327483 A1* | 12/2009 | Thompson ............... G06F 16/10 709/224 |
| 2010/0004350 A1 | 1/2010 | Zalich et al. |
| 2010/0007354 A1 | 1/2010 | Deaver et al. |
| 2010/0030734 A1 | 2/2010 | Chunilal |
| 2010/0031076 A1 | 2/2010 | Wan et al. |
| 2010/0054276 A1 | 3/2010 | Wang et al. |
| 2010/0057387 A1 | 3/2010 | Kagan et al. |
| 2010/0057628 A1 | 3/2010 | Trinidad et al. |
| 2010/0058355 A1 | 3/2010 | Gernaey |
| 2010/0073192 A1 | 3/2010 | Goldfisher et al. |
| 2010/0094851 A1 | 4/2010 | Bent et al. |
| 2010/0121996 A1 | 5/2010 | Schmidt et al. |
| 2010/0169709 A1 | 7/2010 | Chiu et al. |
| 2010/0169876 A1 | 7/2010 | Mann |
| 2010/0175062 A1 | 7/2010 | Kim |
| 2010/0211682 A1 | 8/2010 | Capomassi et al. |
| 2010/0217871 A1 | 8/2010 | Gammon |
| 2010/0238003 A1 | 9/2010 | Chan et al. |
| 2010/0278187 A1 | 11/2010 | Hart et al. |
| 2010/0299441 A1 | 11/2010 | Hughes et al. |
| 2010/0324845 A1 | 12/2010 | Spanier et al. |
| 2011/0004350 A1 | 1/2011 | Cheifetz et al. |
| 2011/0004426 A1 | 1/2011 | Wright et al. |
| 2011/0015961 A1 | 1/2011 | Chan |
| 2011/0016021 A1 | 1/2011 | Manning |
| 2011/0029461 A1 | 2/2011 | Hardin, Jr. |
| 2011/0040809 A1 | 2/2011 | Spanier et al. |
| 2011/0069709 A1 | 3/2011 | Morris et al. |
| 2011/0072423 A1 | 3/2011 | Fukata |
| 2011/0078305 A1 | 3/2011 | Varela |
| 2011/0093843 A1 | 4/2011 | Endo et al. |
| 2011/0106589 A1 | 5/2011 | Blomberg et al. |
| 2011/0107357 A1 | 5/2011 | Cullimore |
| 2011/0157837 A1 | 6/2011 | Balgard et al. |
| 2011/0178651 A1 | 7/2011 | Choi et al. |
| 2011/0184671 A1 | 7/2011 | Abiprojo et al. |
| 2011/0282508 A1 | 11/2011 | Goutard et al. |
| 2011/0296496 A1 | 12/2011 | O'Donnell et al. |
| 2012/0041696 A1 | 2/2012 | Sanderford et al. |
| 2012/0059932 A1 | 3/2012 | Messer et al. |
| 2012/0078547 A1 | 3/2012 | Murdoch |
| 2012/0079471 A1 | 3/2012 | Vidal et al. |
| 2012/0099478 A1 | 4/2012 | Fu et al. |
| 2012/0109999 A1 | 5/2012 | Futty et al. |
| 2012/0126995 A1 | 5/2012 | Sobotka et al. |
| 2012/0173032 A1 | 7/2012 | Pamulaparthy et al. |
| 2012/0209057 A1 | 8/2012 | Siess et al. |
| 2012/0216244 A1 | 8/2012 | Kumar et al. |
| 2012/0245595 A1 | 9/2012 | Kesavadas et al. |
| 2012/0265357 A1 | 10/2012 | Song et al. |
| 2012/0296746 A1 | 11/2012 | Bleadall et al. |
| 2012/0299744 A1 | 11/2012 | Sfaelos |
| 2013/0031201 A1 | 1/2013 | Kagan et al. |
| 2013/0055389 A1 | 2/2013 | Alvarez et al. |
| 2013/0066965 A1 | 3/2013 | Foti |
| 2013/0073059 A1 | 3/2013 | Brian et al. |
| 2013/0073374 A1 | 3/2013 | Heath |
| 2013/0084882 A1 | 4/2013 | Khorashadi et al. |
| 2013/0103657 A1 | 4/2013 | Ikawa et al. |
| 2013/0151849 A1 | 6/2013 | Graham et al. |
| 2013/0158918 A1 | 6/2013 | Spanier et al. |
| 2013/0198507 A1 | 8/2013 | Kasuya |
| 2013/0200702 A1 | 8/2013 | Schöppner |
| 2013/0204450 A1 | 8/2013 | Kagan et al. |
| 2013/0293390 A1 | 11/2013 | Buhan et al. |
| 2013/0318627 A1 | 11/2013 | Lundkvist et al. |
| 2014/0025321 A1 | 1/2014 | Spanier |
| 2014/0058572 A1 | 2/2014 | Stein et al. |
| 2014/0094194 A1 | 4/2014 | Schwent et al. |
| 2014/0149836 A1* | 5/2014 | Bedard ................ G06F 40/143 715/212 |
| 2014/0172885 A1* | 6/2014 | Sekharan ............. G06F 16/958 707/755 |
| 2014/0236371 A1 | 8/2014 | Ishihara et al. |
| 2014/0277788 A1 | 9/2014 | Forbes, Jr. |
| 2014/0281620 A1 | 9/2014 | Rallo et al. |
| 2014/0325679 A1 | 10/2014 | Heo et al. |
| 2015/0039279 A1 | 2/2015 | Volovoi |
| 2015/0089061 A1 | 3/2015 | Li et al. |
| 2015/0143108 A1 | 5/2015 | Demeter et al. |
| 2015/0178865 A1 | 6/2015 | Anderson et al. |
| 2015/0185748 A1 | 7/2015 | Ishchenko et al. |
| 2015/0286394 A1 | 10/2015 | Koval |
| 2015/0294013 A1 | 10/2015 | Ozer |
| 2015/0316907 A1 | 11/2015 | ElBsat et al. |
| 2015/0317151 A1 | 11/2015 | Falcy et al. |
| 2015/0317589 A1 | 11/2015 | Anderson et al. |
| 2015/0324896 A1 | 11/2015 | Marson et al. |
| 2015/0341969 A1 | 11/2015 | Brochu et al. |
| 2016/0011616 A1 | 1/2016 | Janous et al. |
| 2016/0034437 A1 | 2/2016 | Yong et al. |
| 2016/0156184 A1 | 6/2016 | Sharma et al. |
| 2016/0283256 A1 | 9/2016 | Standley et al. |
| 2016/0294953 A1 | 10/2016 | Prabhakar et al. |
| 2016/0359684 A1 | 12/2016 | Rizqi et al. |
| 2016/0364648 A1 | 12/2016 | Du et al. |
| 2017/0011320 A1 | 1/2017 | Anderson et al. |
| 2017/0039372 A1 | 2/2017 | Koval et al. |
| 2017/0063566 A1 | 3/2017 | Seminario et al. |
| 2017/0078455 A1 | 3/2017 | Fisher et al. |
| 2017/0140149 A1 | 5/2017 | Dumas et al. |
| 2017/0147329 A1 | 5/2017 | Shutt et al. |
| 2017/0162320 A1 | 6/2017 | Rumrill |
| 2017/0180137 A1 | 6/2017 | Spanier et al. |
| 2017/0185056 A1 | 6/2017 | Satou |
| 2017/0238805 A1 | 8/2017 | Addison et al. |
| 2017/0270414 A1 | 9/2017 | Ignatova et al. |
| 2017/0285114 A1 | 10/2017 | Bickel et al. |
| 2017/0317495 A1 | 11/2017 | Pavlovski et al. |
| 2017/0323208 A1 | 11/2017 | Al-Mohssen et al. |
| 2017/0373500 A1 | 12/2017 | Shafi et al. |
| 2018/0025423 A1 | 1/2018 | Utsumi et al. |
| 2018/0066860 A1 | 3/2018 | Carlson et al. |
| 2018/0260695 A1 | 9/2018 | Majumdar et al. |
| 2018/0260920 A1 | 9/2018 | Saratsis et al. |
| 2018/0275898 A1 | 9/2018 | Bhansali et al. |
| 2019/0086891 A1 | 3/2019 | Kawamoto et al. |
| 2019/0102411 A1 | 4/2019 | Hung et al. |
| 2019/0138964 A1 | 5/2019 | Morita et al. |
| 2019/0205116 A1 | 7/2019 | Chen et al. |
| 2019/0260204 A1 | 8/2019 | Koval et al. |
| 2019/0340545 A1 | 11/2019 | Minegishi et al. |
| 2019/0349733 A1 | 11/2019 | Nolan et al. |
| 2020/0143522 A1 | 5/2020 | Vogels et al. |
| 2020/0266628 A1 | 8/2020 | Kato et al. |
| 2020/0273268 A1 | 8/2020 | Bhattacharyya et al. |
| 2020/0333767 A1 | 10/2020 | Engelstein et al. |
| 2022/0279220 A1 | 9/2022 | Khavronin et al. |

FOREIGN PATENT DOCUMENTS

| | | |
|---|---|---|
| JP | 2001312712 A | 11/2001 |
| JP | 2009225629 A | 10/2009 |
| KR | 101522175 B1 | 5/2015 |
| WO | 2008099035 A1 | 8/2008 |

(56) References Cited

FOREIGN PATENT DOCUMENTS

| WO | 2009044369 A2 | 4/2009 |
|---|---|---|
| WO | 2009044369 A3 | 5/2009 |

OTHER PUBLICATIONS

ION Technology, 7500 ION 7600 ION High Visibility Energy & Power Quality Compliance Meters, Power Measurement, specification, pp. 1-8, revision date Nov. 30, 2000.
Microsoft TechNet, Using DNS Servers with DHCP, Jan. 21, 2005; Accessed from https://technet.microsoft.com/en-us/library/cc787034 on Jun. 9, 2015; pp. 1-4.
Allard, Jeremie, et al., "Jini meets UPnP: an architecture for Jini/UPnP interoperability.", Proceedings of the 2003 Symposium on Applications and the Internet, 2003. IEEE, 2003, 8 pages.
Braden, R (editor), "Requirements for Internet Hosts—Application and Support", RFC 1123, pp. 1-97, Oct. 1989.
Chima, Chikodi, "How Social Media Will Make the smart Energy Grid More Efficient", mashable.com, Feb. 8, 2011, pp. 1-4.
Communicator EXT 3.0 User Manual Revision 1.32, Electro Industries/Gauge Tech, 558 pages, Aug. 27, 2007.
Deutsch, P., Emtage, A., and Marine, A., "How to Use Anonymous FTP", RFC1635, pp. 1-13, May 1994.
Duncan, Brent K. et al., "Protection, metering, monitoring, and control of medium-voltage power systems.", IEEE Transactions on Industry Applications, vol. 40, No. 1, Jan./Feb. 2004; pp. 33-40.
Futura+Series, "Advanced Power Monitoring and Analysis for the 21st Century", Electro Industries/Gauge Tech, specification, 8 pages, Apr. 13, 2000.
Gonzales, Jesus and Papa, Mauricio, "Passive Scanning in Modbus Networks;" 2008, in IFIP International Federation for Information Processing, vol. 253, Critical Infrastructure Protection; 2008; pp. 175-187.
Hubbert, "What is flat file?", WhatIs.com, http://searchsqlserver.techtarget.com/definition/flat-file, Jul. 2006, 1 pp.
HW Virtual Serial Port, "HW Virtual Serial Port" Jul. 2003, http://www.trcontrolsolutions.com/pdfs/hw_vsp_v104_en.pdf; pp. 1-4.
IEC 61000-4-15: Electromagnetic compatibility (EMC) Part 4: Testing and measuring techniques, Section 15: Flickermeter—Functional and design specifications; CENELEC—European Committee for Electrotechnical Standardization; pp. 1-25; Apr. 1998.
ION Technology 7700 ION 3-Phase Power Meter, Analyzer and Controller, Power Measurement, specification, pp. 1-10, revision date Dec. 8, 1998.
ION Technology, 7500 ION High Visibility 3—Phase Energy & Power Quality Meter, Power Measurement, specification, pp. 1-8, revision date Mar. 21, 2000.
ION7550/ion7650 PowerLogic power-monitoring units, Technical data sheets, pp. 1-12, Copyright 2006 Schneider Electric.
Natarajan "4 Easy Steps to Upgrade Linksys Wireless Router" thegeekstuff.com, 2009, 3 pages. retreived from https://www.thegeekstuff.com/2009/06/how-to-upgrade-linksys-wireless-router-firmware on Jun. 7, 2019 (Year: 2009).
Nexus 1250 Installation and Operation Manual Revision 1.20, Electro Industries/Gauge Tech, 50 pages, Nov. 8, 2000.
Nexus 1250, Precision Power Meter & Data Acquisition Node, Accumeasure Technology, Electro Industries/Gauge Tech, specification, 16 pages, Nov. 1999.
Performance Power Meter & Data Acquisition Node, Electro Industries/Gauge Tech, Nexus 1250 specification, 8 pages, Dec. 14, 2000.
Postel, J.B., and Reynolds, J.K. "File Transfer Protocol (FTP)", RFC959, pp. 1-66, Oct. 1985.
PowerLogic Series 4000 Circuit Monitors, pp. 1-4; Document #3020HO0601; Jan. 2006.
RFC2228 FTP Security Extensions; Network Working Group, Internet Society, 1997; Retrieved from https://tools.ietf.org/html/rfc2228 Apr. 18, 2019; (Year: 1997); pp. 1-28.
Speirs, "What is binary file?", WhatIs.com, http://whatis.techtarget.com/definition/binary-file, Apr. 2005, 1 pp.

UPnP Forum, "UPnP Device Architecture 1.0", Rev. Apr. 24, 2008, pp. 1-80.
User's Installation & Operation and User's Programming Manual. The Futura Series, Electro Industries, pp. 1-64, Copyright 1995.
White, Russ, "Working with IP addresses"; http://web.archive.org/web/20060508172602/http://www.cisco.com/web/about/ac123/ac147/archived_issues/ipj_9-1/ip_addresses.tml, May 8, 2006; Copyright 1992-2006 Cisco Systems, Inc., pp. 1-8.
Wikipedia, Burst mode (computing), https://web.archive.org/web/20081018044345/http://en.wikipedia.org/wiki/Burst_mode_(computing), Oct. 18, 2008, 1 pp.
Wikipedia, File Transfer Protocol, https://web.archive.org/web/20051216071210/http:en.wikipedia.org/wiki/File_Transfer_Protocol, Dec. 16, 2005, 9 pp.
Wikipedia, Universal Plug and Play, https://web.archive.org/web/2001014015536/http://en.wikipedia.org/wiki/Universal_Plug_and_Play, Oct. 14, 2007, 14 pp.
Wikipedia, User Datagram Protocol, https://web.archive.org/web/20050823032448/https://en.wikipedia.org/wiki/User_Datagram_Protocol, Aug. 23, 2005, 2 pp. (Year: 2005).
Wils, Andrew, et al.,"Device discovery via residential gateways.", IEEE Transactions on Consumer Electronics, vol. 48, No. 3; Aug. 2002; pp. 478-483.
Yum, Secured Remote Data, Manual p. 2012; Retrieved from yum.baseurl.org/wiki/securedRemoteData on Apr. 18, 2019. (Dated Reference from Archive.org attached) (Year: 2012) pp. 1-2.
Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, p. 14.
Zhang, Chun, et al., "On supporting containment queries in relational database management systems.", ACM SIGMOD Record. vol. 30. No. 2. ACM, 2001; pp. 425-436.
"The Debian New Maintainer's Guide", Debian.org, 2011, Chapters 1, 6, and B. retrieved from https://web.archive.org/web/2011051401193B/http://www.debian.org/doc/manuals/maint-guide/start.en.html (Apr. 2, 2021). (Year: 2011).
Microsoft, Microsoft Computer Dictionary, 5th Ed. 2002; pp. 174, 215, and 276 (excerpt includes table of contents and frontmatter). (Year: 2002).
Andersen, M.P. and Culler, D.E., 2016. Btrdb: Optimizing storage system design for timeseries processing. In 14th {USENIX}Conference on File and Storage Technologies ({FAST} 16) (pp. 39-52). (Year: 2016).
Dong Yu, Wayne Xiong, Jasha Droppo, Andreas Stolcke, Guoli Ye, Jinyu Li, Geoffrey Zweig, 2016. Proc. Interspeech: Deep Convolutional Neural Networks with Layer-wise Context Expansion and Attention, 5 pages, Sep. 2016.
Janetzko, H., Stoffel, F., Mittelstadt, S. and Keim, DA, 2014. Anomaly detection for visual analytics of power consumption data. Computers & Graphics, 38, pp. 27-37. (Year: 2014).
Kezunovic, M., 2011. Smart fault location for smart grids. IEEE transactions on smart grid, 2(1), pp. 11-22. (Year: 2011).
Pan, J., Zi, Y., Chen, J., Zhou, Z. and Wang, B., 2017. LiftingNet: A novel deep learning network with layerwise feature learningfrom noisy mechanical data for fault classification. I EEE Transactions on Industrial Electronics, 65(6), pp. 4973-4982. (Year: 2017).
Trunov, A.S., Voronova, L.I., Voronov, V.I., Sukhachev, D.I. and Strelnikov, V.G., Mar. 2018, Legacy applications modelintegration to support scientific experiment. In 2018 Systems of Signals Generating and Processing in the Field of on BoardCommunications (pp. 1-7). IEEE. (Year: 2018).
Tufekci, P., 2014. Prediction of full load electrical power output of a base load operated combined cycle power plant using machinelearning methods. International Journal of Electrical Power & Energy Systems, 60, pp. 126-140. (Year: 2014).
WhatIs.com, "What is a Network Interface Card?", hUps://www.techtarget.com/searchnetworking/definition/network-interface-card ?_gl=1 *13qjdky*_ga*NZA 1 MzE3NjAyLjE2Mzl3NzU5NjA.*_ga_TQKE4GS5P9*MTYzMjk1 MDkzNC4yLjEuMTYzMjk1 MTY3Ny4w&_ga=2.164813883.525309060.1632950935-705317602.1632775960, Sep. 27, 2021; 5 pp. (Year: 2021).

(56) References Cited

OTHER PUBLICATIONS

"Use Excel as a Web Browser" at https://www.youtube.com/watch?v=A7LukCXev78; 1 page (Year: 2010).
Codingfreak, "https://web.archive.org/web/20100426123449/http://codingfreak.blogspot.com/2010/01/iptables-rate-limitincoming.htm", Apr. 26, 2010; pp. 1-3.
Crockford, Douglas, "https://web.archive.org/web/20030621080211/http://www.crockford.com/javascript/jsmin.html", Oct. 28, 2002; pp. 1-2.
Microsoft, Computer Dictionary, 2002, 5th Ed. (Year: 2002) Definition of Javascript; pp. 1-3.
Paladion, https://www.paladion.net/blogs/introduction-to-code-obfuscation, 2004 (Year: 2004); 52 pages.
Milanovic, J.V., Aung, M.T. and Gupta, C.P., 2005. The influence of fault distribution on stochastic prediction of voltage sags. IEEE Transactions on Power Delivery, 20(1), pp. 278-285. (Year:2005).
Khan, ZA and Jayaweera, 0.,2017. Approach for smart meter load profiling in Monte Carlo simulation applications. IETGeneration, Transmission & Distribution, 11 (7), pp. 1856-1864. (Year: 2017).
The Study Genius, "What is N IC (Network Interface Card)? How NIC works?", https://web.archive.org/web/20201117135313/https://www.thestudygenius.com/what-is-nic-network-interface-card/, 9 pp., Nov. 17, 2020 (Year: 2020).
Xia et al. 2018 IEEE Access, "Secure Session Key Management Scheme for Meter-Reading System Based on LoRa Technology", pp. 75015-75024 (Year: 2018).
Wiratama et al., "Gas Billing System based on Automatic Meter Reading on Diaphragm Gas Meter with Email Notification", IEEE, 2018 International Electronics Symposium on Knowledge Creation and Intelligent Computing (IES-KCIC), 2018, pp. 395-402.

\* cited by examiner

SYSTEMS AND METHODS FOR COLLECTING, ANALYZING, BILLING, AND REPORTING DATA FROM INTELLIGENT ELECTRONIC DEVICES

PRIORITY

This application is a continuation-in-part application of U.S. patent application Ser. No. 13/644,877 filed on Oct. 4, 2012, entitled "INTELLIGENT ELECTRONIC DEVICE COMMUNICATION SOLUTIONS FOR NETWORK TOPOLOGIES", which claims priority to U.S. Provisional Patent Application No. 61/542,935, filed Oct. 4, 2011, the contents of both of which are hereby incorporated by reference in their entireties.

This application is related to U.S. patent application Ser. No. 13/799,832 filed Mar. 13, 2013, entitled "SYSTEMS AND METHODS FOR COLLECTING, ANALYZING, BILLING, AND REPORTING DATA FROM INTELLIGENT ELECTRONIC DEVICES", the contents of which are hereby incorporated by reference in its entirety.

BACKGROUND

Field

The present disclosure relates generally to intelligent electronic devices (IEDs) and, in particular, to systems and methods for collecting, analyzing, billing and reporting data from intelligent electronic devices.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption IEDs are widely available that make use of memory and microprocessors to provide increased versatility and additional functionality. Such functionality includes the ability to communicate with remote computing systems, either via a direct connection, e.g., a modem, a wireless connection or a network IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

Conventional IEDs include the ability to communicate with remote computing systems. Traditionally, IEDs would transfer data using serial based download commands. These commands would be accessed via an RS232, and RS485 or an Ethernet port encapsulating the serial request with an Ethernet message using any Ethernet protocol such as HTTP or TCP/IP. For instance, host software or a "master" would make a request for a set of data from one or more memory registers in an IED slave. At that point, the IED slave would then communicate the data stored in the memory registers back to the host software utilizing a serial transfer. A need exists for systems and methods for efficiently collecting data from various devices, e.g., IEDs A further need exists for systems and methods for analyzing and reporting such collected data.

SUMMARY

In accordance with embodiments of the present disclosure, IEDs, systems, network topologies and methods thereof may be employed to implement an enterprise-wide energy management reporting, analysis and billing system. The system and method of the present disclosure imports historical log energy usage data from meters, IEDs and other sources and generates detailed and useful energy reports for analyzing energy use, planning and load curtailment. In one embodiment, the system operates on a client/server architecture (although other architectures may be employed), where a server/settings editor imports data from various sources enabling at least one client to access the data and generate reports therefrom. The system and method enables multiple users to generate customized energy reports to study energy usage and demand enterprise-wide. For example, a user may be enabled to display Peak Energy Usage for the day, week, and month, or compare usage between meters, locations, and customers. The system's automated billing module allows a user to generate sub-metering bills based on customized rate structures for energy and other commodities such as water and gas.

According to one aspect of the present disclosure, an intelligent electronic device is provided. The intelligent electronic device includes at least one sensor configured to measure at least one parameter of an electrical distribution system and output a signal indicative of the measured at least one parameter; at least one analog-to-digital converter configured to receive the output signals and convert the output signal to a digital signal; and at least one processing device configured to execute a plurality on instructions to implement a general purpose operating system for executing at least two applications, each application configured to implement a predetermined functionality based on the at least one parameter of the electrical distribution system, wherein each of the applications is independent of the other application.

According to another aspect of the present disclosure, an intelligent electronic device includes at least one sensor configured to measure at least one parameter of an electrical distribution system and output a signal indicative of the measured at least one parameter; at least one analog-to-digital converter configured to receive the output signals and convert the output signal to a digital signal; at least one processing device configured to execute a plurality on instructions to determine energy parameters of the electrical distribution system based on the measured at least one parameter; a communication device configured to coupled the intelligent electronic device to a network; and a network discovery module configured to detect communication settings of the network.

In one aspect, the network discovery module is configured to operate on a UPnP protocol.

In another aspect, the network discovery module is configured to broadcast service advertisement message over the network.

According to a further aspect of the present disclosure, an intelligent electronic device includes at least one sensor configured to measure at least one parameter of an electrical distribution system and output a signal indicative of the measured at least one parameter; at least one analog-to-digital converter configured to receive the output signals and convert the output signal to a digital signal; at least one processing device configured to execute a plurality on instructions to determine energy parameters of the electrical distribution system based on the measured at least one parameter; and a replication module configured to export configuration settings to a file.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") sense electrical parameters and compute data and can be any device including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
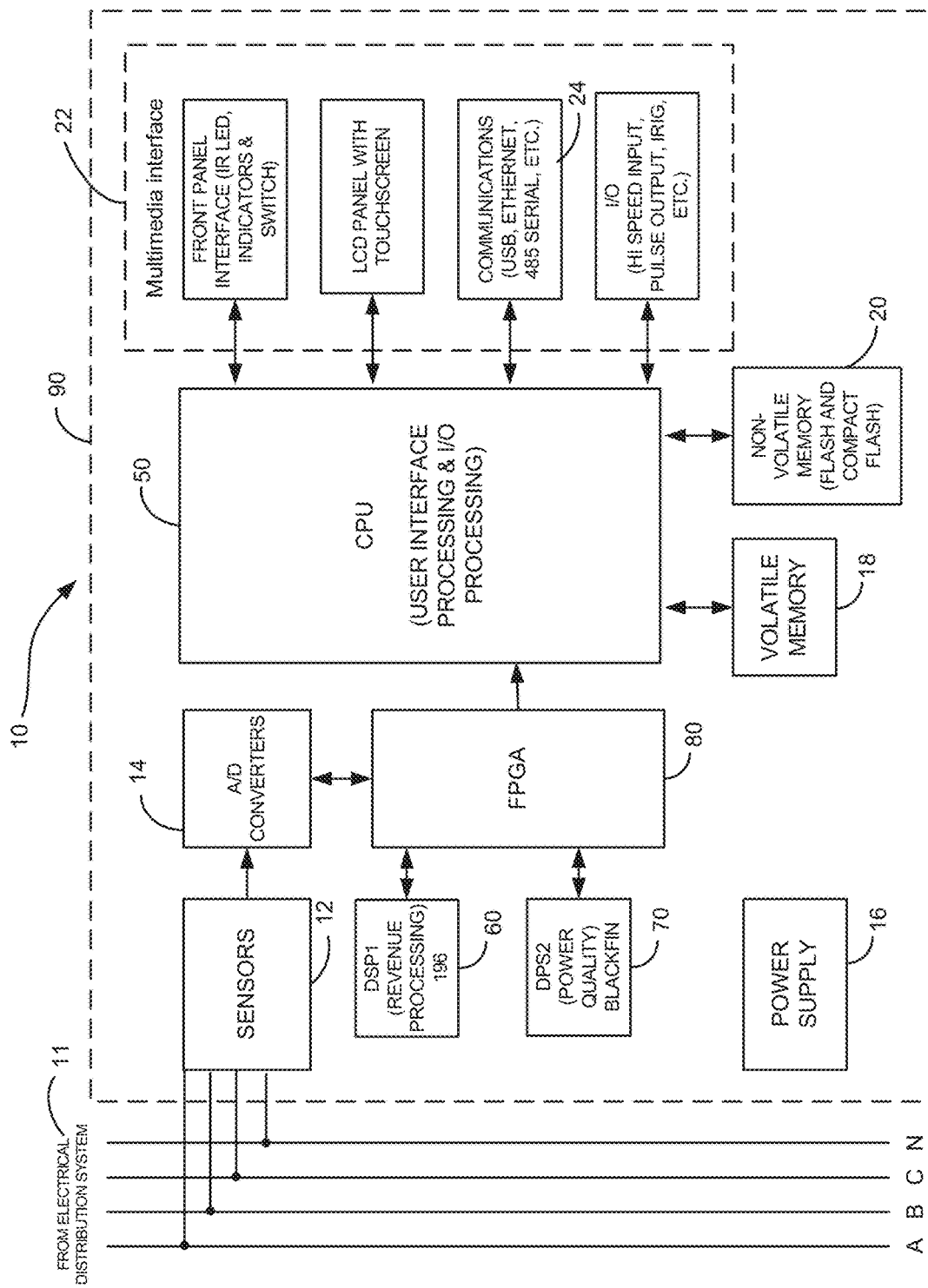
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A-2H.

The plurality of sensors 12 sense electrical parameters, e.g., voltage and current, on incoming lines, (i.e., phase A, phase B, phase C, neutral N), from an electrical power distribution system 11 e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14, are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .mlv, .mp2v .mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 18 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
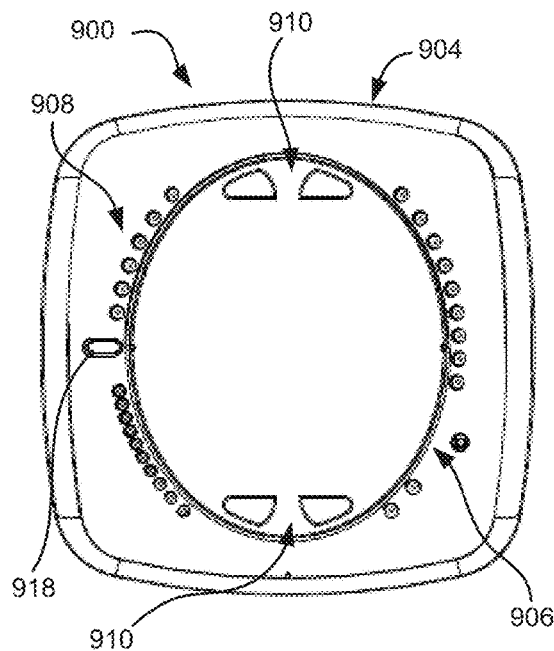
FIGS. 2A-2H illustrate exemplary form factors for an intelligent electronic device (IED) in accordance with an embodiment of the present disclosure.
Figure 2B:
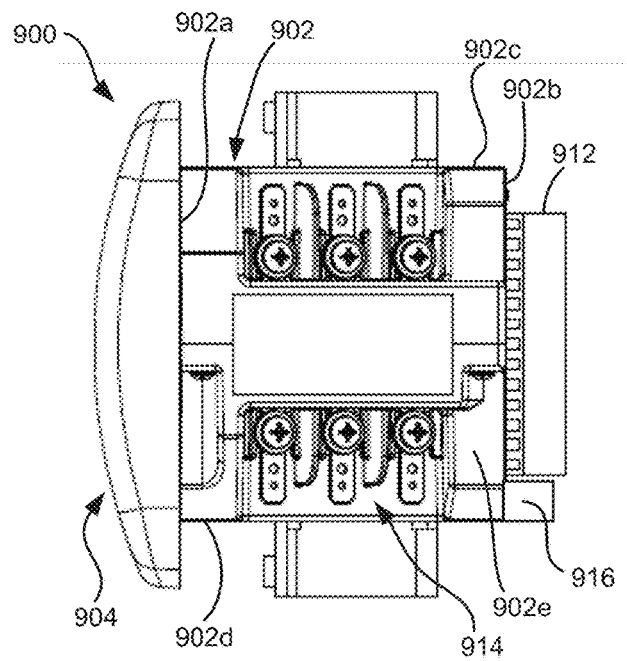

Furthermore, it is to be appreciated that the components and devices of the IED 10 of FIG. 1 may be disposed in various housings depending on the application or environment. For example, the IED 10 may be configured as a panel meter 900 as shown in FIGS. 2A and 2B. The panel meter 900 of FIGS. 2A and 2B is described in more detail in commonly owned U.S. Pat. No. 7,271,996, the contents of which are hereby incorporated by reference. As seen in FIGS. 2A and 2B, the IED 900 includes a housing 902 defining a front surface 902a, a rear surface 902b, a top surface 902c, a bottom surface 902d, a right side surface 902e, and a left side surface (not shown). Electrical device 900 includes a face plate 904 operatively connected to front surface 902a of housing 902. Face plate 904 includes displays 906, indicators 908 (e.g., LEDs and the like), buttons 910, and the like providing a user with an interface for visualization and operation of electrical device 100. For example, as seen in FIG. 2A, face plate 904 of electrical device 900 includes analog and/or digital displays 906 capable of producing alphanumeric characters. Face plate 904 includes a plurality of indicators 908 which, when illuminated, indicate to the user the "type of reading", the "% of load bar", the "parameter designation" which indicates the reading which is being displayed on displays 906, a "scale selector" (e.g., Kilo or Mega multiplier of Displayed Readings), etc. Face plate 904 includes a plurality of buttons 910 (e.g., a "menu" button, an "enter" button, a "down" button, a "right" button, etc.) for performing a plurality of functions, including but not limited to: viewing of meter information; entering display modes; configuring parameters; performing re-sets; performing LED checks; changing settings; viewing parameter values; scrolling parameter values; and viewing limit states. The housing 902 includes voltage connections or inputs 912 provided on rear surface 902b thereof, and current inputs 914 provided along right side surface 902e thereof. The IED 900 may include a first interface or communication port 916 for connection to a master and/or slave device. Desirably, first communication port 916 is situated in rear surface 902b of housing 902 IED 900 may also include a second interface or communication port 918 situated on face plate 904.

Figure 2C:
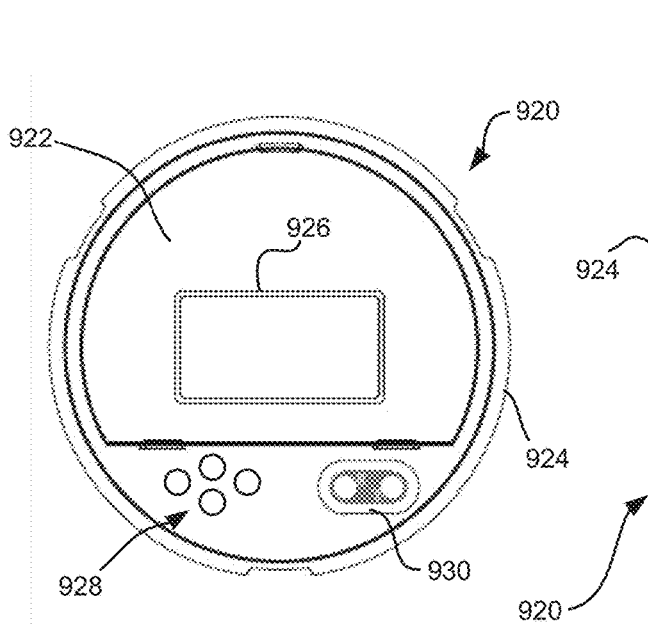
Figure 2D:
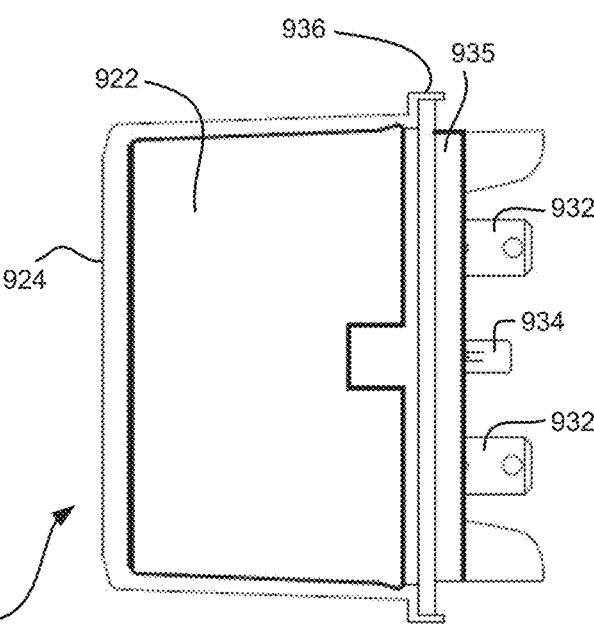

In other embodiment, the IED 10 may be configured as a socket meter 920, also known as a S-base type meter or type S meter, as shown in FIG. 2C an 2D. The socket meter 920 of FIGS. 2C and 2D is described in more detail in commonly owned application Ser. No. 12/578,062 (U.S. Publication No. 2010/0090680), the contents of which are hereby incorporated by reference. Referring to FIGS. 2C and 2D, the meter 920 includes a main housing 922 surrounded by a cover 924. The cover 924 is preferably made of a clear material to expose a display 926 disposed on the main body 922. An interface 928 to access the display and a communication port 930 is also provided and accessible through the cover 924. The meter 920 further includes a plurality of current terminals 932 and voltage terminals 934 disposed on backside of the meter extending through a base 935. The terminals 932, 934 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 936 is used as a seal between the meter 920 and/or cover 924 and the meter socket to prevent removal of the meter and to indicate tampering with the meter.

Figure 2E:
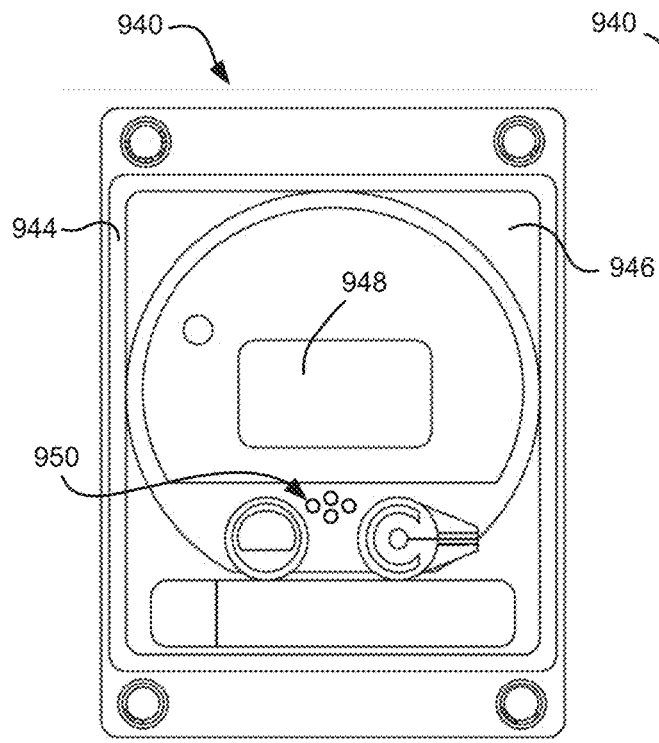
Figure 2F:
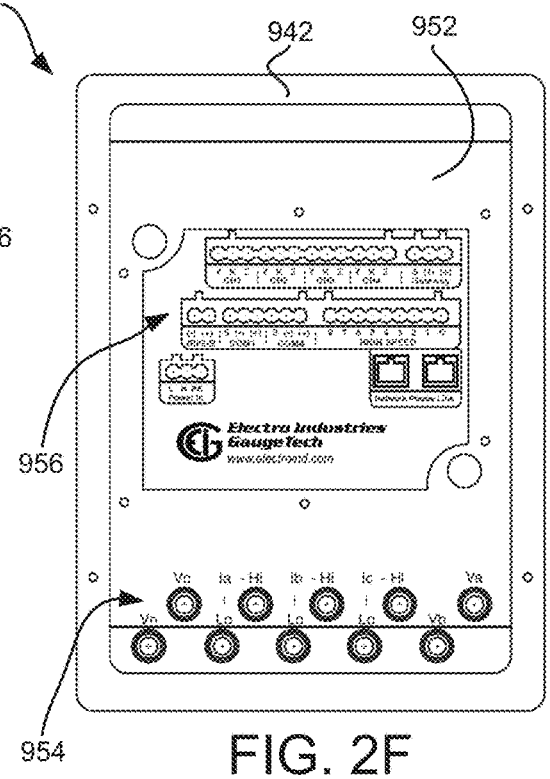

In a further embodiment, the IED 10 of FIG. 1 may be disposed in a switchboard or draw-out type housing 940 as shown in FIGS. 2E and 2F, where FIG. 2E is a front view and FIG. 2F is a rear view. The switchboard enclosure 942 usually features a cover 944 with a transparent face 946 to allow the meter display 948 to be read and the user interface 950 to be interacted with by the user. The cover 944 also has a sealing mechanism (not shown) to prevent unauthorized access to the meter. A rear surface 952 of the switchboard enclosure 942 provides connections for voltage and current inputs 954 and for various communication interfaces 956. Although not shown, the meter disposed in the switchboard enclosure 942 may be mounted on a draw-out chassis which is removable from the switchboard enclosure 942. The draw-out chassis interconnects the meter electronics with the electrical circuit. The draw-out chassis contains electrical connections which mate with matching connectors 954, 956 disposed on the rear surface 952 of the enclosure 942 when the chassis is slid into place.

Figure 2G:
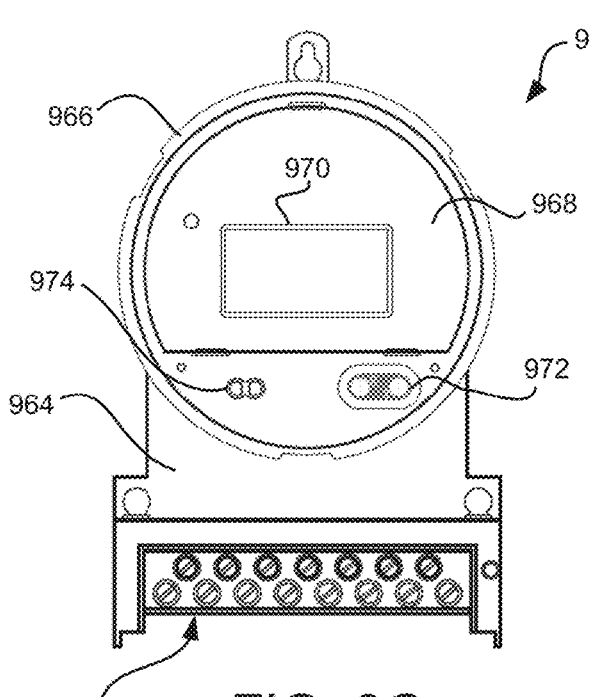
Figure 2H:
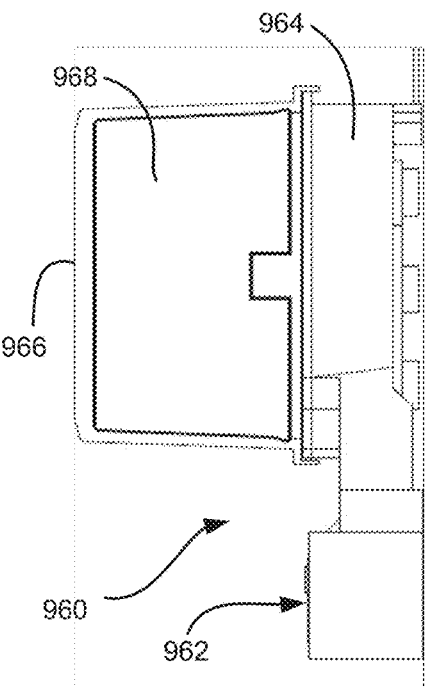

In yet another embodiment, the IED 10 of FIG. 1 may be disposed in an A-base or type A housing as shown in FIGS. 2G and 2H. A-base meters 960 feature bottom connected terminals 962 on the bottom side of the meter housing 964. These terminals 962 are typically screw terminals for receiving the conductors of the electric circuit (not shown). A-base meters 960 further include a meter cover 966, meter body 968, a display 970 and input/output means 972. Further, the meter cover 966 includes an input/output interface 974. The cover 966 encloses the meter electronics 968 and the display 970. The cover 966 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
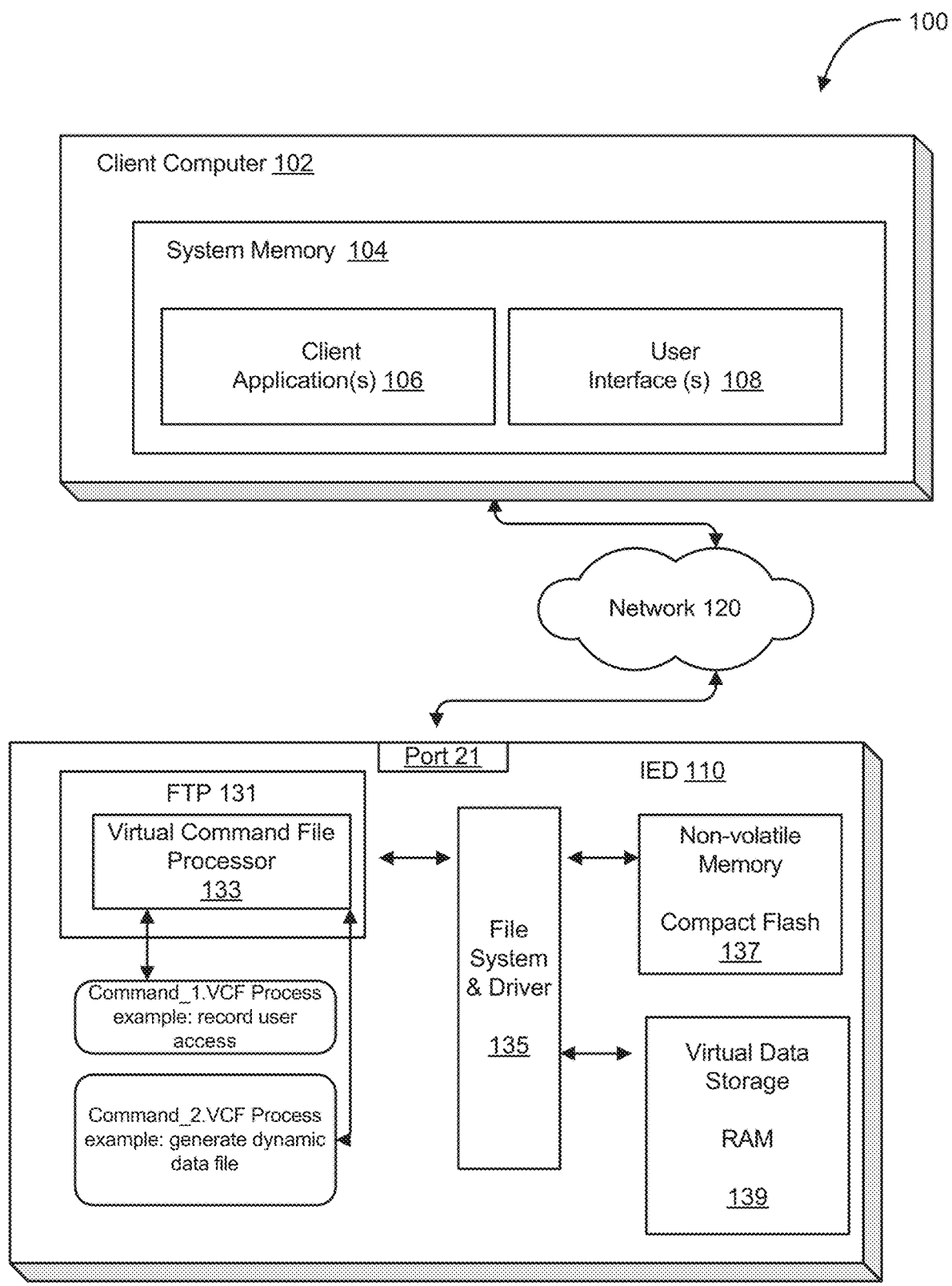
FIG. 3 illustrates an environment in which the present disclosure may be utilized.

FIG. 3 illustrates an exemplary environment 100 in which the present disclosure may be practiced. The network 120 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite; however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 110 may communicate using the network 120 as will be hereinafter discussed.

It is to be appreciated that there are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (which does not include multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX—that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system is a standard PC that is running an OS such as Windows. Current operating systems contain client software that enables the client computers to access the resources that servers share. Older operating systems, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in both client/server networks and peer-to-peer networks. Only the logical organization, management, and control of the networks vary.

The PC client 102 may comprise any computing device, such as a server, mainframe, workstation, personal computer, hand held computer, laptop telephony device, network appliance, other IED, Programmable Logic Controller, Power Meter, Protective Relay etc. The PC client 102 includes system memory 104, which may be implemented in volatile and/or non-volatile devices. One or more client applications 106, which may execute in the system memory 104, are provided. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". Additionally, user interfaces 108 may be included for displaying system configuration, retrieved data and diagnostics associated with the IED 110.

The intelligent electronic device (IED) 110, in one embodiment, is comprised of at least an FTP Server 131 including a Virtual Command File Processor 133, a File System and Driver 135, a non-volatile memory 137 and a virtual data store 139. Of course, the IED 110 may contain other hardware/software for performing functions associated with the IED; however, many of these functions have been described above with respect to FIG. 1 and will therefore not be further discussed.

IED 110 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as a Modbus TCP handler, can run on IED 110 concurrently with the FTP Server 131. This also means that multiple FTP connections can be made with the only limitation being the system's available resources.

The FTP Server 131 provides access to the file system 135 of the IED 110 on the standard FTP port (port 21). When a connection is made, PC client 102 sends an FTP logon sequence, which includes a USER command and a PASS command. The PC client 102 then interacts with the IED 110, requesting information and writing files, ending in a logout.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, logs, settings, and configurations, more suitably stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (for example, 49152-65535), sends the FTP server the dynamic port number on which it is listening over the control stream and waits for a connection from the FTP server. When the FTP server initiates the data connection to the FTP client it binds the source port to port 20 on the FTP server.

To use active mode, the client sends a PORT command, with the IP and port as argument. The format for the IP and port is "h1,h2,h3,h4,p1,p2". Each field is a decimal representation of 8 bits of the host IP, followed by the chosen data port. For example, a client with an IP of 192.168.0.1, listening on port 49154 for the data connection will send the command "PORT 192,168,0,1,192,2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case the FTP client binds the source port of the connection to a dynamic port between 49152 and 65535.

To use passive mode, the client sends the PASV command to which the server would reply with something similar to "227 Entering Passive Mode (127,0,0,1,192,52)". The syntax of the IP address and port are the same as for the argument to the PORT command.

In extended passive mode, the FTP server operates exactly the same as passive mode, except that it only transmits the port number (not broken into high and low bytes) and the client is to assume that it connects to the same IP address that it was originally connected to.

The objectives of FTP are to promote sharing of files (computer programs and/or data), to encourage indirect or implicit use of remote computers, to shield a user from variations in file storage systems among different hosts and to transfer data reliably, and efficiently.

In one embodiment of the present disclosure, the IED 110 has the ability to provide an external PC client 102 with an improved data transfer rate when making data download requests of data stored within an IED This is achieved by configuring the IED 110 to include an FTP server 131 including a Virtual Command File Processor 133. An improved data transfer rate from the IED 110 may be realized by the external PC client 102 issuing virtual commands to the IED 110. In response, the IED 110 processes the received virtual commands in the Virtual Command File processor 133 to construct FTP commands therefrom to be applied to a novel file system 135 of the IED 110, coupled to the FTP server 131, wherein the novel file system 135 is configured as a PC file structure amenable to receiving and responding to the constructed FTP commands. The Virtual command files and the novel file system 135 are discussed in greater detail in co-pending application Ser. No. 12/061,979.

While FTP file transfer comprises one embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

Figure 4:
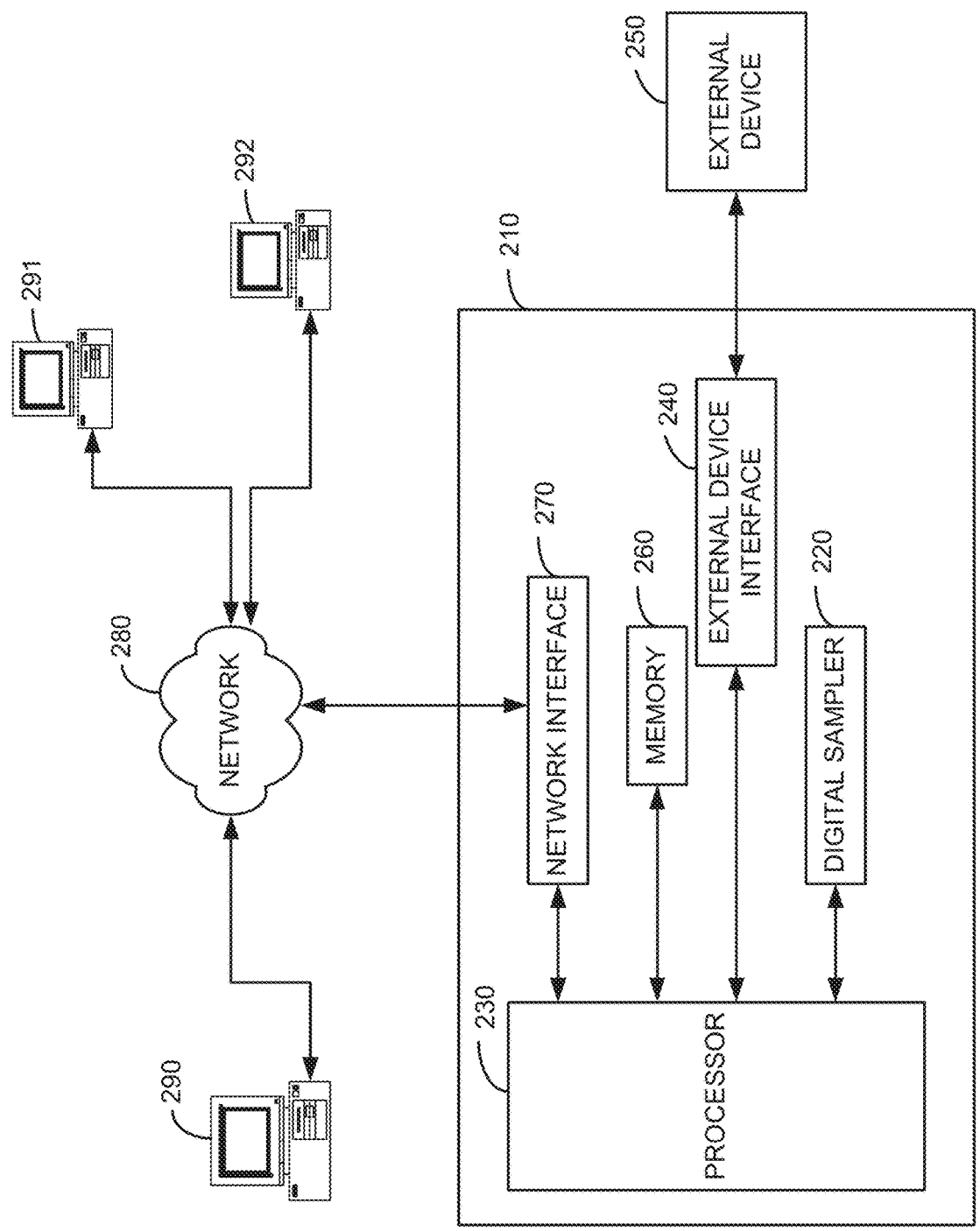
FIG. 4 is a block diagram of a web server power quality and revenue meter, according to an embodiment of the present disclosure.

With reference to U.S. Pat. No. 6,751,563, FIG. 4 is a block diagram of a web server power quality and revenue meter 210. The meter is connected to monitor electric distribution power lines (not shown), to monitor voltage and current at the point of connection. Included therein is digital sampler 220 for digitally sampling the voltage and current of the power being supplied to a customer or monitored at the point of the series connection in the power grid. Digital sampler 220 digitally samples the voltage and current and performs substantially similarly to the A/D converters 14 described above in relation to FIG. 1. The digital samples are then forwarded to processor 230 for processing. It is to be appreciated that the processor 230 may be a single processing unit or a processing assembly including at least one CPU 50, DSP1 60, DSP2 70 and FPGA 80, or any combination thereof. Also connected to processor 230 is external device interface 240 for providing an interface for external devices 250 to connect to meter 210. These external devices might include other power meters, sub-station control circuitry, on/off switches, etc. Processor 230 receives data packets from digital sampler 220 and external devices 250, and processes the data packets according to user defined or predefined requirements. A memory 260 is connected to processor 230 for storing data packets and program algorithms, and to assist in processing functions of processor 230. These processing functions include the power quality data and revenue calculations, as well as formatting data into different protocols which will be described later in detail. Processor 230 provides processed data to network 280 through network interface 270. Network 280 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter 210 simultaneously. In a like fashion, network interface 270 might be comprised of a modem, cable connection, or other devices that provide formatting functions. Computers 290-292 are shown connected to network 280.

A web server program (web server) is contained in memory 260, and accessed through network interface 270. The web server 210 provides real time data through any known web server interface format. For example, popular web server interface formats consist of HTML and XML formats. The actual format of the programming language used is not essential to the present disclosure, in that any web server format can be incorporated herein. The web server provides a user friendly interface for the user to interact with the meter 210. The user can have various access levels to enter limits for e-mail alarms. Additionally, the user can be provided the data in multiple formats including raw data, bar graph, charts, etc. The currently used HTML or XML programming languages provide for easy programming and user friendly user interfaces.

The processor 230 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data may then be available to users at computers 290-292 through network 280, which connects to meter 210 at the network interface 270. In one embodiment, network interface 270 is an Ethernet interface that supports, for example, 100 base-T or 10 base-T communications. This type of network interface can send and receive data packets between WAN connections and/or LAN connections and the meter 210. This type of network interface allows for situations, for example, where the web server 210 may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 5:
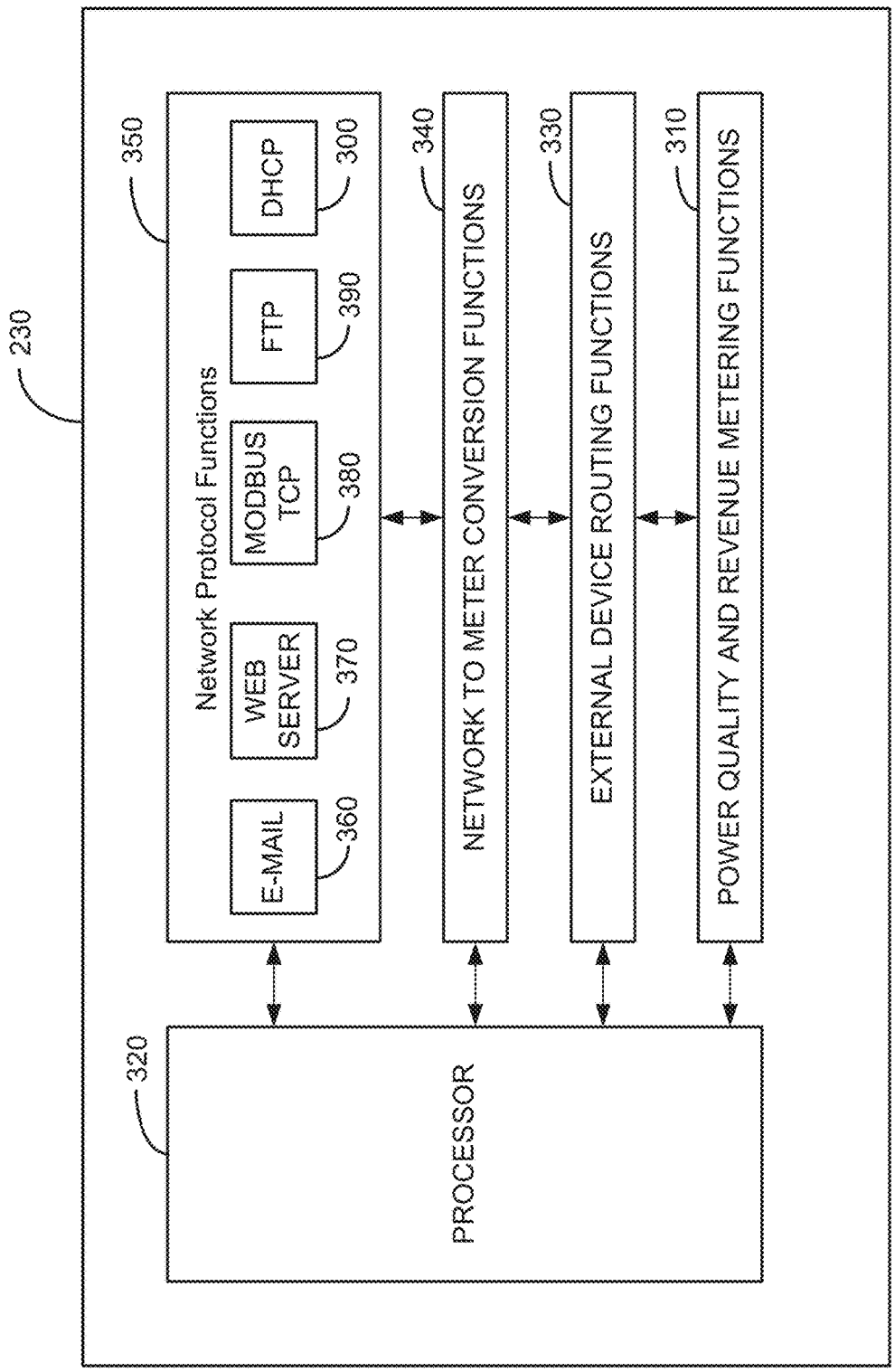
FIG. 5 is a functional block diagram of the processor of the web server power quality and revenue meter system shown in FIG. 4, according to the embodiment of the present invention.

FIG. 5 is a functional block diagram of processor 230 of the web server power quality and revenue meter system according to some embodiments of the present invention. Processor 230 is shown containing four main processing functions. The functions shown are illustrative and not meant to be inclusive of all possible functions performed by processor 230. Power Quality and Revenue Metering functions (metering functions) 310 consist of a complete set of functions which are needed for power quality and revenue metering. Packet data collected by digital sampler 220 is transmitted to processor 230. Processor 230 calculates, for example, power reactive power, apparent power, and power factor. The metering function 310 responds to commands via the network or other interfaces supported by the meter.

External Device Routing Functions 330 handle the interfacing between the external device 250 and meter 210. Raw data from external device 250 is fed into meter 210. The external device 250 is assigned a particular address. If more than one external device is connected to meter 210, each device will be assigned a unique particular address. The Network Protocol Functions 350 of meter 210 are executed by processor 230 which executes multiple networking tasks that are running concurrently. As shown in FIG. 5, these include, but are not limited to, the following network tasks included in network protocol functions 350: e-mail 360, web server 370, Modbus TCP 380, FTP 390, and DHCP 300. The e-mail 360 network protocol function can be utilized to send e-mail messages via the network 280 to a user to, for example, notify the user of an emergency situation or if the power consumption reaches a user-set or pre-set high level threshold. As the processor receives packets of data it identifies the network processing necessary for the packet by the port number associated with the packet. The processor 230 allocates the packet to a task as a function of the port number. Since each task is running independently, the meter 210 can accept different types of requests concurrently and process them transparently from each other. For example, the web server may be accessed by one user while another user is communicating via Modbus TCP and at the same time a third user may download a log file via FTP. The Network to Meter Protocol Conversion Functions 340 are used to format and protocol convert the different network protocol messages to a common format understood by the other functional sections of meter 210. After the basic network processing of the packet of data, any "commands" or data which are to be passed to other functional sections of meter 210 are formatted and protocol converted to a common format for processing by the Network to Meter Protocol Conversion Functions 340. Similarly, commands or data coming from the meter for transfer over the network are pre-processed by this function into the proper format before being sent to the appropriate network task for transmission over the network. In addition, this function first protocol converts and then routes data and commands between the meter and external devices.

Although the above described embodiments enable users outside of the network the IED or meter is residing on to access the internal memory or server of the IED or meter, IT departments commonly block this access through a firewall to avoid access by dangerous threats into corporate networks. A firewall is a system designed to prevent unauthorized access to or from a private network, e.g., an internal network of a building, a corporate network, etc. Firewalls can be implemented in both hardware and software, or a combination of both. Firewalls are frequently used to prevent unauthorized Internet users from accessing private networks connected to the Internet, especially intranets. All messages entering or leaving the intranet pass through the firewall, which examines each message and blocks those that do not meet the specified security criteria. A firewall may employ one or more of the following techniques to control the flow of traffic in and of the network it is protecting: 1) packet filtering: looks at each packet entering or leaving the network and accepts or rejects it based on user-defined rules; 2) Application gateway: applies security mechanisms to specific applications, such as FTP and Telnet servers; 3) Circuit-level gateway: applies security mechanisms when a TCP or UDP connection is established; once the connection has been made, packets can flow between the hosts without further checking; 4) Proxy server: intercepts all messages entering and leaving the network, effectively hides the true network addresses; and 5) Stateful inspection: does not examine the contents of each packet but instead compares certain key parts of the packet to a database of trusted information; if the comparison yields a reasonable match, the information is allowed through; otherwise it is discarded. Other techniques and to be developed techniques are contemplated to be within the scope of the present disclosure.

In one embodiment, the present disclosure provides for overcoming the problem of not being allowed firewall access to an IED or meter installed within a facility, i.e., the meter is residing on a private network, by enabling an IED to initiate one way communication through the firewall. In this embodiment, the IED or meter posts the monitored and generated data on an Internet site external to the corporate or private network, i.e., on the other side of a firewall. The benefit is that any user would be able to view the data on any computer or web enabled smart device without having to pierce or bypass the firewall. Additionally, there is a business opportunity to host this data on a web server and charge a user a monthly fee for hosting the data. The features of this embodiment can be incorporated into any telemetry application including vending, energy metering, telephone systems, medical devices and any application that requires remotely collecting data and posting it on to a public Internet web site.

Figure 6:
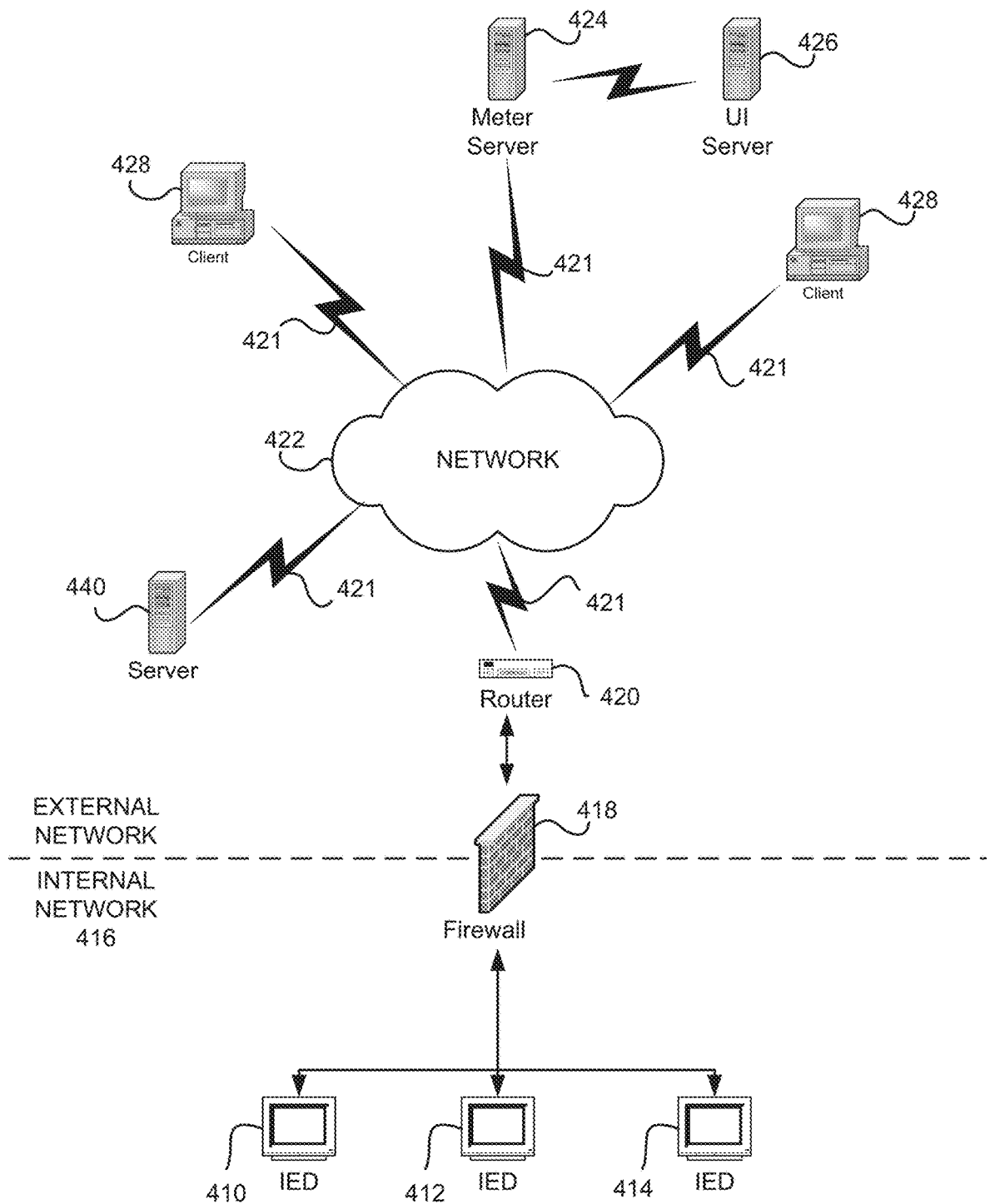
FIG. 6 illustrates another environment in which the present disclosure may be utilized.

In one embodiment, the IED or metering device will communicate through the firewall using a protocol such as HTTP via a port that is open through the firewall. Referring to FIG. 6, IEDs or meters 410, 412 414 reside on an internal network 416, e.g., an intranet, private network, corporate network, etc. The internal network 416 is coupled to an external network 422, e.g., the Internet, via a router 420 or similar device over any known hardwire, fiber optic or wireless connection 421. A firewall 418 is disposed between the internal network 416 and external network 422 to prevent unauthorized access from outside the internal network 416 to the IEDs or meters 410, 412, 414. Although the firewall 418 is shown between the internal network 416 and the router 420 it is to be appreciated that other configurations are possible, for example, the firewall 418 being disposed between the router 420 and external network 422. In other embodiments, the firewall 418 and router 420 may be configured as a single device. It is further to be appreciated that firewall 418 can be implemented in both hardware and software, or a combination of both.

The communication device or network interface of the meter (as described above in relation to FIG. 1) will communicate through the firewall 418 and read a web site server 424. It is to be appreciated that the one way communication from the IED through the firewall may be enabled by various techniques, for example, by enabling outbound traffic to the IP address or domain name of the server 424 or by using a protocol that has been configured, via the firewall settings, to pass through the firewall such as HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol), Telnet, etc. Alternatively, the IED may have exclusive access to a particular port on the firewall, which is unknown to other users on either the internal or external network. Other methods or techniques are contemplated, for example, e-mail, HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

The server 424 will provide instructions in computer and/or human readable format to the IED or meter. For instance, the web server 424 might have XML tags that state in computer readable format to provide data for the last hour on energy consumption by 15 minute intervals. The meter 410, 412, 414 will then read those instructions on that web server 424 and then post that data up on the server 424. In this manner, the IED or meter initiates communication in one direction, e.g., an outbound direction, to the server 424.

Another server (or possibly the same server) will read the data that the meter 410, 412, 414 posts and will format the meter data into data that can be viewed for humans on a web site or a software application, i.e., UI Server 426. Servers 424, 426 can also store the data in a database or perform or execute various control commands on the data. Clients 428 may access the IED data stored or posted on servers 424, 426 via a connection to the network 422.

Since the meters are only communicating in an outbound direction only, the meters 410, 412, 414 can read data or instructions from an external network application (e.g., server 424), but the external network application cannot request information directly from the meter. The server 424 posts the data or instructions on the web site and waits for the meter to check the site to see if there has been a new post, i.e., new instructions for the meter. The meter can be programmed at the user's discretion as to frequency for which the meter 410, 412, 414 exits out to the external network to view the postings.

The meter instruction server 424 will post instructions in a directory programmed/located on the server or into XML or in any fashion that the meter is configured to understand and then the meter will post whatever data it is instructed to do. The meter can also be configured to accomplish control commands. In addition to the meter instruction server 424, a user interface (UI) server 426 is provided that can be used to enable a user interface to the user. The user can provide input on the UI server 426 that might trigger the meter instruction server 424 to produce a message to control the energy next time the meter reads that server.

Figure 7:
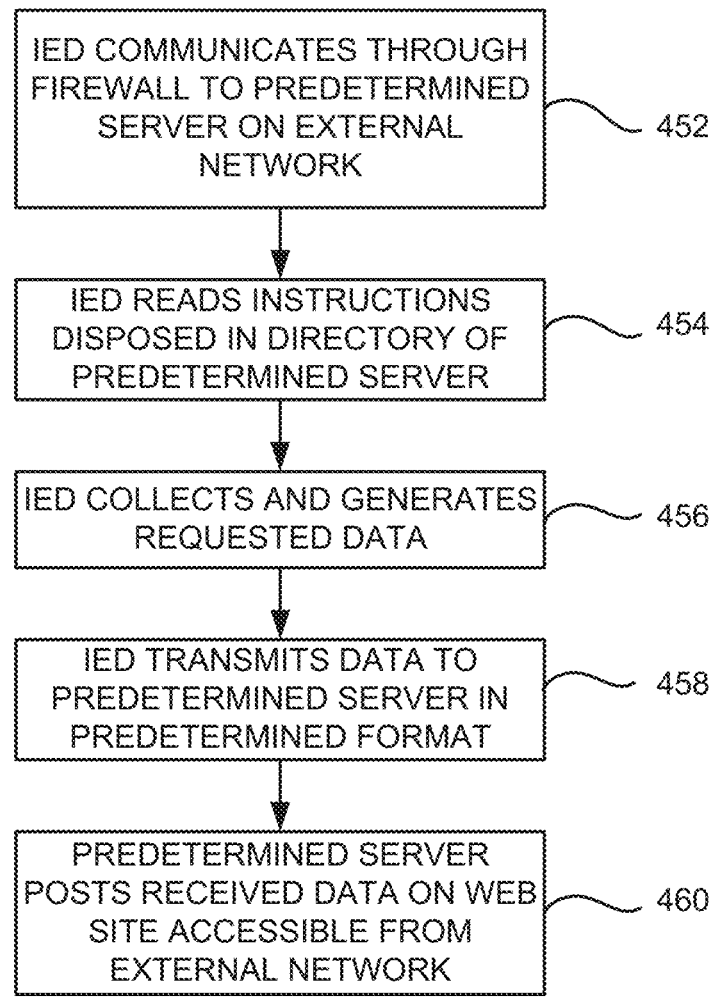
FIG. 7 is a flow chart illustrating a method for communicating data from an IED on an internal network to a server on an external network through a firewall.

Referring to FIG. 7, a method for communicating data from an IED on an internal network to a server on an external network through a firewall is illustrated. In step 452, the IED 410 communicates through the firewall 418 to a predetermined server 424 on an external network 422. The IED 410 may be programmed to periodically communicate to the server at predefined intervals. During this communication session, the IED 410 reads instructions disposed in a directory or folder on the predetermined server 424, step 454. Next, in step 456, the IED 410 collects data from its internal memory or generates data based on the read instructions. The IED 410 then transmits the data to the server 424 in a predetermined format, e.g., extensible markup language (XML), comma-separated value (CSV), etc., step 458. In step 460, the predetermined server 424 posts the received data on a web site accessible from the external network 422. The data may be posted on the server 424 or a UI (user interface) server 426 configured to provide data for end users, e.g., clients 428. It is to be appreciated that the UI server 426 may be configured to post data from several locations in one convenient interface for, for example, an organization managing the several locations. A provider of the servers 424, 426 may charge a fee to the end user for the hosting of the web site and providing the data in a convenient and accessible format.

Figure 8:
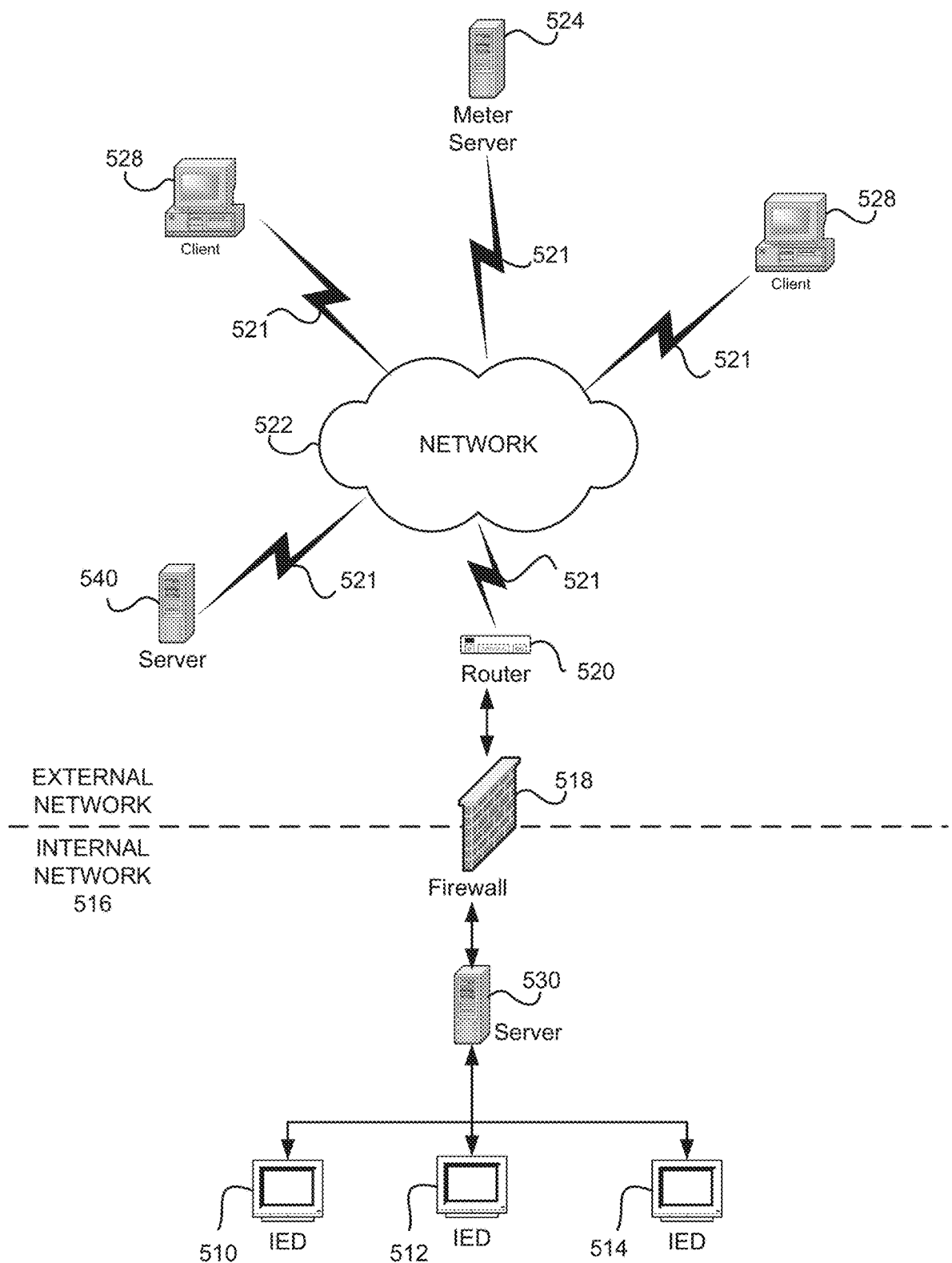
FIG. 8 illustrates yet another environment in which the present disclosure may be utilized.

In another embodiment, the IED or metering device will communicate through the firewall using a server 530 disposed on an internal network protected by a firewall. Referring to FIG. 8, IEDs or meters 510, 512, 514 reside on an internal network 516, e.g., an intranet, private network, corporate network, etc. The internal network 516 is coupled to an external network 522, e.g., the Internet, via a router 520 or similar device over any known hardwire or wireless connection 521. A firewall 518 is disposed between the internal network 516 and external network 522 to prevent unauthorized access from outside the internal network 516 to the IEDs or meters 510, 512, 514. Although the firewall 518 is shown between the internal network 516 and the router 520 it is to be appreciated that other configurations are possible, for example, the firewall 518 being disposed between the router 520 and external network 522. In other embodiments, the firewall 518 and router 520 may be configured as a single device. It is further to be appreciated that firewall 518 can be implemented in both hardware and software, or a combination of both.

In this embodiment, server 530 aggregates data from the various IEDs 510, 512, 514 coupled to the internal or private network 516. Since the server 530 and the IEDs 510, 512, 514 are all on the same side of the firewall 518, generally communications and data transfers among the server 530 and the IEDs 510, 512, 514 is unrestricted. Server 530 then communicates or transfers the data from the IEDs to server 524 on the external network on the other side of the firewall 518. The communication between servers 530 and 524 may be accomplished by any one of the communication means or protocols described in the present disclosure. The server 524 then posts the data from the IEDs 510, 512, 514 making the data accessible to clients 528 on external networks, as described above.

Figure 9:
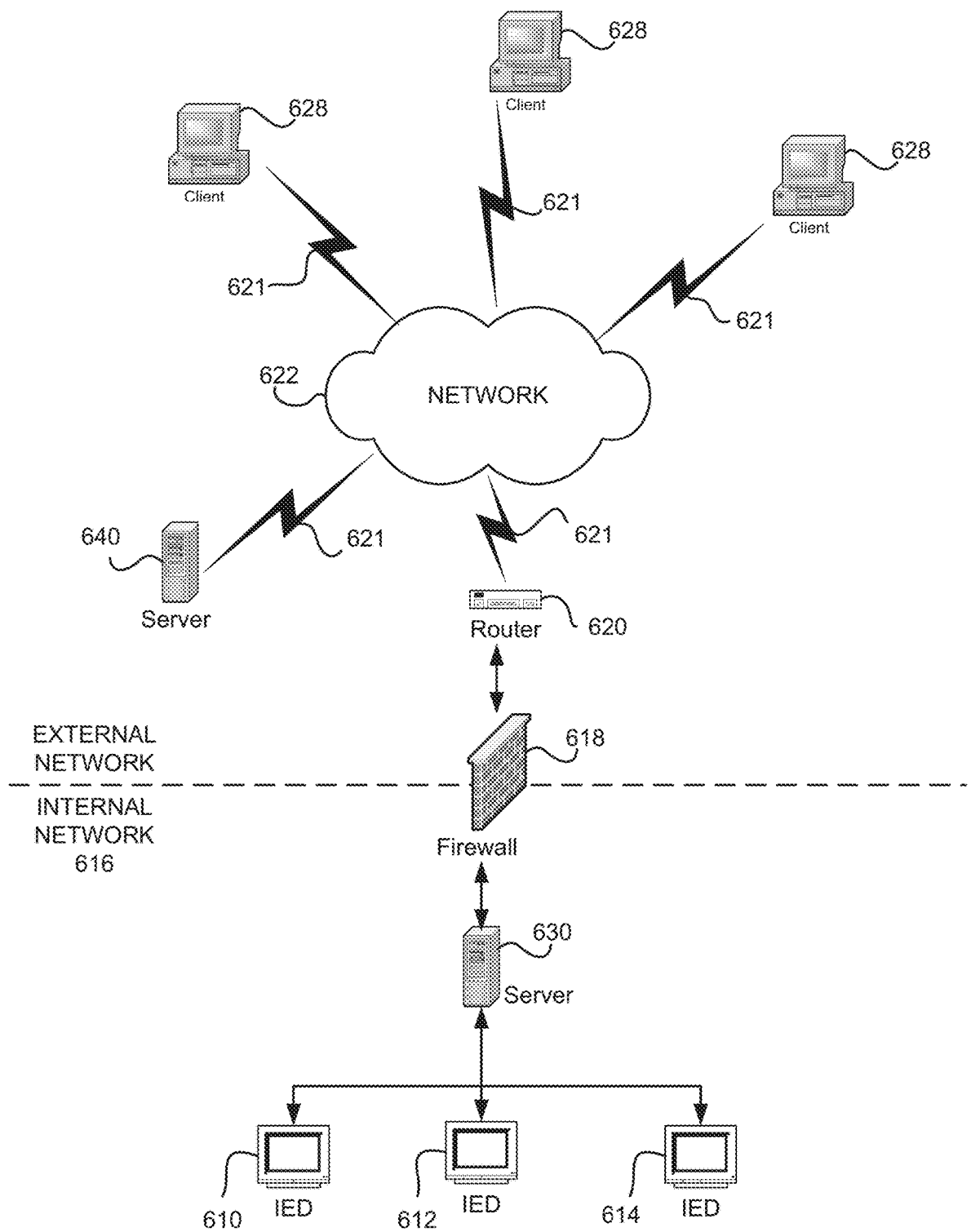
FIG. 9 illustrates a further environment in which the present disclosure may be utilized.

In a further embodiment, the IED or metering device will communicate through the firewall using a server 630 disposed on an internal network protected by a firewall. Referring to FIG. 9, IEDs or meters 610, 612, 614 reside on an internal network 616, e.g., an intranet, private network, corporate network, etc. The internal network 616 is coupled to an external network 622, e.g., the Internet, via a router 620 or similar device over any known hardwire or wireless connection 621. A firewall 618 is disposed between the internal network 516 and external network 622 to prevent unauthorized access from outside the internal network 616 to the IEDs or meters 610, 612, 614. Although the firewall 618 is shown between the internal network 616 and the router 620 it is to be appreciated that other configurations are possible, for example, the firewall 618 being disposed between the router 620 and external network 622. In other embodiments, the firewall 618 and router 620 may be configured as a single device. It is further to be appreciated that firewall 618 can be implemented in both hardware and software, or a combination of both.

In this embodiment, server 630 aggregates data from the various IEDs 610, 612, 614 coupled to the internal or private network 616. Since the server 630 and the IEDs 610, 612, 614 are all on the same side of the firewall 618, generally communications and data transfers among the server 630 and the IEDs 610, 612, 614 is unrestricted. Server 630 then communicates or transfers the data from the IEDs to clients 628 on the external network on the other side of the firewall 618. The communication between server 630 and clients 628 may be accomplished by any one of the communication means or protocols described in the present disclosure.

In another embodiment, each IED 610, 612, 614 may be configured to act as a server to perform the functionality described above obviating the need for server 630.

Furthermore in another embodiment, each IED 610, 612, 614 and each client device 628 may be configured as a server to create a peer-to-peer network, token ring or a combination of any such topology.

The systems and methods of the present disclosure may utilize one or more protocols and/or communication techniques including, but not limited to, e-mail, File Transfer Protocol (FTP), HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

In one non-limiting embodiment, each IED sends data to a recipient via electronic mail, also known as email or e-mail. An Internet email message consists of three components, the message envelope, the message header, and the message body. The message header contains control information, including, minimally, an originator's email address and one or more recipient addresses. Usually descriptive information is also added, such as a subject header field and a message submission date/time stamp. Network-based email was initially exchanged on the ARPANET in extensions to the File Transfer Protocol (FTP), but is now carried by the Simple Mail Transfer Protocol (SMTP), first published as Internet standard 10 (RFC 821) in 1982. In the process of transporting email messages between systems, SMTP communicates delivery parameters using a message envelope separate from the message (header and body) itself. Messages are exchanged between hosts using the Simple Mail Transfer Protocol with software programs called mail transfer agents (MTAs); and delivered to a mail store by programs called mail delivery agents (MDAs, also sometimes called local delivery agents, LDAs). Users can retrieve their messages from servers using standard protocols such as POP or IMAP, or, as is more likely in a large corporate environment, with a proprietary protocol specific to Novell Groupwise, Lotus Notes or Microsoft Exchange Servers. Webmail interfaces allow users to access their mail with any standard web browser, from any computer, rather than relying on an email client. Programs used by users for retrieving, reading, and managing email are called mail user agents (MUAs). Mail can be stored on the client, on the server side, or in both places. Standard formats for mailboxes include Maildir and mbox. Several prominent email clients use their own proprietary format and require conversion software to transfer email between them. Server-side storage is often in a proprietary format but since access is through a standard protocol such as IMAP, moving email from one server to another can be done with any MUA supporting the protocol.

In one embodiment, the IED composes a message using a mail user agent (MUA). The IED enters the email address of a recipient and sends the message. The MUA formats the message in email format and uses the Submission Protocol (a profile of the Simple Mail Transfer Protocol (SMTP), see RFC 6409) to send the message to the local mail submission agent (MSA), for example, run by the IED's internet service provider (ISP). The MSA looks at the destination address provided in the SMTP protocol (not from the message header). An Internet email address is a string of the form "recipient@meter." The part before the "@" symbol is the local part of the address, often the username of the recipient, and the part after the "@" symbol is a domain name or a fully qualified domain name. The MSA resolves a domain name to determine the fully qualified domain name of the mail exchange server in the Domain Name System (DNS). The DNS server for the domain responds with any MX records listing the mail exchange servers for that domain, for example, a message transfer agent (MTA) server run by the recipient's ISP. The MSA sends the message to MTA using SMTP. This server may need to forward the message to other MTAs before the message reaches the final message delivery agent (MDA). The MDA delivers it to the mailbox of the recipient. The recipient retrieves the message using either the Post Office Protocol (POP3) or the Internet Message Access Protocol (IMAP4).

Other types of e-mail systems may also be employed, for example, web-based email, POP3 (Post Office Protocol 3) email services, IMAP (Internet Message Protocol) e-mail servers, and MAPI (Messaging Application Programming Interface) email servers to name a few.

In a further embodiment, File Transfer Protocol (FTP) may be employed. Techniques for transferring data from an IED to a device is described in commonly owned pending U.S. patent application Ser. No. 12/061,979, the contents of which are incorporated by reference.

In one embodiment, IEDs employ Universal Plug and Play (UPnP) protocol, which is a set of networking protocols that permits networked devices to discover each other's presence, and notify clients of services available on these devices. UPnP takes the form of UDP broadcast messages, which are sent across a local network, to notify other devices of available services, and http requests to query the details of those devices and services.

In one embodiment, UPnP is employed to allow the network addresses of devices, such as meters, to automatically be discovered by a client. This enables the client software to display a list of all devices which are available. In addition, this could also allow the client software to enable the user to connect to these devices, without having to configure the network address of that device. In addition, the UPnP notify may be used to indicate the health status of the device, including starting up, running, errors in configuration, and resetting.

In another embodiment, UPnP is employed to allow devices, such as meters, to notify the clients of what services they support, such as Modbus, dnp, web, ftp, log download, and data streaming. This could be extended by including information particular to that service or protocol, such as to allow the client to interface with that service with no user input. This could enable the client software to display the device such that the user can focus on the details of the device, rather then worrying about the minutiae of connection information.

In another embodiment, an automated server is configured to perform actions related to these automatically discovered services, such as retrieving real time information, downloading logs, or registering for notification of events. For example, as shown in FIG. 8, a server 530 could be on a network 516 to collect log information from meters 510, 512, 514, and whenever a meter broadcast that it provided log data, the server 530 could automatically collect that data from the meter. As another example, the server 530 could automatically poll and log the real-time readings of all meters on the network, automatically including them as they become available on the network. As described above, the server 530 may then post the data to server 524. Furthermore, the server 530 may automatically download new firmware, retrieve files and change or modify programmable settings in the meters 510, 512, 514.

In one embodiment, HTTP tunneling is employed to send a message (including the IED's or meter's data) to a server, which listens for such messages, and parses out the IED's or meter's data. This could be performed by embedding the meter's data in a HTTP message, which could be sent to the server, for example, server 424 as shown in FIG. 6. The HTTP wrapper would allow this data to pass through firewalls which only allow web traffic. For example, in the architecture of FIG. 6, IED 410 may send a HTTP message containing measured or calculated data through firewall 418 to server 424 or server 430. In another example as shown in FIG. 8, server 530 may collect data from the various IEDs 510, 512, 514 and forward the collected data in a HTTP message through firewall 518 to server 524.

It is to be appreciated that HTTP tunneling applies to system architectures where a server is provided as the receiver of the IED or meter data, as the clients would be unable to process such information. Referring to FIG. 9, server 630 is the destination (and collects) the messages generated from the various IEDs 610, 612, 614, but device 628 is a client, and without server software, would be unable to receive the messages. However, by programming device 628 with server software, the client device 628 becomes a server and can receive the messages.

It is further to be appreciated that the HTTP message can be sent based on various triggers including, but not limited to, time-based trigger, event-based trigger, storage capacity based trigger, etc.

In another embodiment, the IEDs can communicate through to devices using a Simple Network Management Protocol (SNMP) trap. SNMP traps enable an agent, e.g., an agent running on an IED, to notify a management station, e.g., a server, of significant events by way of an unsolicited SNMP message. Upon occurrence of an event, an agent that sends an unsolicited or asynchronous trap to the network management system (NMS), also known as a manager. After the manager receives the event, the manager displays it and can choose to take an action based on the event. For instance, the manager can poll the agent or IED directly, or poll other associated device agents to get a better understanding of the event. For the management system to understand a trap sent to it by an agent, the management system must know what the object identifier (OID) of the trap or message defines. Therefore, the management system or server must have the Management Information Base (MIB) for that trap loaded. This provides the correct OID information so that the network management system can understand the traps sent to it. Additionally, a device does not send a trap to a network management system unless it is configured to do so. A device must know that it should send a trap. The trap destination is usually defined by an IP address, but can be a host name, if the device is set up to query a Domain Name System (DNS) server.

Common chat protocols, such as MSN, AIM, IRQ, IRC, and Skype, could be used to send a message, containing the meter's data, to a public chat server, e.g., server 440, 540, 640, which could then route that message to any desired client. Another possible implementation could be to have a special client that listens for these messages, parses the data contents, and presents them as another manner. In one embodiment, the messages are proprietary format Ethernet messages, typically sent over TCP. It is to be appreciated that the actual format depends on the specific chat protocol.

A public social server that supports a common web interface for posting information, such as Twitter™, Facebook™, BBS's, could be used to post a status, containing the meter's data, to a user on the public social server for that service, e.g., server 440, 540, 640. This post could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push). Some of these servers also provide a proprietary format Ethernet message, typically sent over TCP.

In one non-limiting example, a public social server such as the system employed by Facebook may be utilized to post the IEDs data so the data is accessible on the external network outside of the firewall. Facebook uses a variety of services, tools and programming languages to make up its infrastructure which may be employed in the systems and methods of the present disclosure to implement the technique described herein. In the front end, the servers run a LAMP (Linux, Apache, MySQL and PHP) stack with Memcache. Linux is a Unix-like operating system kernel. It is open source, highly customizable, and good for security. Facebook's server runs the Linux operating system Apache HTTP server. For the database, Facebook uses MySQL for its speed and reliability. MySQL is used primarily as a key store of value when the data are randomly distributed among a large number of cases logical. These logical instances extend across physical nodes and load balancing is done at physical node. Facebook uses PHP, since it is a good web programming language and is good for rapid iteration. PHP is a dynamically typed language/interpreter. Memcache is a caching system that is used to accelerate dynamic web sites with databases (like Facebook) by caching data and objects in RAM to reduce reading time. Memcache is the main form of caching on Facebook and helps relieve the burden of database. Having a caching system allows Facebook to be as fast as it is to remember information. Furthermore, Facebook backend services are written in a variety of different programming languages like C++, Java, Python, and Erlang. Additionally, it employs the following services: 1.) Thrift—a lightweight remote procedure call framework for scalable cross-language services development, which supports C++, PHP, Python, Perl, Java, Ruby, Erlang, and others; 2.) Escribano (server logs)—a server for aggregating log data streamed in real time on many other servers, it is a scalable framework useful for recording a wide range of data; 3.) Cassandra (database)—a database designed to handle large amounts of data spread out across many servers; 4.) HipHop for PHP—a transformer of source code for PHP script code and was created to save server resources, HipHop transforms PHP source code in C++ optimized, among others. It is to be appreciated that any of the above systems, devices and/or services may be implemented in the various architectures disclosed in the present disclosure to achieve the teaching and techniques described herein.

A public web site, e.g., hosting on server 440, 540, 640, which allows the posting of information, such as a Forum, could be used to post a message, containing the meter's data, to a group, thread, or other location. This post would take place by a HTTP POST to the web site's server, where by the server would store that information, and present it on the web site. This message could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push).

User Datagram Protocol (UDP) messages could be used to send a message from the IEDs or meters to a server, which listens for such messages, and parses out the meter's data. When employing UDP broadcasts, messages could be sent from the IEDs or meters to a server, e.g., servers 530, 630, since UDP broadcasts do not work across networks. The messages containing the IED's or meter's data can then be sent to external networks via any of the described (or to be developed) communication methods. Alternatively, a UDP unicast could support sending to any server, e.g., server 424, 524.

A Virtual Private Network (VPN) could be created such that each meter on the internal network is part of the same virtual private network as each of the clients. A Virtual Private Network (VPN) is a technology for using the Internet or another intermediate network to connect computers to isolated remote computer networks that would otherwise be inaccessible. A VPN provides security so that traffic sent through the VPN connection stays isolated from other computers on the intermediate network. VPNs can connect individual IEDs or meters to a remote network or connect multiple networks together. Through VPNs, users are able to access resources on remote networks, such as files, printers, databases, or internal websites. VPN remote users get the impression of being directly connected to the central network via a point-to-point link. Any of the other described (or to be developed) protocols could then be used to push data to another server or clients on the VPN.

Hosted data services, such as a hosted database, cloud data storage, Drop-Box, or web service hosting, could be used as an external server to store the meter's data. Hosted data services can be referred to as Hosting. Each of these Hosts, e.g., servers 440, 540, 640, could then be accessed by the clients to query the Hosted Data. Many of these hosted data services support HTTP Push messages to upload the data, or direct SQL messages. As many web service and cloud hosts allow their users to use their own software, a hosted data service could be further extended by placing proprietary software on them, thus allowing them to act as the external meter server for any of the previously mentioned methods (e.g., servers 424, 524).

In another embodiment, the IEDs can communicate to devices using Generic Object Oriented Substation Event (GOOSE) messages, as defined by the IEC-61850 standard, the content of which are herein incorporated by reference. A GOOSE message is a user-defined set of data that is "published" on detection of a change in any of the contained data items sensed or calculated by the IED. Any IED or device on the LAN or network that is interested in the published data can "subscribe" to the publisher's GOOSE message and subsequently use any of the data items in the message as desired. As such, GOOSE is known as a Publish-Subscribe message. With binary values, change detect is a False-to-True or True-to-False transition. With analog measurements, IEC61850 defines a "deadband" whereby if the analog value changes greater than the deadband value, a GOOSE message with the changed analog value is sent. In situation where changes of state are infrequent, a "keep alive" message is periodically sent by the publisher to detect a potential failure. In the keep-alive message, there is a data item that indicates "The NEXT GOOSE will be sent in XX Seconds" (where XX is a user definable time). If the subscriber fails to receive a message in the specified time frame, it can set an alarm to indicate either a failure of the publisher or the communication network.

The GOOSE message obtains high-performance by creating a mapping of the transmitted information directly onto an Ethernet data frame. There is no Internet Protocol (IP) address and no Transmission Control Protocol (TCP). For delivery of the GOOSE message, an Ethernet address known as a Multicast address is used. A Multicast address is normally delivered to all devices on a Local Area Network (LAN). Many times, the message is only meant for a few devices and doesn't need to be delivered to all devices on the LAN. To minimize Ethernet traffic, the concept of a "Virtual" LAN or VLAN is employed. To meet the reliability criteria of the IEC-61850, the GOOSE protocol automatically repeats messages several times without being asked. As such, if the first GOOSE message gets lost (corrupted), there is a very high probability that the next message or the next or the next will be properly received.

It is to be appreciated that the above-described one-way communication embodiments may apply to systems other than for energy metering. For example, the present disclosure may be applied to a vending machine or system, wherein the vending machine located in a building or structure having a private or corporate network. The vending machine will include, among other data collecting components, at least a communication device or network interface as described above. The communication device or network interface will coupled the vending machine to the internal network which may be further coupled to the Internet via a firewall. The vending machine may vend or dispense a plurality of items, such as soda cans, candy bars, etc., similar to the vending machine described in U.S. Pat. No. 3,178,055, the contents of which are incorporated by reference. In accordance with the present disclosure, the vending machine will monitor and collect data related to the items sold. Such data may include quantities of items sold, a re-stock limit that has been reached, total revenue generated by the vending machine, etc. In one embodiment, the vending machine will post to a web site, residing on a server outside of the internal network such as the Internet, quantities of specific items sold by the vending machine that are required to fill the vending machine. In this manner, an operator that maintains the vending machine can check the web site before going to the location of the vending machine and know exactly how many items are required to fill the vending machine before going to the location to refill the vending machine.

In another embodiment, the teachings of the present disclosure may be applied to a medical device, for example, a medical monitoring device configured to be worn on a patient. In this embodiment, the medical monitoring device will include at least a communication device or network interface as described above and monitor a certain parameter relating to a patient, e.g., a heartbeat. In one embodiment, the at least a communication device or network interface operates on a wireless connection and coupled the medical monitoring device to internal network (e.g., a home network) which may be further coupled to the Internet via a firewall, e.g., a router provided by the Internet Service Provider. At predetermined intervals, the medical monitoring device will communicate to and post the monitored data on a remote website. A user such as a doctor may then view the data of the patient by accessing the web site and not directly connecting to the medical monitoring device.

Other embodiments may include security systems such as fire alarm systems, security alarm systems, etc., which need to report data. Also envisioned are manufacturing sensing equipment, traffic sensing equipment, scientific instrumentation or other types of reporting instrumentation.

Based on the sensitivity of the data being communicated and posted through the firewall to various external networks, various data security techniques are employed by the IEDs (e.g., meters, vending machines, medical monitoring device, etc.) contemplated by the present disclosure, some of which are described below.

The original FTP specification is an inherently insecure method of transferring files because there is no method specified for transferring data in an encrypted fashion. This means that under most network configurations, user names, passwords, FTP commands and transferred files can be "sniffed" or viewed by anyone on the same network using a packet sniffer. This is a problem common to many Internet protocol specifications written prior to the creation of SSL such as HTTP, SMTP and Telnet. The common solution to this problem is to use simple password protection or simple encryption schemes, or more sophisticated approaches using either SFTP (SSH File Transfer Protocol), or FTPS (FTP over SSL), which adds SSL or TLS encryption to FTP as specified in RFC 4217. The inventors have contemplated the use of each of these schemes in the IEDs described above.

In one embodiment, the FTP server 131 in the IED 110 shown in FIG. 3 uses a set of username and passwords which are programmed through Modbus. These username and passwords can only be programmed when a user performs a logon with administrative rights. Each programmed user account can be given differing permissions, which grant or restrict access to different roles within the file system. Each role controls read and write access to specific files and directories within the file system through FTP. These roles can be combined to customize the access a specific user is given. When passwords are disabled by the user, a default user account is used, with full permissions, and a username and password of "anonymous".

Password protection schemes are measured in terms of their password strength which may be defined as the amount of resiliency a password provides against password attacks. Password strength can be measured in bits of entropy. Password strength is an important component of an overall security posture, but as with any component of security, it is not sufficient in itself. Strong passwords can still be exploited by insider attacks, phishing, keystroke login, social engineering, dumpster diving, or systems with vulnerabilities that allow attackers in without passwords. To overcome these drawbacks it is contemplated to use some form of password encryption scheme (e.g., 8-bit, 10-bit, 16-bit) in concert with the password protection system to facilitate secure communication between an external device, such as PC client 102 and the FTP server 131. However, there are drawbacks associated even with these schemes. For example, a username and password may be encoded as a sequence of base-64 characters. For example, the user name Aladdin and password open sesame would be combined as Aladdin:open sesame, which is equivalent to QWxhZGRpbjpvcGVuIHN1c2FtZQ== when encoded in base-64. Little effort is required to translate the encoded string back into the user name and password, and many popular security tools will decode the strings "on the fly", so an encrypted connection should always be used to prevent interception.

In another embodiment, an encrypted connection scheme is used. In particular, the FTP server 131 in the TED 110 uses some form of FTP security encryption, such as, for example, FTPS (FTP over SSL), Secure FTP (sometimes referred to as FTP over SSH, i.e., FTP over Secure Shell encryption (SSH)), Simple File Transfer Protocol (SFTP), or SSH file transfer protocol (SFTP). The FTP security encryption protocol provides a level of security unattainable with the previously described password encryption schemes.

FTP over SSH refers to tunneling a normal FTP session over an SSH connection. In the present disclosure, FTP uses multiple TCP connections, thus it is particularly difficult to tunnel over SSH. With many SSH clients, attempting to set up a tunnel for the control channel (the initial client-to-server connection on port 21) will protect only that channel; when data is transferred, the FTP software at either end will set up new TCP connections (i.e., data channels) which will bypass the SSH connection, and thus have no confidentiality, integrity protection, etc. If the FTP client, e.g., PC client 102, is configured to use passive mode and to connect to a SOCKS server interface, it is possible to run all the FTP channels over the SSH connection. Otherwise, it is necessary for the SSH client software to have specific knowledge of the FTP protocol, and monitor and rewrite FTP control channel messages and autonomously open new forwardings for FTP data channels.

In further embodiments, the networks may be configured to adhere to cyber security standards to minimize the number of successful cyber security attacks. The cyber security standards apply to devices, IEDs, computers and computer networks. The objective of cyber security standards includes protection of information and property from theft, corruption, or natural disaster, while allowing the information and property to remain accessible and productive to its intended users. The term cyber security standards means the collective processes and mechanisms by which sensitive and valuable information and services are protected from publication, tampering or collapse by unauthorized activities or untrustworthy individuals and unplanned events respectively. In the various embodiments and implementations of the present disclosure, the systems, devices and methods may be configured to be in accordance with, for example, the Standard of Good Practice (SoGP) as defined by the Information Security Forum, Critical Infrastructure Protection (CIP) standards as defined by the North American Electric Reliability Corporation (NERC), and the ISA-99 standard as defined by the International Society for Automation (ISA), the contents of each being incorporated by reference herein. It is to be appreciated that this lists of cyber security standards is merely an exemplary list and is not meant to be exhaustive.

According to one aspect of the present disclosure, the IED or metering device uses a general purpose operating system, e.g., Linux™, as its base. The IED provides communications on both network and serial interfaces, including Modbus, DNP, and HTTP. The IED monitors both three phase voltage and current, analyzes those values, and records the values in a log. These live values can then be retrieved using the aforementioned communications protocol, or as a log of values.

Each of the metering functions are added on top of the operating system as applications, each of which provides a service. For example, a Modbus server application would provide Modbus support; a web server application would provide web page support; a logging application would provide data and event logging, etc., the details of which are described below.

The IED of the present disclosure provides a platform which can be rapidly expanded and extended to add new functionality, and be quickly ported between platforms. To that end, a general purpose operating system is employed, which provides two benefits: (1) functionality can be implemented as individual applications on top of the operating system, and (2) only the underlying drivers need be changed when porting to a new platform. Additionally, the IED provides logging to keep a record of readings and events for as long as there is room to store them. The IED stores the records independent of current settings, which makes the records more resistant to system errors that would lead to invalid log items. Furthermore, the IED of the present disclosure is self contained—such that it could be configured, calibrated and tested, log retrieved, real time readings viewed, and statuses checked—all without requiring a specialized software and/or hardware to be employed. This frees up the software to focus on the larger picture of how all the meters, for example, in a network, work together.

Figure 10:
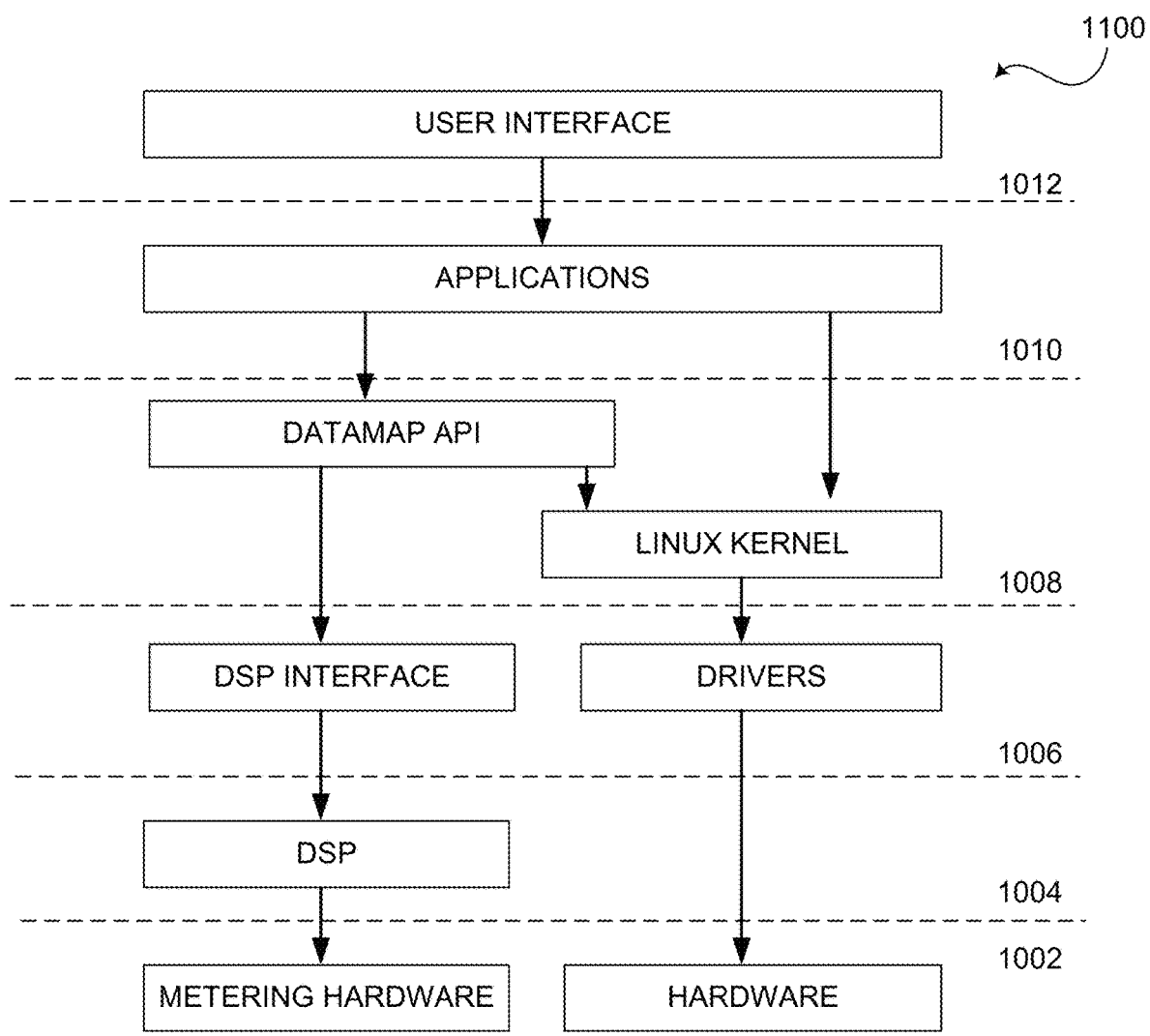
FIG. 10 is illustrates a system architecture of an intelligent electronic device in accordance with an embodiment of present disclosure.

Referring to FIG. 10, a system architecture 1000 of an IED employing a general purpose operating system in accordance with the present disclosure is illustrated. The system architecture 1000 is composed of 6 layers, each of which adds functionality on top of the previous. The layers, from lowest to highest, are as follows:

Hardware 1002—The hardware provides the physical metering capabilities, including measuring voltage, current, and high speed inputs, as well as providing the physical interface for the communications media, such as serial and networking.

DSP 1004—The DSP collects the data from the metering hardware, analyzes it, and passes it up to the higher layers.

Drivers 1006—Provides the actual implementation of the hardware specific interfaces, such that the higher layers do not need to know the details of the hardware they are running on top of.

Kernel 1008—The general purpose operating system which runs the applications, and provides the connection between the drivers, and the applications. Additionally isolates the applications from the hardware to enforce a more stringent security policy.

Applications 1010—The applications that provide the primary functionality of the meter, including logging, configuration, and communications. The application layer also provides internal data storage, system maintenance, and system stability monitoring functionality.

User Interface (IU) 1012—The interface to the outside world provided by the applications, including communications protocols such as Modbus, and UI (user interface) services such as a Web Server.

Traditionally, metering devices have been implemented using custom firmware, often which interacts directly with the hardware, and only implements and supports what is directly needed for that device when it is designed. Additionally, these implementations are often written such that all functionality is provided by a single component. This is often called a monolithic architecture. This often leads to problems when trying to expand the functionality of the device. One side effect of a monolithic architecture is that it often results in the problem that changing one component affects many of the other components. Another problem occurs when trying to port the functionality of the device to another platform. This can occur when the hardware of the device's design changes, or when the code is ported to an entirely new device. Because the firmware was written to directly access the hardware, significant modifications need to be made for it to work on the new hardware.

The IED of the present disclosure employs a general purpose operating system as the base for the components of the IED's firmware to facilitate expansion and porting of the IED For example, the general purpose operating system may be, but is not limited to, Linux™. It is to be appreciated that a custom operating system may be implemented, which performs the components described below.

Figure 11:
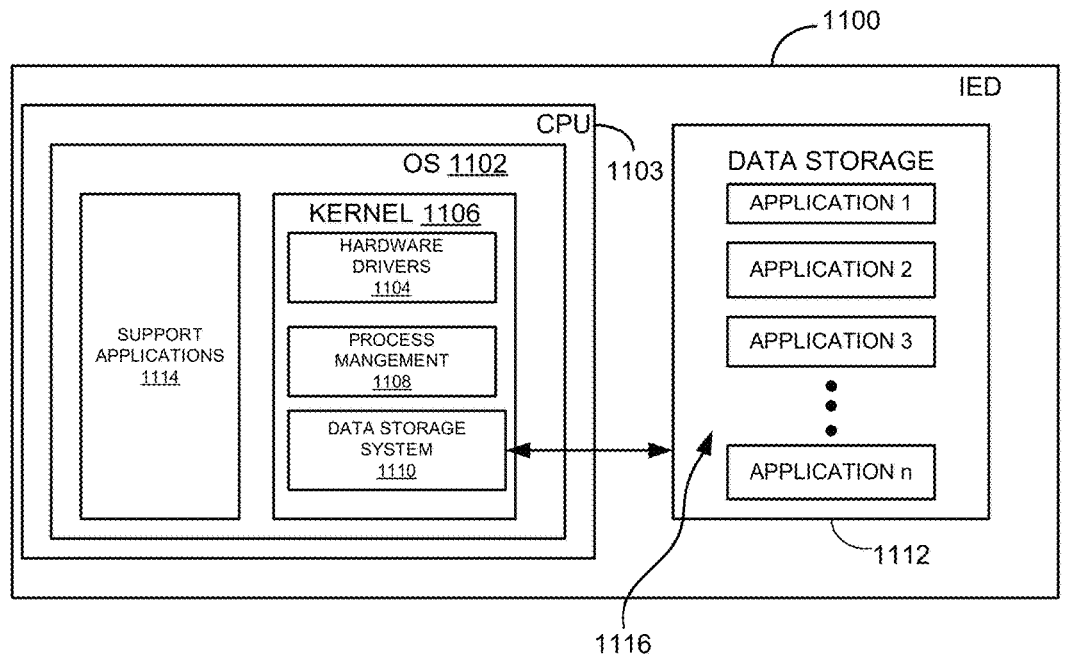
FIG. 11 is a block diagram of an intelligent electronic device in accordance with an embodiment of present disclosure.

Referring to FIG. 11, an IED 1100 is illustrated including a general purpose operating system 1102 executing on a CPU 1103 in accordance with an embodiment of the present disclosure. The general purpose operating system 1102 includes a set of code which provides the following components:

Hardware Drivers 1104—Code which implements the hardware specific functionality, while providing a common interface that the other components can use.

Kernel 1106—The central code which starts up the system, and manages the other operating system components; provides functionality pertinent to the running of the operating system.

Process Management 1008—Management system which allows arbitrary code to run, and ensures that each code block, called a process or application, shares equal time, and is isolated from one another.

Data Storage System 1010—A method to read and write data from a long term storage media 1112. The binary of the processes, also know as applications 1106, are often stored here, separate from the kernel.

Support Applications 1114—Code which implements support functions of the operating system but not specific applications for metering applications.

On top of the general purpose operating system 1102, processes are configured and executed to provide the individual functionality of the IED; each such process is called an application or application module 1116. Each of these applications or application modules 1116 add specific functionality to the IED 1110 or meter, but are independent of the other applications. For example, an application may provide a Modbus Server. As another example, an application may provide a Web Server. As another example, an application may provide data logging.

These applications 1116 may be further extended by keeping the functionality of each application separate from the functionality of another application, such that any one application can be stopped without causing the other applications to lose significant functionality. In one implementation, an application 1116 may encapsulate all the support tools required by the application inside the application itself, with the exception of the common or support tools 1114 provided by the general purpose operating system. For example, the Modbus server application may contain the code to access the network interface provided by the operating system. As another example, an application may contain the code to interface with the file system. This implementation could be improved by allowing the support code included to be loaded from a common source, e.g., a library, such that each of these applications that use such tools would use the same code, but loaded independently, such that they do not rely on each other. For example, extending the first example, the network interface application could be supplied as a Library loaded by the Modbus server; the same Library could then be used by the Web Server, such that the code is the same, but the two instances of the Library do not rely on each other.

Another implementation, which could be used along side the above-described implementation, may be to use long term storage, such as a file system, to pass information between applications, using a data storage mechanism, such as a database. This implementation allows applications to pass useful data between each application, but even if one application stops running, the other application can continue providing it's functionality. For example, the meters readings could be stored in a database, and the Modbus server application then scans or searches the database for the current readings. This implementation may be further extended by allowing applications to start and stop without modifying the contents of these long term storage files. This implementation allows an application to be configured such that it can continue to provide it's functionality, even if the application that provides the information is unreliable or runs infrequently. For example, the data logging application could be designed to only run when a data record needs to be captured, saving system resources. The logged data would still be available to the other applications that use the logged data, such as the Web Server application or Modbus Server application.

In another implementation, the TED allows applications to use the logged data even if the entire system is unreliable. For example, the input power to the device may be turning on and off, causing the device to reset occasionally. The logging application could record readings before the Web Server application was available to present the log data to a requesting client. As another example, if the device that provides the readings, such as the DSP, was temporarily unavailable, such as if the firmware was being updated, the Web Server application can still provide the last available readings, even should the system of the IED reset.

It is to be appreciated that the use of a long term data storage, called a Data File, may be configured such that the format of that file is in a common format, such that each application that wants to use that file can easily be implemented. In one implementation, a formatting application formats the data and/or data file into a common format. For example, instead of storing the readings data in the log data file as an explicit record that stores Voltage and Current readings, the data may be configured as a record that stores a single reading, such that another application may be added that stores Power, without modifying the format of that data file.

The use of a data file could be used to further improve the applications by allowing the application to store information about the current state of the application in the data file. Then, when the application restarted, the application may load those settings, and quickly resume what it was doing. For example, an application that uploads log data to an FTP server could keep track of what data it had already uploaded; if it reset halfway through, it could resume from the last file it uploaded. As another example, an application which downloaded updates to the system could keep track of what parts of the update file it retrieved, and could resume with the parts it doesn't have if a problem occurred.

Another problem with firmware that uses a monolithic architecture occurs when a component of the system must be updated, for example, a bug was fixed. As another example, a new feature was added. As another example, the configuration of a component, such as enabling or disabling settings of a feature, may have changed. When this occurs, the most common solution is to reset the entire system, even when the change was unrelated to other components of the system. For example, a bug fix in the Modbus server would not require the web server to reset.

In an implementation of the present disclosure, the IED enables individual applications to start and stop independently of other applications. For example, if the binary for the Modbus Server application needed to be updated, the binary could be updated, and then just the Modbus Server application restarted, without requiring that the web server application, which is unrelated, be restarted. As another example, this could be done for a change in the configuration of the application, such as changing the Modbus map which the Modbus Server application is presenting to the requesting clients.

Another problem common to monolithic firmwares is that since all the functionality is contained in a single set of loaded code, it is possible for functionality to be accessed, even if the code normally would not allow it. One possible way to do this could be a buffer overrun that causes a jump to a disabled feature. Another possible way to do this could be to cause an electrical discharge onto the hardware, that causes the currently executing code to either change, or jump to another location. Another possible way to do this could be to change the setting that enables or disables that feature, or to load random settings, thus resulting in the feature accidentally being enabled.

Therefore, by allowing applications to run independent of each other as in the IED of the present disclosure, the feature that the application provides can be completely inaccessible by removing it from the storage media that it would be loaded from. For example, the Web Server application may be removed completely by removing the binaries for the Web Server application from the file system. This would prevent it from ever being used, but would not prevent unrelated features, such as logging application or the Modbus server application, from operating correctly.

In one implementation, each feature on the IED is enabled or disabled by the user. When disabled, the binaries are deleted from the system such that they cannot be called. When enabled, the binaries could be downloaded from another source, such as a remote file server, or uploaded by the client. In another implementation, instead of deleting the binary from the system, the IED is configured in such a way as to prevent them from loading. For example, the binary could be marked as not executable on the file system. As another example, the header of the binary, which is used by the general purpose operating system 1102 to determine how to load the binary, could be corrupted in a reversible manner, such as performing an XOR on each byte. As another example, the binary loader could require a specific code in the header of the binary, often called a Magic Number, to load; this Magic Number could be changed to prevent the loading of the binary.

In another implementation, the IED 1100 stores each binary in an archive on the storage media, and when the feature is enabled, the binary for that application is extracted from the archive. The binary would still be deleted when disabled. This archive may further compress the archive's contents, to save space. This archive may further encrypt the contents, such that any unauthorized changes to the archive would invalidate the archive.

Another problem common to monolithic firmware is that when a problem occurs with one component, the whole system must be restarted. This could be because all the components rely on each other. This could also be because all the components are in the same running code set. This could also be because one component has locked up, such that the other components can no longer run. Using applications, this problem is mitigated; however if that application has a problem, the functionality that it provides may no longer be available.

In one embodiment, components of IED 1100 monitor the other applications, and if a problem is detected, then the monitored application could be restarted. Only if the component that implements this functionality had a problem would the entire system have to reset. In one implementation, the IED 1100 includes an application that performs this monitoring functionality. In another implementation, the process management component 1108 of the general purpose operating system 1102 is configured to monitor the individual applications.

In one embodiment, the monitoring functionality, e.g., the process management component 1108, monitors the application's running status, for example, by checking a process id of the application. If the monitor sees that the application is not running, but that it should be, the monitor may then restart the application. In a further embodiment, the monitoring functionality may be configured such that each application includes a function that notifies the monitor, e.g., the process management component 1108, that it is running. For example, this could be implemented as a file that is written by the application on a timer, and the monitor checks that file to see if it is being updated. In another embodiment, each application may generate a system message, such as a network socket, or a pipe. This notification may also include additional status information, such as operational state, to the monitor.

Many devices implement a hardware function that resets the system if that hardware is not notified that the system is still running correctly on some interval. This is often called a watchdog. In one embodiment, the monitoring functionality e.g., the process management component 1108, performs the notification of the watchdog, as it is the component that is best able to make that determination. The monitoring functionality e.g., the process management component 1108, may further include a set of rules, called heuristics, that it could use to determine if the problems with the system are significant enough that it requires a full reset. For example, if applications are failing to start because they are unable to access the storage media, restarting the general purpose operating system may help. As another example, if a hardware device, such as the serial ports, are not accessible by the applications, then restarting the system may help.

Figure 12:
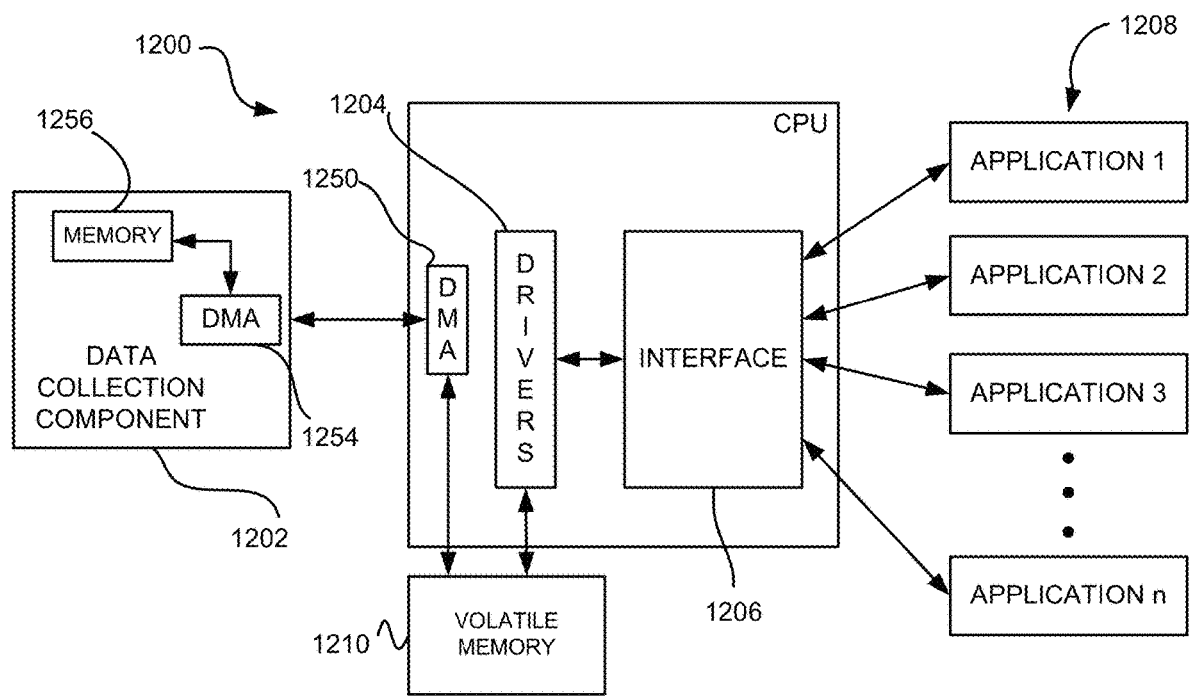
FIG. 12 is a block diagram of a common data interface of an intelligent electronic device in accordance with an embodiment of present disclosure.

In one embodiment, the general purpose operating system 1102 is configured to include a common data interface 1200, as shown in FIG. 12, to allow the applications that are running on it to be implemented in such a way that they do not need to know what hardware they are directly using. Devices such as meters have specialized data collecting devices not found in most general purpose operating systems. For example, many have analog to digital converters, used to measure voltage or current. As another example, many have digital inputs which measure the shorted/not shorted state of the wires they are connected to. This data often needs to be used by the top level functionality of the meter, but in the isolated model of a general purpose operating system, those top level applications do not have direct access to the data collection hardware of the system. For example, the web server application may want to present voltage on a web page.

Referring to FIG. 12, the common data interface 1200 includes a driver 1204 that accesses a data collection component 1202, e.g., DSP 60,70 as shown in FIG. 1, and a interface application 1206 that applications 1208 can use to read the data collected, called a Library. The driver 1204 receives data from the data collection component 1202 and fills memory 1210, e.g., volatile memory, with the data. The interface application 1206 retrieves the data in the memory 1210 for at least one application 1208, via driver 1204. The driver 1204 then may be changed for new hardware, without changing the data access library, thus allowing applications 1208 to be used on different devices, with different hardware, with no change to their code. The data access library may be expanded by providing data other then just the data collected from data collection component 1202. For example, system state information, such as uptime, memory available, data storage space used, and applications running, could be provided. As another example, system configuration information, such as the IP address, device serial number, device type, designation, etc., may be provided.

One implementation of the transfer of data between the data collection component and the memory accessible from the CPU, is to use a DMA controller to transfer the data between the memories of each of the two processors. For example, the kernel running on the CPU could specify a section of its memory to the DMA controller as the location to write data updates to. Then, when the data collection component had an update to the data, it could trigger the DMA controller to transfer the data.

In one embodiment, the CPU includes a first DMA controller 1250 coupled to memory 1210 and the data collection component 1202, e.g., DSP, includes a second DMA controller 1254 coupled to memory 1256. The first DMA controller 1250 is employed to transfer data to the memory 1256 of the data collection component 1202 and the second DMA controller 1254 is employed to transfer data to memory 1210.

A DMA controller can generate addresses and initiate memory read or write cycles. It contains several registers that can be written and read by the CPU. These include a memory address register, a byte count register, and one or more control registers. The control registers specify the I/O port to use, the direction of the transfer (reading from the I/O device or writing to the I/O device), the transfer unit (byte at a time or word at a time), and the number of bytes to transfer in one burst. To carry out an input, output or memory-to-memory operation, the host processor initializes the DMA controller with a count of the number of words to transfer, and the memory address to use. The CPU then sends commands to a peripheral device to initiate transfer of data. The DMA controller then provides addresses and read/write control lines to the system memory. Each time a word of data is ready to be transferred between the peripheral device and memory, the DMA controller increments its internal address register until the full block of data is transferred.

The transfer of data between processors is limited both in the size of the block that can be transferred, and the time it takes to perform the transfer. However, since only a small portion of the data needs to be updated frequently, it would be wasteful to repeat updates by transferring all the data all the time.

One implementation is to break the data into frames, based on the update rate of the data, and only send the frames for the data which needs to be updated. Such a frame could contain a header which specify which data is contained within the frame, so that the driver 1204 can interpret what data is being updated when it receives the frame. Additionally, the header of the frame could contain an update index, so that the driver could identify the order and relation in time of the updated data.

One implementation of the transfer of frames could be to organize the frames in the time domain, such that the fast updating frames are transferred every update, but that the remaining frames are used to transfer lower priority frames that have been queued to be updated. For example, say the maximum data update rate is 4 ms, and the throughput allows for 10 frames to be transferred every 4 ms. On each update, 5 of the frames transferred could be 4 ms updated data, which must be updated every transfer. This leaves 5 frames left over for other update rates. If 50 frames need to be updated every 200 ms, 1 frame each update cycle could be dedicated to transferring these 200 ms frames. If 10 frames need to be updated every 1 second (1000 ms), 1 frame every 100 ms, or 25 update cycles, could be used to transfer these 1 second updated frames. Other arrangements are possible, including using the remaining available frames to transfer slower data when necessary. Also it should be appreciated that the transfer of lower priority frames could be deferred to a later update to make room for higher priority frames, and as such, the arrangement of frames in time is not fixed.

Another implementation of the transfer of frames could be to organize the frames in the data domain, such that all related is transferred together, as a history of updates. For example, say the maximum data update rate is 4 ms, and the throughput allows for 10 frames to be transferred every 4 ms. If 1250 frames of 4 ms data must be transferred every second, then all 10 frames of each update cycle could be used for the first 500 ms of each second to transfer the 1250 frames of the history of the previous second. When the receiving driver 1204 processes the frames, it could use the update index to properly arrange the updated data in time. The remaining 500 ms could then be used to transfer other data in a similar arrangement.

One common problem when designing data interfaces occurs when the data is passed as a fixed layout structure. For example, a structure could be used to pass the data that has a 4 byte unsigned integer for voltage, followed by another 4 byte unsigned integer for current. However, should that interface need to change, for example the values need to be passed as floating point, or a new value needs to be passed, the entire interface must change. This often requires that both the source of the data, and the consumer, change to match. This is often very difficult when the consumer of the data is an external software, such as a Modbus client. Alternatively, if a data access library is used, an explicit function to get each value, often called a property, is implemented. If new values are added, the interface to the data access library must be changed, which again requires that the consumer of the data change.

Figure 13A:
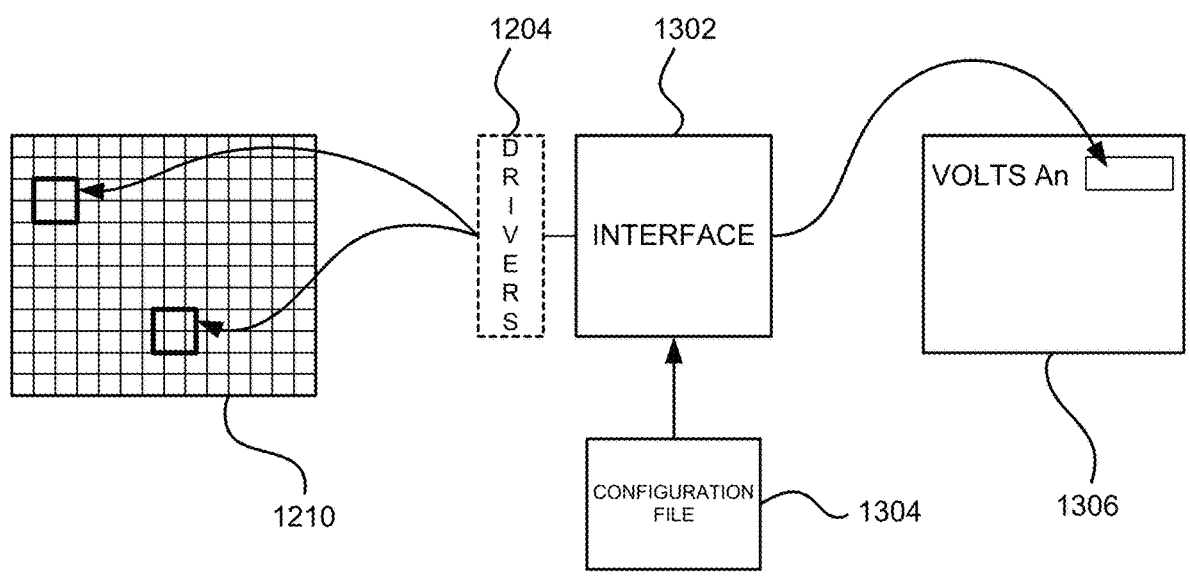
FIG. 13A illustrates use of a configuration file or map in conjunction with the common data interface shown in FIG. 12 in accordance with an embodiment of present disclosure.

In another embodiment, the interface 1206 uses a key, independent of the physical layout of the structure to access the data. In one implementation, a string key, such as 'readings.volts.an', is provided which is mapped to the value in the memory 1210 by an interface library 1302 as shown in FIG. 13. For example, the data access library could have a function, GetReading, which takes as input the key, and returns the value requested. This would prevent the applications that use the data access library from having to change if new items were added.

In another embodiment, the data map interface 1302 employs a special library or map, which is knowledgeable about the internal layout of the data in memory 1210. For example, in version 1 of the data layout, volts AN may be stored at an offset of 1000 bytes, and be stored as a 4 byte signed integer. In version 2 of the data layout, volts AN may have moved to an offset of 1036 bytes. In version 3 of the data layout, volts AN may have changed to be stored as a IEEE 4 byte floating point number. In such an example, if there are three applications that use that value, say a web page, a data logger, and a Modbus server, under conventional designs each would have to be updated each time the internal data layout was changed. With such a data map interface of the present disclosure, only the one library would have to be updated, which could easily be included as part of the update to the source of the internal data layout, such as the data collection firmware 1202, e.g. a DSP.

In further embodiment, the data map interface 1302 is configured to a special library, which uses a configuration file 1304 to specify the internal layout and format of the data in memory 1210. For example, such a configuration file 1304 could specify that volts AN is at an offset of 1000 bytes, and has a format of a 4 byte integer. When the data map interface 1302 is initialized, the interface 1302 then loads the map in the configuration file 1304, and use that map to find the requested data. For example, such a configuration file may contain 3 entries for each item: the lookup key, the byte offset, and the format of the item. When an item was requested, the data map interface 1302 would find the key in the configuration file 1304, and use the byte offset and format to read and parse the data to be returned to the requester. The configuration file 1304 may also be loaded on first use, or every time data is requested. In such an example, if the internal data layout changed, such as moving volts AN to an offset of 1036 bytes, the configuration file 1304 could be updated along with the data collection firmware 1202, e.g., DSP, avoiding the need to update the data map interface library.

In other embodiments, the configuration file 1304 may be generated from the same layout that the data collection firmware component 1202 uses. This could help prevent mismatches between the configuration file 1304, and the actual implementation of the layout. In one embodiment, the configuration file 1304 may be configured be to store the each item and it's layout in a management software during development, such that the management software could export both the configuration file, and the source code to be included in the data collection firmware component 1202. Additionally, the configuration file 1304 includes a special item in the data map interface that requests the configuration directly from the data collection firmware 1202. Such a configuration file could be stored in the data collection firmware's memory storage, or as part of the firmware itself, and written to the internal data memory when it first starts running. Such a file could also be requested as part of a windowed command to the data collection firmware.

In yet another embodiment, the configuration file 1304 includes additional information, such as, but not limited to, display names, formatting information, groups of items, and descriptions of the usage of an item. Such a configuration file may then be used by top level applications, to provide information on each item available. Additionally, this would allow applications to use newly added items, without modifying the application. For example, a data logging application could display a list of items able to be logged to the user, where such a list was built by reading the configuration file.

The keyed interface 1302 could be further improved by using a configuration file 1304 that contains the list of keys that an application should use. For example, the Web Server could have a web page that displays voltages, and have a configuration file that lists each of the keys for the voltage that it is to display. The configuration file 1304 could be used to improve the functionality of the applications, such as the Modbus server, by configuring it such that layout it presents would be similar, or the same, as another device. For example, the Modbus server could be configured to present addressed data, called the Modbus Map, in the same way as an older meter, thus allowing it to be used with external software that only works with that old meter.

The configuration file may be configured to store a name to be presented to the user, so that the user can easily understand what value is associated with the key, called a Display Name. For example, 'readings.volts.an' could be displayed as 'Voltage AN'. This would facilitate changing configurations, which would be to display the Display Name along with the displayed value, such that the user could easily understand what the value is. For example, on a web page that displays voltages and currents, the names 'Volts AN' and 'Current A' could be used to easily distinguish such items from each other. If the configuration value changed, such that the position on the page which previously displayed 'Volts AN' now shows 'Watts 1+4 Phase A', the user can easily distinguish the two by name.

The keyed interface 1302 could be further improved by allowing the consumer or end user to specify the format that it wants the data in. For example, the internal structure may define a voltage as an 4 byte integer, but the consumer wants it as a float. As another example, the internal structure may have originally defined the format to be a 2 byte integer, but was later changed to a 4 byte integer; the consumer has always requested it as a float, so no change needs to be made to the consumer application. As another example, an external software may only know how to parse 2 byte signed integers, but the device internally stores the value as a double; down scaling would be required.

Since the configuration file may change from time to time, the external software may not be aware of what items it is seeing. For example, a Modbus Map is just an arbitrary block of 2 byte values, called registers, which must be parsed to get the contained values. One possible solution to this could be to provide a method to retrieve the current map, so that any external software that used it would be able to parse the current data arrangement. In one embodiment, a fixed section or item is provided, that contains the configuration for the external software to download. For example, with the Modbus server, a group of Modbus registers in the Modbus map could always return the configuration file, ignoring the configuration for those registers. As another example, with the DNP server, a fixed object could be set to always return the configuration file.

Another possible implementation of this could be to provide an alternative method to retrieve the configuration, outside of the functionality it configures. For example, the Modbus map configuration could be downloaded via a web page. As another example, the Modbus server could respond to a command to send the configuration file to a client by opening a specified port on the client, and streaming the file. This would then be collected by a listener on the client, which could then use the configuration file.

In other embodiments, the keyed interface 1302 is configured to allow writes to internal values, such as system settings, command triggers, temporary variables, long term storage variables, using the key to identify were to write the value, called a Keyed Write. One implementation of this includes adding a function to the data access library, SetValue, which takes a given value, and performs the necessary actions to store that value.

Devices such as meters typically use addressed protocols such as Modbus to allow external clients to read their values. Such a pairing of addresses and value definitions is here called a map. However, since many devices are designed such that the addresses of each value is typically fixed, many external clients are written such that they expect the value to be at that address. Changing this may require extensive configuration, reimplementation, or in the case of old software that is no longer maintained, may not be possible anymore. This causes problems when new devices are added, or existing devices are replaced, that don't use the same addresses.

In one implementation, a device that uses an addressed protocol, such as Modbus, may mimic the map of another device. This would allow new meters that supported such a solution to be added to an existing system without reconfiguring that system. One implementation of mimicking another map could be to implement a configurable mode in the device that when set, the protocol server, such as a Modbus server, of that device uses the map of another device. This could include mimicking the addresses of values in the map, as well as mimicking static values, such as device identification information, so that external clients that use that identification information will believe the device they are communicating with is the old device.

Another implementation of mimicking another map could be for the protocol server, such as a Modbus server, to use a configuration file to describe the map that it uses. Such a configuration file could be designed to mimic the map of another device by specifying for each protocol address: the protocol address to use; the format of value, such as 4 byte signed integer, or 8 byte IEEE float; and the internal value to map the protocol address to. When an external client requested the value of an address from the server, the server could then process the configured map of protocol address, determine the internal value to query, transform it to the format the configured map specifies, and return the mimicked value to the external client. Such a configuration map file could be stored as an xml file, a csv file, or a json file, each of which allows the grouping of entries, such as protocol address, format, and internal address, though other such file formats could also be used.

Using a configurable map file could be further extended by allowing multiple such files to be used on a device, such that the user could select which device to mimic from a list of maps. For example, a device could contain the configuration map for 5 other device types. The list of these device types could be presented to the user, allowing him to choose which map the protocol server would use, until the map was next changed. This implementation could be further improved by allowing external clients to send a command to the protocol server to specify which map to use, such as a Modbus write, where the map to use is a name, or an index in a list.

Using a configurable map file could be further extended by allowing the user to import and export those file to and from the meter. For example, a webpage that is used to configure the Modbus server could list each of the configuration maps that the device contains. Such a page could also have an export button, that when pressed could download the configuration map file from the meter. Such a page could also have an import button, that when pressed could upload a configuration map file from the user's computer, which could then be selected to be used for the Modbus server.

Using a configurable map file could be further extended by allowing the user to configure their own maps. Such configuration could be done by editing an exported configuration map file directly, then importing it back into the meter. Such configuration could also be done by providing a webpage on the meter's webserver that provides the ability to edit a configuration map file. Such a page could provide actions including, but not limited to, copying another configuration map file, creating a new configuration map file, deleting a configuration map file, adding an address entry to an existing map, changing the parameters of an existing address entry in a map, deleting an address entry from a map, or copying the parameters of an address entry in a map.

Protocol servers, such as Modbus servers, typically operate on multiple ports, such as, but not limited to, multiple rs-485 or rs-232 interfaces, and TCP ports. Using a configurable map file could be further extended by allowing each protocol server on each port to use a different configuration map file. For example, a device which has a Modbus server running on 2 rs-485 ports, and TCP ports 502, 5000, and 5001, and which has configuration map files for 5 different device types, could mimic a different device on each port.

One problem that occurs when the consumer of data is not the component that directly accesses the hardware is that this introduces an inherent, non-deterministic, delay between when the value was measured, and when it is presented. This is often called latency. Additionally, if the measured value is updating rapidly, and multiple measurements are being read by the consumer, there exists the possibility that the measurements may not be from the same point in time. Additionally, this is further complicated when the consumer requires that it have the measurement values at a specific point in time, often called an event. For example, voltage may spike for a short period of time, and the consumer may want to record other values at the same time.

In one implementation, the IED buffers the values, such that a short history of such values are available to the consumer. Then, when the consumer wants the values from a specific point in time, that value can be read from the buffer. One implementation of this request could be to use an index, the details of which are described below in relation to FIG. 13B. Another possible implementation could be to use a key, such as an offset, a timestamp, or a reference index of an event.

Figure 13B:
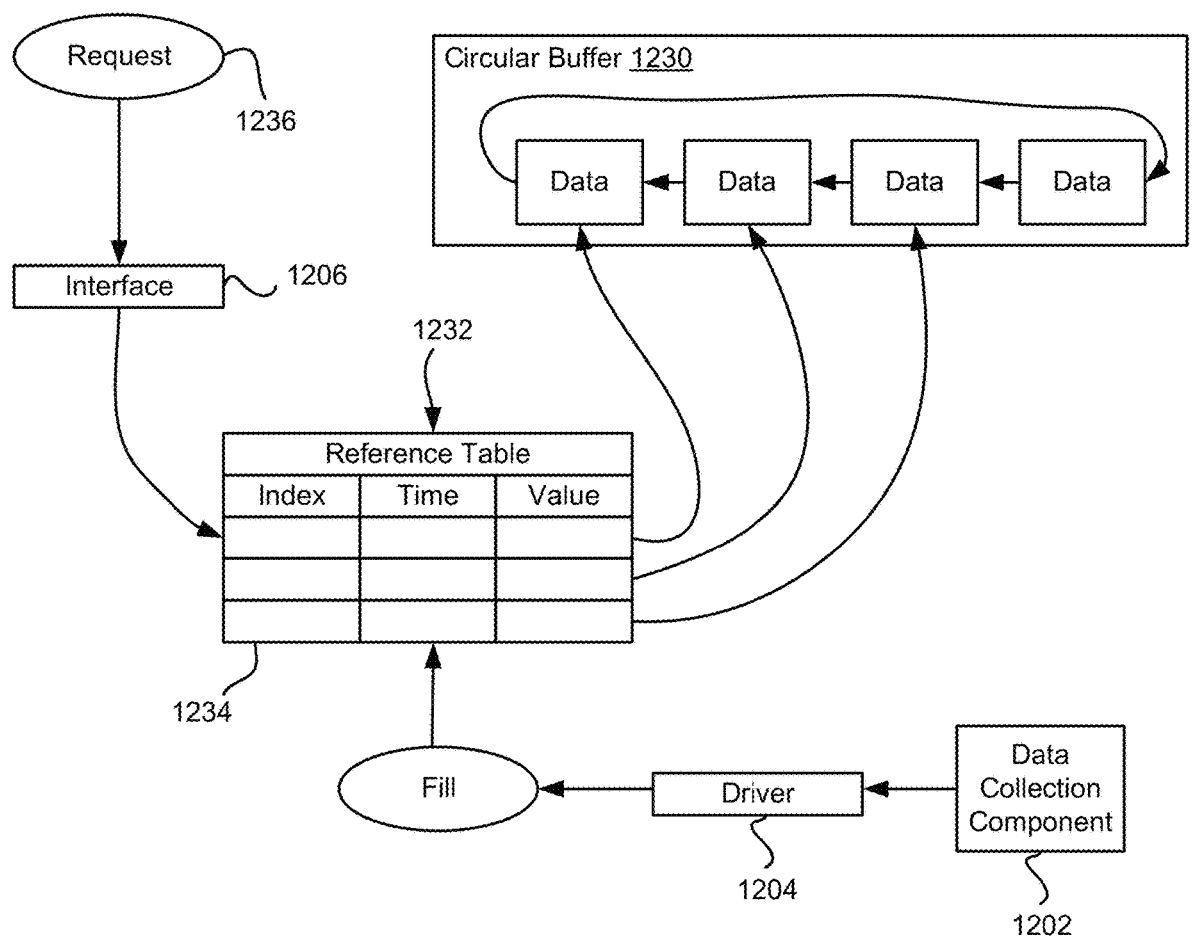
FIG. 13B illustrates a method for buffering data in an intelligent electronic device in accordance with an embodiment of the present disclosure.

One implementation of buffering the data could be to store each block of data 1210 transferred from the data collection component 1202 in a different location in memory, such that previous blocks would still be available after the current block 1210 has been updated. One configuration of this is represented in FIG. 13B. Each update to the data blocks 1210 by the driver 1204 places the new data in the next spot in circular buffer 1230. Each of these blocks would then be listed in reference table 1232, and have a unique index 1234. On the application side, when an application requests a data value 1236, the request 1236 may specify an index 1234, and the interface 1206 could then read the value from a previous block of data then the current one. The current data could still be requested by not specifying an index 1234. Such an implementation could be used for any data value accessible from the data interface 1206, including data values such as voltage, current, power, or energy, as well as system values such as processor usage, and events, such as pq events, waveform samples, and limits.

One of the common problems encountered when developing and maintaining devices such as meters is that a large amount of effort must be put into developing and maintaining external support software. For example, a meter may require a suite of testing softwares including calibration, board level tests, and configuration verification tools, often used during the building of the device for a customer. As another example, configuration softwares are often created to provide the user the ability to configure the device. As another example, log softwares are often created to retrieve a meter's logs, and other softwares created to view those logs. As another example, programming software is often created to upload the firmware to the device.

In addition, these softwares need to be maintained in parallel to the firmware they support, which can lead to disjoints in functionality and support when major changes are made to the firmware. Furthermore, since these softwares are external to the device, there is inherent delay in interfacing with the device, which may lead to error in the data transferred. In addition, the device must be programmed with extra functionality to provide the interface for these external softwares to interact with the device.

In one embodiment, the IED 1100 is configured to be self contained include a plurality of application provide all of the functionality to configure, test, and poll the device from the device itself. This would provide 3 benefits: (1.) if common libraries are used, then it is easier to keep these functions up to date, when the device provides them itself; (2.) since there is little to no interfacing with external software required, the data can be more accurate, which can especially improve testing processes such as calibration; and (3.) since there is little to no interfacing with external software required, and the device's firmware already has the ability to access its own internal values, the process of implementing the functionality provided is simpler.

Figure 14:
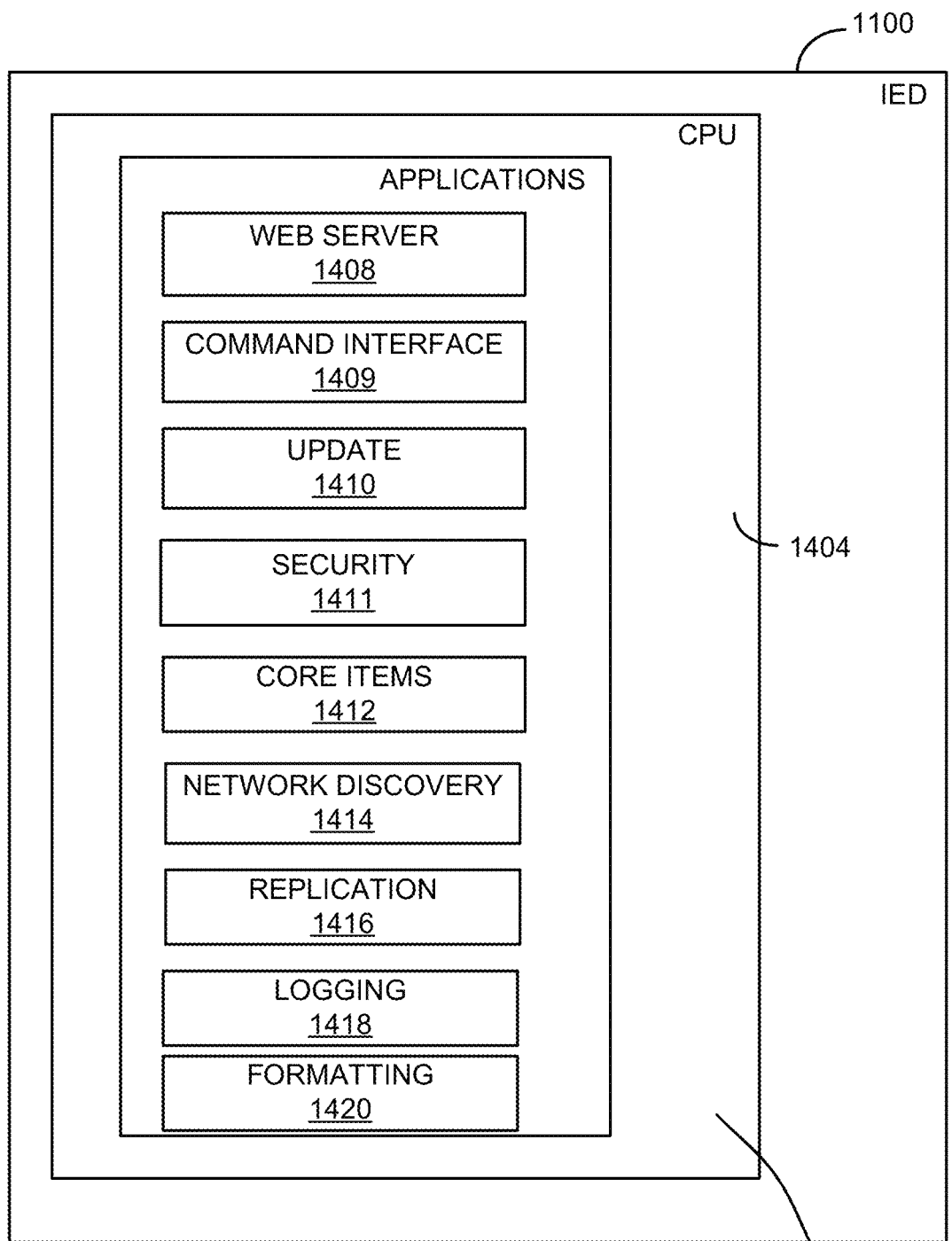
FIG. 14 illustrates a plurality of application modules of an intelligent electronic device in accordance with an embodiment of present disclosure.

In one implementation, the IED 1400 is configured to includes a plurality of applications or modules 1402, for example, to be executed by the CPU 1404 to configure, test, and poll the device from the device itself. For example, the applications may include, but are not limited to, a web server module 1408, a command interface test module 1409, an update module 1410, a security module 1411, a core items module 1412, a network discovery module 1414, a replication module 1416, a logging module 1418 and a formatting module 1418 as shown in FIG. 14.

In one embodiment, the web server module 1408 presents web pages for each internal functionality required of the IED 1100. For example, a page may be presented which contains the current readings of the device. As another example, a page may be presented which allows the user to configure the device settings, such as communications parameters, metering parameters, device identification. As another example, a page may be presented which initiates a self test in the device, which verifies that the meter is operating correctly, and then presents the results to the user as another page, or as new contents on the current page. As another example, a page may be presented which allows the user to retrieve the logs of the device, downloaded as a file. As another example, these same logs could be displayed on a web page.

A command interface test module 1409 is provided which interacts with various components such as a touch screen, web page, proprietary command interface, or Modbus command, initiates a test with specified settings. The settings could be specified as part of the command, a file stored on the device, or settings initialized through another command interface. For example, a meter could have a self calibration test, which computes offsets and gains to make the readings of the meter more accurate. This test could employ an external device, such as a steady source, to output known input values, such as voltage or current, by physically connecting the communications ports of the meter to the source and sending the appropriate commands. The voltage and current output terminals of the source would be connected to the voltage and current input terminals of the device. Additionally, the meter could employ the same method to use an external reference device, used to verify and compensate for inaccurate or unsteady sources. This external reference device would also be hooked up to the voltage and current output's of the source.

These internal tests may be stored as a report of the results of the test in the file storage of the device. This report may later be viewed by the user to verify the current tested state of the device. For example, a calibration report could be stored, which could, for each point calibrated, contain error percentage, reference values, values measured, and the calibration values computed. Additionally, these stored reports may store the configured values of the tests in multiple separate files, which could then be selected at a later date to change the current configuration. For example, a meter could be calibrated in such a way as to emphasize accuracy at a high voltage, and then calibrated again to emphasize accuracy at a low voltage. These calibrations could later be selected from to improve the accuracy for a given nominal input. Since in most circumstances, readings are relatively steady, multiple calibrations may be analyzed by a process or application which monitors the readings of the device, and automatically picks the calibration which has been optimized for the current range of the readings. A heuristic could be used to ensure that the calibrations do not keep bouncing back and forth. For example, the readings could be steady for a period of time before switching to that range.

It is to be appreciated that the applications to perform the test may be provided on the IED 1100 and later removed when it is no longer needed. These applications could later be given to the user to include on their device, allowing them to repeat the test should it be necessary or desired. For example, an application for the device could be created which performs calibration. This application may be used to calibrated the device in the factory, then removed, as it requires hardware, such as the external source and reference, that are no longer available. Later, the user may wish that the device be recalibrated, perhaps to adjust for issues with the context of the devices installation. The application, along with instructions for connecting the external devices, could then be given to the user to perform these actions. As another example, the meter could be recalibrated by the user to emphasize accuracy at a point which the factory calibration doesn't emphasize.

Another problem often encountered with such devices occurs when the user encounters problems with the functionality provided by the device, but which the problem has already been fixed. For example, a bug may exist in the version of the Modbus server which the user has on their device, but a newer version that fixes this problem is already available. As another example, a security flaw may have been found and patched in the general purpose operating system, but without the updated operating system, the device is still exposed.

In one embodiment, an update module 1410 is provided to automatically query an external server for updates, and if there are any updates available, download and update those applications. In one embodiment, the IED is configured to have an application on the device, which periodically checks the external server for new updates. If an update is found, it could download the update, and replace the application being updated. In one embodiment, the user configures the update application such that it only performs the update if the user confirms the update. In one embodiment, the user is notified in some manner of the update, such as an email, a list on the web page, an event in the system log, or a notification on the display of the IED.

The transfer of the application may be further facilitated by compressing the update to the application being transferred from the external server to the IED. This would improve the speed of downloading the update, and reduce the required storage space on both the IED and the external server.

Since the external server could be faked, as a method of hijacking the device's functionality, the process of interacting with the external server could be further improved by securing the connection to the external server, via a security module 1411. In one implementation, the security module 1411 may employ HTTPS to ensure that the external server is who the IED expect them to be. In another implementation, the security module 1411 may employ SSL (Secure Socket Layer) or TLS (Transport Layer Security) to wrap the data transferred to and from the external update server.

Since the above methods rely on certificates, which can be faked, the security module 1411 may employ a challenge and response between the IED and the external server, to ensure the external server is real. In one implementation, the external server is configured to have a unique file, whose contents are computed periodically by a private algorithm shared between the IED and the external server. In another implementation, the external server has a special network service running, which sends a generated key, using a private algorithm shared between the IED and the external server, to the device on request. Another implementation employs this same special network server, but for the external server to also require the device to send the external server a generated key.

In one embodiment, the IED is configured to include an application on the IED which performs the functionality of the external server, using either an archive of updates specifically for that purpose, or the updates that it used for it's own functionality. In this embodiment, the update application or module 1410 replicates the external server for other IEDs. For example, an IED with such an external server application could download application updates from an external update server, called the Primary Update Server. Then other devices, e.g., other IEDs, may the query updates from the IED's update application or module 1410 without requiring access to the Primary Update Server. This could then be chained for as long as necessary by the user. In this embodiment, the update application or module 1410 may be configured to notify other devices that an update is available, without their having to query for the update. In one implementation, the update application or module 1410 employs the use of a local network broadcast message, such as UDP, or UPnP event notification, send from the IED to any listening devices. In another implementation, the other IEDs may register with the update application or module 1410 that it wants to be notified of updates. In this embodiment, the update application or module 1410 keeps a list of such devices, and when an update is found, it sends a message specifically to each of those devices. For example, this message could be an HTTP Post. As another example, this message could be a private message sent over TCP or UDP.

Another problem with updating the functionality on a device is that often changes to one application require changes to another application. For example, the Modbus server may require the networking library, the data access library, and driver which reads from the measurement hardware. If a change is made to the data access library, then the Modbus server application may not be able to be updated without also updating the data access library.

In one implementation, the update application or module 1410 includes a list of dependencies for each application. These dependencies could be other applications, which would be required to be updated along with the primary application. In one embodiment, when the update application or module 1410 checks for updates, if the application being checked has any dependencies, it checks those applications first, updating them as necessary, then updating the first application at the end. Another possible implementation of this could be that dependencies are packages of multiple updates, all of which are applied at once, to ensure that everything is updated correctly.

Often when a user gets a new device, they must configure both the device and their external system for everything to work the way that they want it to. This is often a time consuming, and error prone, process. For example, the wrong items could be chosen for the logs, only to be found a month later when expected data is missing. As another example, the communications could be misconfigured, forcing a back and forth procedure between the device and external software to get the two to communicate. As another example, the user may have hundreds of devices, each of which have similar settings, but the user must manually configure each and every device, easily leading to repetition errors.

In one embodiment, the IED is configured to have a set of configurations and actions, which are always available regardless of how the user configures the device, stored in a core items module 1412. The core items module 1412 provides the functionality and data which the majority of users would need, the majority of the time. In one embodiment, the core items could be to define a set of data points which describe the most common uses of a metering device. For example, this list could include voltage, current, power, energy, and frequency. As another example, the core items include the accumulators of the device. As another example, the core items may include the raw values read from the measurement hardware of the device. The core items may also include the average, maximum, and minimum value of each of the points in the data set, over a defined interval, for example, the core items module 1412 may be configured to measure the voltage for an interval of 15 minutes, and use the average of those values, along with the max value, and the min value, for the values in the core items. The core items may be automatically logging by core items module 1412 on a defined interval. This my be configured using the same interval as the core item average, max, and min defined interval, for example, the average, max, and min core items may be logged to a core items log every 15 minutes.

It is to be appreciated that having these core items available also allows the other functionality provided by the IED to rely on those values being available. For example, a web page could be created that shows a trend of voltage over the last day. As another example, a web page may be created that compares the energy usage of the current day with the previous one. As another example, an application may be created that analyzes the trends of the core items, looking for power quality problems, and reporting if any are found. As another example, an application may be added to the device, that relies on these core items, and be able to perform actions based on data from before the application was added, as it does not require a dedicated log that the application must create.

The IED 1100 further includes a network discovery module 1414 configured to auto-detect the communications settings on both the IED and external network side. The network discovery module 1414 eliminates the possibility of the user misconfiguring the communications settings.

In one implementation of network discovery, a DHCP server may be employed that allows a client, a personal computer (PC), to query the list of connected DHCP clients, e.g., IEDs or meters, and have the default configuration of the IED to get its network address from DHCP. This list would contain both the network address of the IED, and a unique name specified by the IED This unique name could be parsed by the client to determine if it is the IED in question.

Figure 15A:
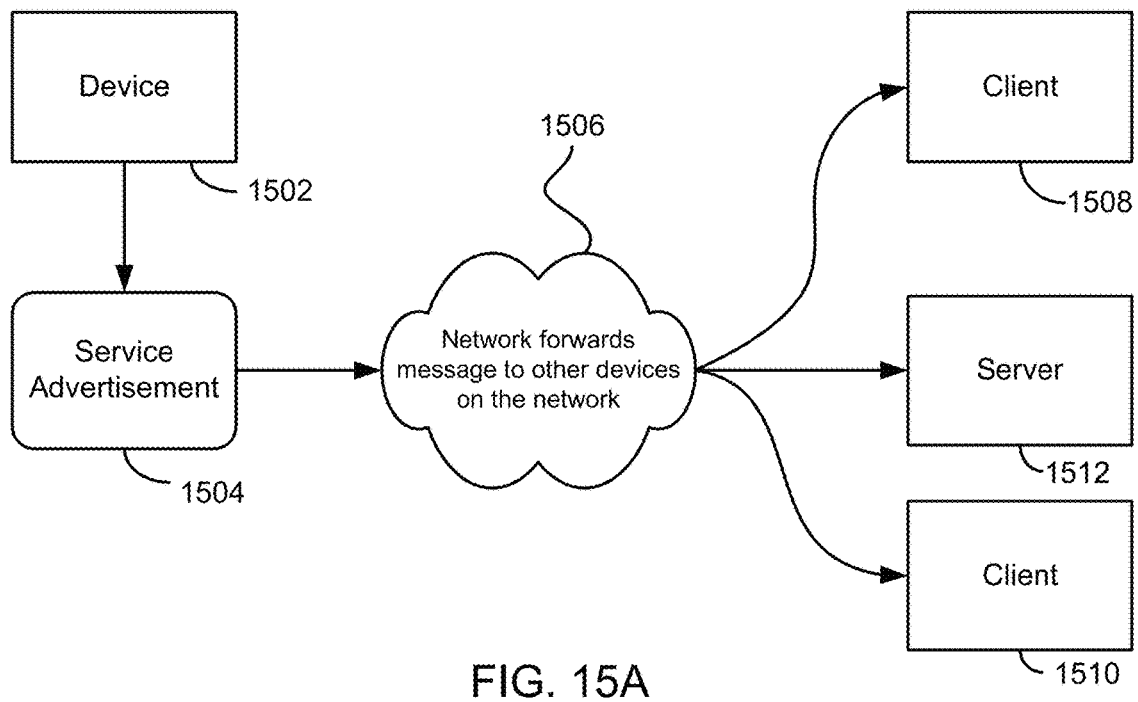
FIG. 15A illustrates a network discovery feature of an intelligent electronic device in accordance with an embodiment of present disclosure.

In one embodiment, the network discovery module 1414 employs a service advertisement protocol on the IED as shown in FIG. 15A. The IED 1502 broadcasts service advertisement 1504 over a network 1506, where the network forwards messages, i.e., the service advertisement 1504, to other devices on the network 1506. The clients 1508, 1510 and/or server 1512 then listen for such advertisements to determine what devices are available on the network. Again, the IED 1502 is configured for DHCP, and allows a server 1512 on the network to determine it's network address. In one embodiment, the IED may be configured for a specific address. It should be appreciated that such an advertisement protocol does not require that the advertiser, i.e., the IED 1502, know the recipient of the advertisement message. This may be achieved by using non-connection oriented protocols, such as multicast and anycast UDP, though other such protocols exist.

In one embodiment, the IED 1502 may be configured to operate under a UPnP protocol. The UPnP is a protocol which allows devices to advertise what functionality is available, as well as provide status updates to a registered client. UPnP is a public protocol, specified in IEC 29341, which devices on a network can use to advertise to other devices on that network that they support certain services. Such a device, e.g., an IED, that advertises services is known as a root device. Devices which listen for service announcements are known as control points. Other service advertisement protocols exist, which could also be used.

Figure 15B:
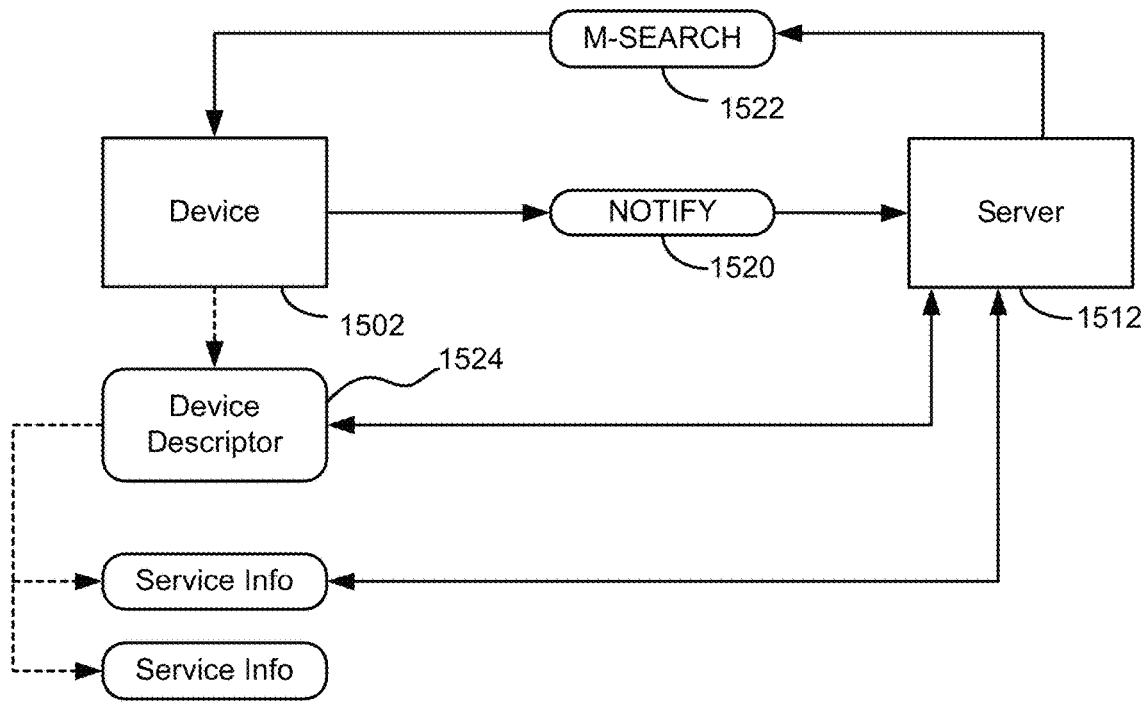
FIG. 15B illustrates a network discovery feature of an intelligent electronic device in accordance with another embodiment of present disclosure.

Referring to FIG. 15B, IED 1502 is configured as a UPnP root device and operates by periodically broadcasting a SSDP NOTIFY message 1520 to the UDP multicast address 239.255.255.250, port 1900 of server 1512. SSDP (Simple Service Discovery Protocol) is an extension to the HTTP protocol, which uses the commands NOTIFY 1520 to advertise services, and M-SEARCH 1522 to query for services. The NOTIFY 1520 contains information such as the location and USN (Unique Service Name), which are used by the control point to further query the root device for additional information about the service. The location parameter is an XML formatted file, called a device descriptor 1524, which contains information about the device, such as manufacturer, model, serial, and a list of services which the device supports. Each service has a type code, which identifies how the control point should interact with the service, and what features it supports. For example, network storage devices use the type "schemas-upnp-org:service:nascontrol", and media players include services such as "schemas-upnp-org:service:ConnectionManager". Each of these services also contain a control and event URL, which are used by the control point to send commands and request updates from the device via SOAP messages.

Additionally, control points can broadcast a SSDP M-SEARCH message to UDP multicast address 239.255.255.250, port 1900, which a root device will respond to by unicasting a NOTIFY to the requester.

Because UPnP relies on UDP multicast, it is restricted to a local network. This can be overcome through the use of gateway devices, such as routers that support bridging multicast messages across two networks, such as the use of the Internet Gateway Device Protocol, via other communication topologies described above.

In one implementation of UPnP for auto-discovery, a unique device types may be used in the model field of the device descriptor file. Control points could then detect the known device, and parse the connection information from the rest of the parameters. In another implementation, unique service type codes are to be used in the NOTIFY 1520 and M-SEARCH 1522, for example by using a "manufacturer: service:modbus" for devices which support Modbus connections, or "manufacturer:service:web" for devices which support HTTP web services. Control points could then detect the known service, and parse the connection information from the rest of the parameters. Additionally, control points could send M-SEARCH requests to elicit NOTIFY's from all devices that supported the requested connection type.

The IED may be configured to support the UPnP protocol by customizing the network discovery module 1414 for the features which the device supports. For example, service control commands may allow for a security risk in the IED, and could be left out of the implementation if not required. As another example, service events may also allow for a security risk in the IED, and could be left out of the implementation if not required. As another example, the use of specific service types, such as "manufacturer:service:modbus" could be implemented. When the device UPnP protocol was started, it could broadcast a NOTIFY with the services supported, and further repeat that NOTIFY on a timer. It could also listen for M-SEARCH requests, and respond with a NOTIFY to each requester. It could also listen for service descriptor requests, typically as web requests over HTTP, and respond with the descriptor xml file.

In a further embodiment, the network discovery module 1414 is configured to use a public server with a known address as an address book. When the IED starts, the network discovery module 1414 sends a message to the public server to register it's address, and any client may query this public server to get the address of the device. This known address may be implemented as either a fixed IP address, or a DNS address. The public server may be configured to have the entries in the address book be removed after a period of time of no activity from the IED Therefore, the network discovery module 1414 may update the public server periodically with a new registration, but would allow dead entries to be removed. It is to be appreciated that the public server may be configured to act as a communications relay with the IED In this way, the client never needs to know the address of the IED, nor needs there be a direct communications path from the client to the IED For example, the client may query the public server for a list of all available devices, and the user would select which of those devices they wish to communicate to. The client may then send the messages to the public server, addressed for the selected device, which would then relay the messages on to the appropriate network address of the device. When the device responded, the public server would then relay the response to the client.

Since the public server could possibly be accessed by multiple users, and it may be desired that those users not be able to access each others' devices, therefore, a user id may be configured, where each IED registered in the public server would have a user id attached to it, possibly assigned when the user purchases the IED This could also have the added benefit of preventing the user from reselling the device without including the original seller in the transaction. The user id may then be entered into the client software when the user queries the public server. When the client queries the public server for the list of known devices, and when it sends a message to such a device, it would include the user id, which the public server would use to verify and filter the allowed actions.

It is to be appreciated that other methods may be employed by the IED to avoid misconfiguration by the a user. For example, the network discovery module 1414 may prompt a user to verify the settings configured by the user before allowing them to be used. For example, if the user configures the device to have an IP address that is already in use on the network. As another example, if the user adds a log item that doesn't exist. In one embodiment, the IED is configured via a user interface (UI), such as a web page generated by web server module 1402, where the UI prevents the user from entering such invalid configurations. In another embodiment, when the configuration is posted to the device, for example with an HTTP POST, the data could be passed to another element of the UI, which would verify the configuration, possibly notifying the user of errors. Another possible implementation could be after the configuration has been posted to the device, it is passed to another application, which verifies that it is correct, possibly generating a report of errors that could be used by the UI to notify the user of such errors. In one implementation, the modified configuration used by the device is not implemented until the new configuration is verified.

As mentioned previously, one source of error when configuring devices is when having to update multiple devices with the same, or similar, settings. This is further complicated when there are settings which need to be different between each device. For example, the designation of each device should be different. This is further complicated when there are different settings which need to be different between each device. For example, on meter may require a different CT Ratio then all the other meters, and another meter may require a different hookup setting then the other devices.

Figure 16:
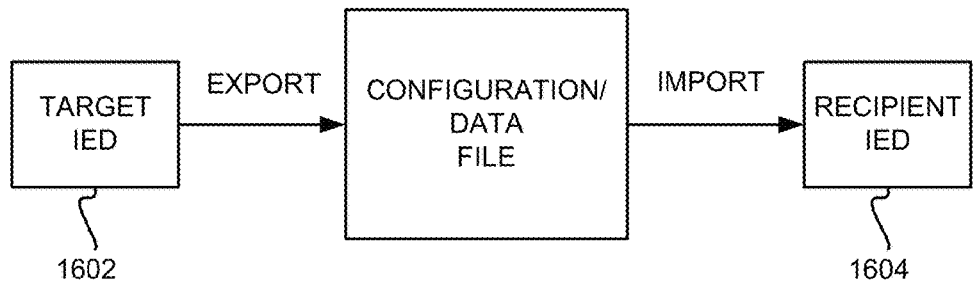
FIG. 16 illustrates a replication feature of an intelligent electronic device in accordance with an embodiment of present disclosure.

Referring to FIG. 16, one implementation to update multiple devices is to enable the configuration/data of the device to be exported from the target device 1602, and then imported to another similar device 1604, e.g., a recipient device, via replication module 1416. It is to be appreciated that, in another embodiment, the replication of the configuration/data data may be initiated from the receipt device 1604 which imports the configuration/data from a target device 1602, via the replication module 1602.

Figure 17:
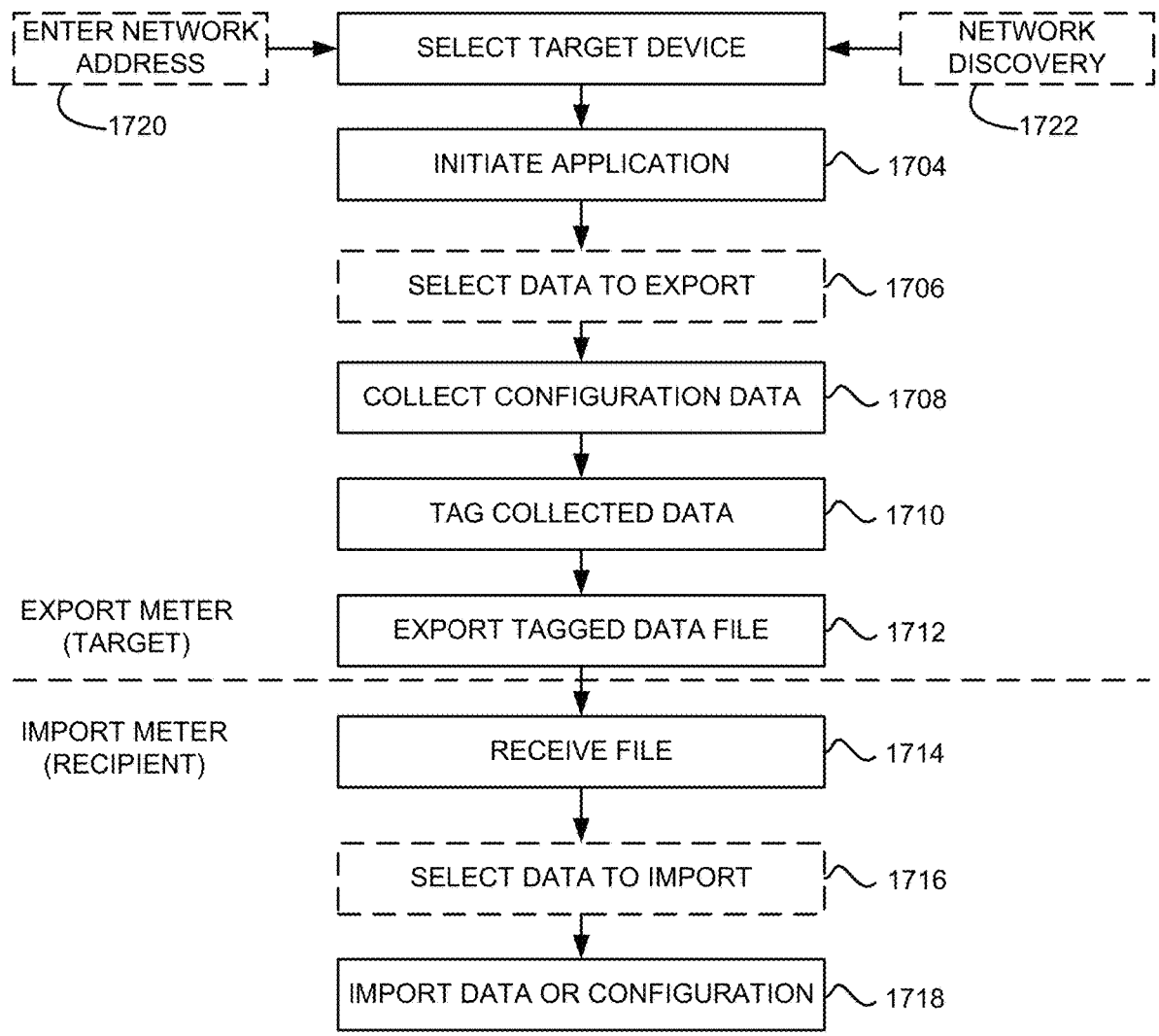
FIG. 17 is a method for replicating data/setting of an intelligent electronic device in accordance with an embodiment of present disclosure.

Referring to FIG. 17, a method for replicating a IED is illustrated. In step 1702, an IED is selected from which configuration/data is to be exported. The replication application or module 1416 is then initiated, in step 1704. In step 1708, the replication module 1416 collects all the configurations of the device, and outputs those configurations in a file format, that can then be returned to the user, in step 1712. A replication module on another IED may then take this file, step 1714, uploaded to the other IED by the user, and parse out the configurations contained within, updating the IED, step 1718.

In one embodiment, the collected data is tagged by replication module 1416 before exporting the file, step 1710. These configuration/data files could be tagged using a text based tag-value pair format, where the tag is a key to the setting, and the value is a string representation of the value. Then, when the settings are transferred between devices, even if those devices are not the same device and thus have different internal formats and layouts for their settings, the settings in the configuration file can still be loaded and used. In one embodiment, settings or configuration data which do not apply to the recipient device can be ignored.

In other embodiments, the data is not tagged but imported from the target device 1602 based on a location where the data or configuration settings are stored, e.g., based on a map or index.

Optionally, the user may be provided with a UI where the user could select what settings they would want to export/import. Referring back to FIG. 17, the user can select the configurations/data to export before the replication module 1416 collects the data. Alternatively, the UI on the recipient device could allow the user to select what settings they would not want to import, step 1716. For example, the communications settings may be select to not be imported. As another example, just the log settings may be selected to be imported.

Another possible implementation of the configuration files could be to have individual configuration files exported for each category of configuration, allowing individual sections to be updated independently. This could be further improved by providing the user with a UI that they could select what settings they would want to export. Then, only those settings would be imported. Alternatively, the user could select just the configuration files they wished to import.

This manual copying of configuration settings could be cumbersome. Therefore, in one embodiment, the replication module 1416 is configured to request the settings from another device, and import those settings, also known as settings replication. In one implementation, the UI enables the user to enter the network address of the device to replicate, step 1720, along with the settings to include. When the user tells the device to begin, the replication module 1416 requests the configuration files from the device to be replicated, and then imports the configuration files.

The selection of the device to replicate may be further simplified by supporting the same network discovery functionality that the external clients have. For example, a device may query the list of all other similar devices step 1722, and present that list to the user to select which device to replicate, step 1702. Additionally, the user may be presented with a list of features and settings which each device supports. One possible implementation of this could be to use the service discovery feature of the network discovery functionality, such as the service advertisement of UPnP, as described above. Another possible implementation could be for each device to provide a settings file which contains the list of all settings it supports. These lists could then be displayed to the user on the UI to assist them in deciding which device to replicate. For example, the list could be displayed as a text list of each setting supported. As another example, the list could be displayed as a list of icons, each icon uniquely identifying the setting it represents. Alternatively, the user could select which features are required for replication, and only devices which support those features would be displayed.

Sometimes, when a device is retired from service, it would be desirable for the device which it replaces to act as if it was the previous device, including the data that the previous device recorded. For example, a meter may have an error in the hardware, requiring that it be replaced. The meter has been recording voltage, current, and energy for the previous year, and that history is used, and expected, by external client software. Here, the replication module 1416 is to include data files, here called data replication. This data replication could support all the functionality previously described. This replication could be further extended by allowing the direction of the replication to be reversed. For example, a device could present a UI that would allow the user to select a device for this device to replicate to, called the target. The device could then upload it's settings and data to the target.

One implementation of the meter replication file could be to store the replication settings using XML. XML (Extensible Markup Language) is a markup language that defines a set of rules for encoding documents in a format that is both human-readable and machine-readable. It defines information as a combination of nodes and attributes, such that a well defined hierarchy of information is possible. Many other formats have been defined based on XML, which could also be used, such as SOAP and XHTML.

For example, the communications settings for the device could be defined as a node in the XML document, which then contained a separate node for the communications parameters of each port. Each of these communications nodes could then specify the port settings, such as baud rate, parity, and address, as attributes, though they could also be specified as nodes.

As another example, the logging settings could be specified as a node in the XML document, which then contained a child node for each item to be logged. The item node could then specify the logging information, including the internal item to be logged, as well as the rate that it is to be logged at, as attributes. The root logging node could also provide a default logging interval as an attribute.

As another example, the XML document may contain both the communications node, the logging node, and any other sections of settings that have been defined. When importing and processing the settings, the device would then process the name of the XML node to determine what settings it refers to.

The meter replication file could be further extended by also using it for the configuration of the meters settings, as well as for the internal storage of the meter's settings. For example, the exported settings file could be manipulated on the client computer, either by hand or by a configuration software, and then imported back into the meter. As another example, a webpage displayed by the meter's web server could use JavaScript or PHP to manipulate the settings file used by the meter.

Intelligent meters may need to store the measured readings for a period of time, often in a data structure called a log. As storage media get larger, more values can be stored, and for a longer period of time. However, there is still a limit on how much data can be stored. Unfortunately, the expectation of what can be stored often outpaces the actual space to store it in. Another problem that occurs when more data is stored is that it takes longer to find any single point in the data, as more entries need to be searched.

Many common systems exist to provide the ability to store information, however, many of them focus on either providing a relation between two entries, allowing entries to be modified frequently, or storing predefined data. Devices such as intelligent meters have a unique set of requirements:
  Data is infrequently inserted, but often at an even interval.
  Data is timestamped, and most often inserted in a linear order. This means that the data is often added by appending after the previous related entry. The result of this is that the data is often sorted in time naturally.
  The data requires very few, if any, updates to existing entries.
  Requests to read the data are often infrequent, but often require a large number of entries to be returned. However, this can frequently be just a large portion of the larger Log, where the location in the log may be changing all the time.
  New sources of data could be added, or an old one removed, at any time. Many devices solve this problem by forcing the Logs to be cleared and reformatted, however this could lead to a loss of data.

Figure 18:
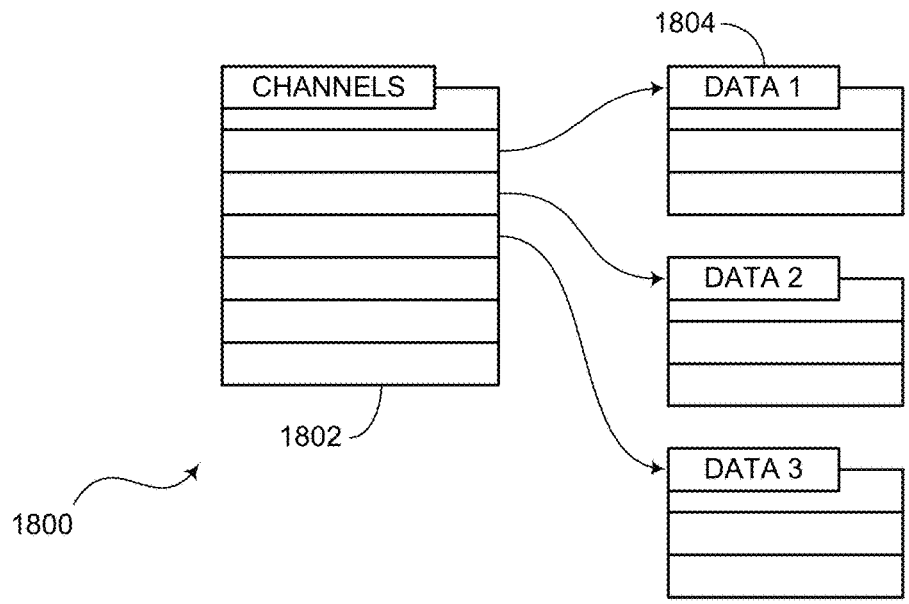
FIG. 18 illustrates a logging or storage feature of an intelligent electronic device in accordance with an embodiment of present disclosure.

In one embodiment to meet these requirements, an IED of the present disclosure includes a logging module 1418 that employs a general purpose database 1800, such as relational databases like PostGreSQL, SQLite, or a custom database built for the purpose, and store the data for each data source, here called a channel, in a separate table 1804, as shown in FIG. 18. Employing a general purpose database 1800 provides the following advantages. First, segregating the channels from each other allows you to query just the data you are looking for, without requiring that the channels be hard coded, or uniform. Second, the table size is kept small, which minimizes the processing required to filter the records that are being requested. Thirdly, since each table is unique to a channel, extra information about which channel a record applies to need not be stored, which can save significant space when many records are stored.

It is to be appreciated that the term channel refers to any data item that can be logged. For example, volts AN may be a channel, but so could internal watt-hr readings, current time, processor usage, allocated memory, etc.

To index each of these channel tables 1804, a channel reference table 1802 is configured to indicate which table contains which channel. The channel reference table 1802 may also contain analysis information about each channel, such as the time range of the data contained within, to help optimize access to the data without hard coding what the channels contain.

The logging module 1418 may be further configured to analyze existing logs and to reduce the amount of space that the log takes when possible. In one embodiment, the logging module 1418 compresses each entry of the log, called a record, so as to reduce the size it takes. In another embodiment, the logging module 1418 combines records of a channel on a time range. For example, all the records for Volts AN for a single day could be combined into a single record, where a binary representation of each of the original records is stored in a single binary array of the resultant record. This results in an increase in speed querying records, as the number of records searched over would be reduced. Since the individual records in the binary array would be in a time sorted order, and a small search space, little performance hit would be seen parsing out the single records required. This also results in a decrease in the space required to store the records, as many databases require additional maintenance space for each record.

Combining records may be further improved by compressing the binary array stored in the combined record, further decreasing the space required, while only requiring a small speed hit decompressing the binary array when queried. The compression could be implemented by the logging module 1418 by compressing the data at the time of combining the records. The decompression could be implemented by a client at the time of request. The decompression could also be implemented by the data type of the database, expanding to fill the record set being returned to the application on request.

Figure 20:
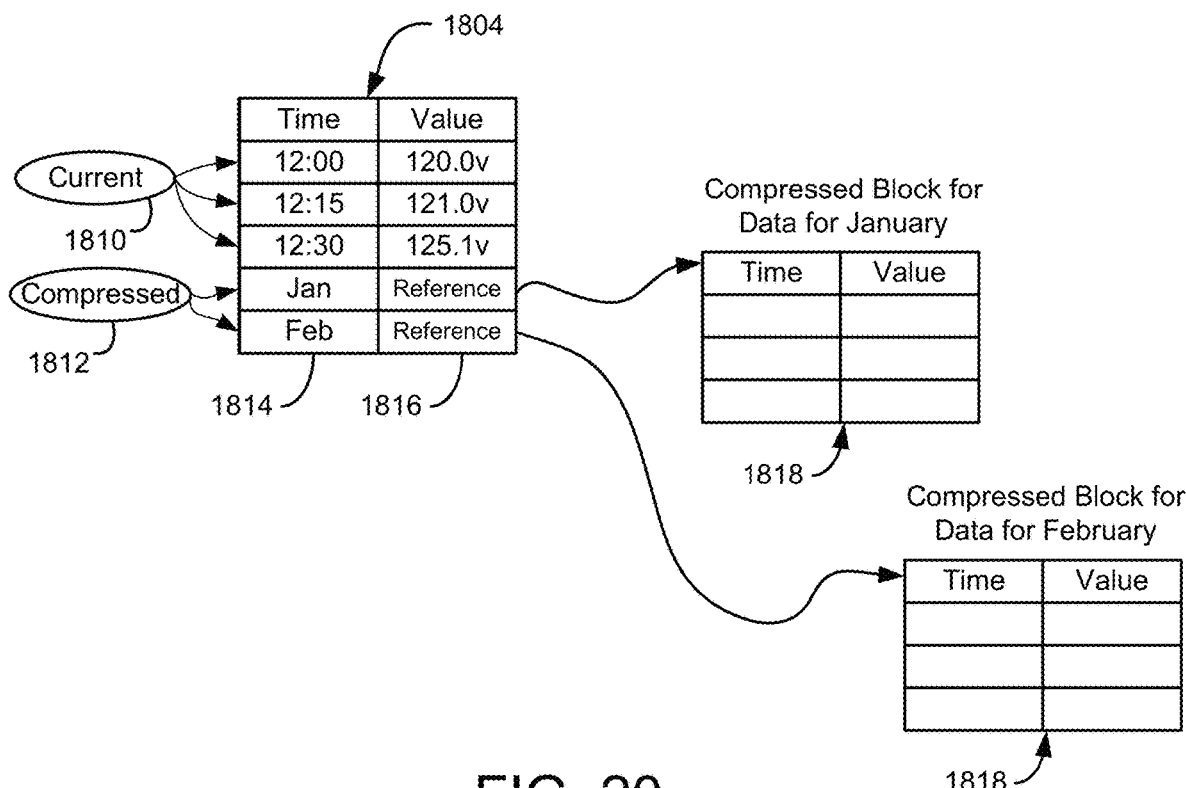
FIG. 20 illustrates combining records of a data table of an intelligent electronic device in accordance with an embodiment of present disclosure.
Figure 19:
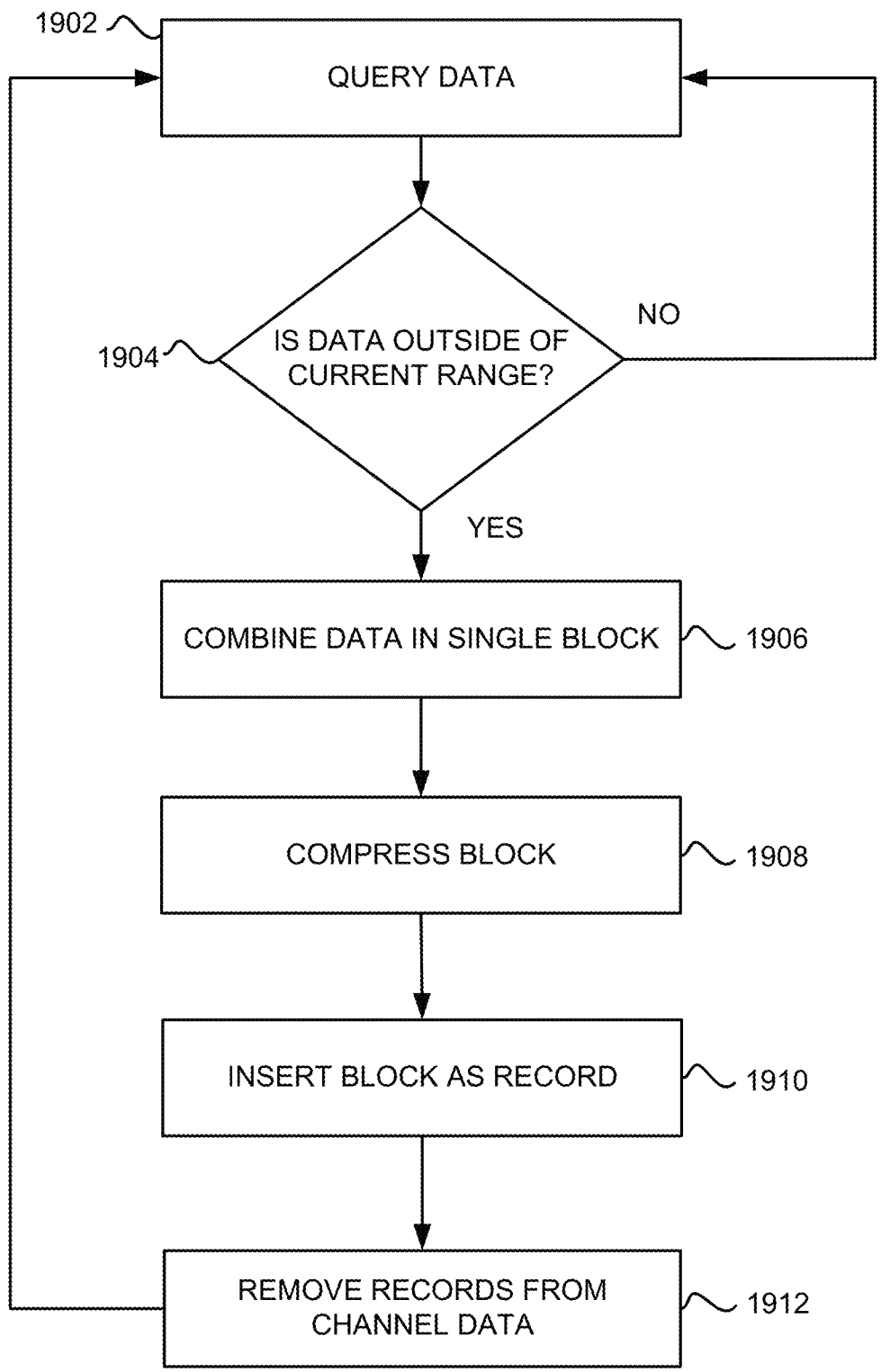
FIG. 19 is a flow chart illustrating a method for combining data of an intelligent electronic device in accordance with an embodiment of present disclosure.

In another embodiment, the logging module 1418 may only combine the records after a period of time has elapsed, or the records are of a certain age, as shown in FIGS. 19 and 20. For example, the most recent month of records could be kept uncombined, and all records prior to that could be combined. This would allow faster and easier access to recent data, as it would not require reversing the combining. Referring to FIGS. 19 and 20, the logging module 1418 may be configured to periodically check the log data stored in the database, and combines records which are over a configured date range from the current date. Initially, in step 1902, the logging module 1418 queries the data tables 1804 to determine if any of the data is outside of a predetermined range, e.g., a particular month. If the data is within the predetermined range, step 1904, the logging module 1418 continues to monitor the data. If the data is not within the predetermined range, the logging module 1418 combines the data outside the predetermined range into a single block, step 1906. Next, in step 1908, the block is compressed and inserted as a record in the table 1804, step 1910. This data is then removed from the channel data, step 1912. As shown in FIG. 20, data table 1804 includes current data 1810, e.g., data with the predetermined range, and references to compressed data 1812. For the current data 1810, a time field 1814 indicates a time the data was recorded and a value field 1816 includes the recorded value. For the compressed data 1812, a time field 1814 indicates a range of the compressed data, e.g., the month of January, and a value field 1816 includes a reference to the compressed block 1818.

Additionally, the logging module 1418 may scan the records at the time of insert, and combine any uncombined records which are outside the current date range. Furthermore, this functionality may be implemented in the database engine itself, combining and uncombining the records transparently to the applications that read and write to the database. For example, this could be implemented as a custom data type that stores a time sorted array of values. As another example, this could be implemented as a custom action, such as a stored procedure, which performs the check and combine whenever records are inserted to the database. As another example, this could be implemented as a custom database table format, along with a custom interface to that table, that reads and writes the records appropriately.

Users often expect data to be available for the length of time that there is enough storage to hold. However, many devices require that their logs be cleared and reformatted if any changes were made to related settings. For example, many devices store their channels by combining each channel into a single record. If the list of channels that are being stored changes, this requires that the log be cleared and reformatted. If the user does not store the data locally, then the data is lost. Additionally, even if the user does store the data locally, they must then provide a way for that data to be transferred to other users, as they can no longer go to the device for the data.

On many devices, this problem is mitigated by the fact that the device only has a limited space in which to store records, often being exceeded before such configuration changes require action. With the space for long term storage however, this issue must be addressed. By storing log data where each channel is stored as it's own table, as described above, the need to change the format of the log when a channel is added or removed is eliminated.

A related issue to long term storage of reconfigured data is how to store and represent the data, when the configuration of how to interpret that data changes. For example, devices such as meters often have two versions of the voltage they measure: the primary value, which is presented to the user, and the secondary value, which is directly what the device reads. The primary value could be much higher then the device is capable of measuring, so the value is scaled down to the input range of the device, and a ratio, called the PT ratio, is applied to scale the value back up to the original range. If the secondary value is stored, and the PT ratio is changed, then the primary value may not be recoverable. As another example, users often want to see the energy values scaled with a certain number of decimal places, which is sometimes hard coded in the stored format of the energy.

In one implementation, the IED 1100 includes a formatting module 1420 configured to format measured and logged data. So that log values do not have to be cleared when settings are changed, the formatting module 1420 stores all values in the final format, such that even if the configuration of the device is changed, the values are still meaningful. For example, voltage could always be stored in primary. As another example, energy could always be stored as a binary number, scaled to units.

In another embodiment, the formatting module 1420 stores all values as text strings. This would easily allow the values to be of arbitrary resolution, though they would always be unit scaled. For example, voltage could be represented as "120.7". As another example, 75.3 kilo-watt-hours could be represented as "75300".

The formatting module 1420 may be further configured to keep track of the settings which relate to a channel, and then uniquely tie that to each value, such that the correct value could be reproduced when necessary. In one embodiment, the formatting module 1420 created a settings history table, which is referenced by the channel values. This has the added advantage of being able to view the history of settings in the device.

Users often want data to be presented to them in a specific format, which may not match the internal storage format. Therefore, the formatting module 1420 may be further configured to include conversion functionality, such that if the user asks for data in a specific format, the conversion functionality reformats the internal data into the requested format. Since only the one format is ever internally stored, no extra space is required. For example, the user could ask for a csv file with the log data, and the functionality could convert the internal database data into string timestamps and values, and return the requested file. In one embodiment, the formatting module 1420 includes an application for each format required, where each application would take as input the parameters of conversion, such as the channels required, and output a file in the new format. In a further embodiment, the formatting module 1420 may be configured to output the new format to an interface string buffer, called Standard Out, which another application could take as input, called Piping. These applications could then be called by UI applications, such as the web server application, to acquire and present the formatted data to the user.

The conversion could be further improved by adding value to the formatted data. The formatted data may be displayed in a graphical format, such as a graph. Another possible way to add value could be to analyze the data, and generate a report. Another possible way to add value could be to aggregate multiple channels together, to generate a new data set. For example, 2 pulse accumulators could be added together to give a $3^{rd}$ accumulator value. As another example, a pulse accumulator could be subtracted from a energy accumulator, to give a $3^{rd}$ accumulator value.

The conversion could be further improved by passing the formatted data to another application, that generates a report file in a more common format. For example, a csv file could be generated, then passed to an application that converts that data to a PDF report. As another example, the formatting module 1420 converts the internal data to a csv file. As another example, the formatting module 1420 generates a graph of a channel's value over time; this graph may be outputted as a picture file, or as a set of data that could be graphed by another application. As a further example, the formatting module analyzes the energy usage over time, applies a time of use rate structure to the interval energy usage, and outputs a file where the energy usage is aggregated and binned according to the rate structure. As yet another example, the formatting module 1420 analyzes the measured readings over time, and prepares a standards report, such as an EN50160 report. As another example, the formatting module 1420 analyzes the power quality recordings of the device over time, attempts to detect problems with the system that the device is measuring, and presents a report to help the user detect problems.

The use of the conversion to query data for the user could be further extended by dynamically generating the parameters to the conversion application from the UI. For example, the web server application 1408 may have a page that takes a dynamic parameter list as input to the page as part of the address. These parameters could then be passed to the conversion application. This parameters could include the channels to use, the date range to query, the format of the output.

In addition to channel data, the above mentioned techniques could also be applied to other logged values, such as power quality events, system logs, and waveform captures. In these cases, the data unique to that event is the 'data' of the channel described in the above techniques.

With multiple applications performing the analysis and storage of log data, it is important to know when that data should be stored, and to synchronize what data is stored. For example, an interval log may want to record every 15 minutes; if the data is recorded at 12:15:17, then it is late, and not valid. As another example, if a waveform event occurs, such as a sudden dip in the voltage measured, a power quality event may be recorded, as well as the waveform sample data, as well as the measured readings at the time of the event. If all these records do not refer to the same point in time, then the event cannot be fully analyzed.

The logging module 1418 is further configured to detect a system wide event, which the logging module 1418 wait on to record their data. In one embodiment, the logging module 1418 watches for such events, and when they occur, generates this event. When each individual logging application sees this event, they record their relevant data.

In another embodiment, this trigger may be caused by a user action, such as clicking a button on a web page. This user trigger may be configured to allow the user to specify a number of repeats, an interval between those repeats, a period in which to apply this logic, and a set of logic that would lead to that trigger occurring. For example, a trigger could be set up that performs a waveform capture every minute for 10 minutes. As another example, a trigger could be set up that triggers if a digital input reads 1, and voltage is above 130v, and its between the hours of 6 pm and 6 am.

Since the logging module 1418 may not have the ability to capture the relevant data before that data is replaced, the logging module 1418 will record the trigger of the event including the buffer index of the data in question. This way, each of the loggers can be synchronized in time. For example, if the watch application detects an event in data buffer 17, and when the logging applications go to record that data the current data buffer is 23, they can query the data from buffer 17 to be logged. The use of the buffer index could be improved by the logging applications also being able to query the buffers before and after the event's buffer index. This would allow logging applications to record information about a larger period of time. For example, a waveform logger could log the waveform samples from before and after the event, giving a picture of what led up to the event, and the after effects.

Users often use multiple browsers to view webpages, such as Internet Explorer, Firefox, Opera, Chrome, and Safari. As each of these browsers work differently, webpages that use JavaScript must often contain additional code to detect and work properly on each of these browsers. Additionally, the method of manipulating a webpage with JavaScript, which uses the webpage's DOM, or Document Object Model, is confusing, difficult to use, and can be error prone. Additionally, JavaScript provides poor support, which is often browser dependent, for processing data files transferred from the device.

One implementation is to configure a JavaScript library which extends and simplifies these tasks, on the webpages presented by the device's web server. For example, a JavaScript library could be used to read a list of waveform samples from the device, and another JavaScript library could be used to draw an oscilloscope of the waveform on the webpage. This has the added benefit of reducing the amount of data transferred from the device to the client, as a list of samples is smaller than a picture rendered on the server. As another example, a JavaScript library could be used to simplify the generation of tables of log records, including historical value records, system events, or power quality events. As another example, a JavaScript library could be used to periodically query for new data, and display that data live. As another example, a JavaScript library could be used to perform an asynchronous query of data, such as using Ajax, so the webpage could continue to be updated while the device transfers the data to the client.

One such library is jQuery, a multi-browser JavaScript library designed to simplify the client-side scripting of HTML. jQuery's syntax is designed to make it easier to navigate a document, select DOM elements, create animations, handle events, and develop Ajax applications. jQuery also provides capabilities to create plug-ins on top of the JavaScript library. This enables abstractions to be created for low-level interaction and animation, advanced effects and high-level, theme-able widgets. The modular approach to the jQuery library allows the creation of powerful dynamic web pages and web applications.

Another such library is Dojo Toolkit, a JavaScript framework targeting the many needs of large-scale client-side web development. For example, Dojo abstracts the differences among diverse browsers to provide APIs that will work on all of them (it can even run on the server under Node.js); it establishes a framework for defining modules of code and managing their interdependencies; it provides build tools for optimizing JavaScript and CSS, generating documentation, and unit testing; it supports internationalization, localization, and accessibility; and it provides a rich suite of commonly-needed utility classes and user-interface widgets.

Another such library is D3.js and Protovis, JavaScript libraries to display digital data in dynamic graphical forms. Embedded within an HTML webpage, the JavaScript D3 js library uses pre-built JavaScript functions to select elements, create SVG objects, style them, or add transitions, dynamic effects or tooltips to them. These objects can also be widely styled using CSS. Large datasets can be easily bound to SVG objects using simple D3 functions to generate rich text/graphic charts and diagrams. The data can be in various formats, most commonly JSON, CSV or geoJSON, but, if required, JavaScript functions can be configured to read other data formats. The atomic concept of D3 design is to first use a CSS-style selector to select a given sets of DOM-nodes, then use operators to manipulate them in a similar manner to j Query.

Many other such JavaScript libraries which provide webpage manipulation, data querying, and graphic drawing functions exist, and could also be used.

Further features and implementations of the enterprise-wide energy management reporting, analysis and billing system of the present disclosure may become apparent to one of ordinary skill in the art from an understanding of the description provided herein. It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device (IED) comprising:
at least one sensor configured to measure at least one parameter of an electrical distribution system and provide an output signal indicative of the at least one measured parameter;
at least one analog-to-digital converter configured to receive the output signal and convert the output signal to a digital signal;
at least one processing device configured to execute a plurality of instructions to implement a general purpose operating system;
a system architecture employing the general purpose operating system, the system architecture including a plurality of layers, each layer adding functionality to the layers below, wherein the general purpose operating system is configured for executing a plurality of applications, each application configured to implement predetermined functionality based on the at least one measured parameter, wherein each of the applications is configured to execute independently of the other applications, wherein one of the applications is a web server application configured to generate a web page at a client device, the web server application including a library of scripts, each script configured to execute in at least one browser application at the client device to manipulate the at least one measured parameter; and a communication device that transmits at least one script and/or the measured at least one parameter to the client device, wherein the at least one script includes at least one application programming interface (API) that enables the at least one script to operate on at least two different browser applications, wherein at least another one script generates log records from the at least one measured parameter, wherein the plurality of applications includes a logging module configured to analyze the log records and reduce an amount of storage space occupied by the log records by combining the log records for a given time interval into a single, time sorted, binary array and by compressing the binary array, and wherein the logging module is configured to query the log records to determine if any data corresponding to the at least one measured parameter was logged outside of a predetermined temporal range, wherein the logging module is configured to compress the data logged outside of a predetermined temporal range, and wherein the logging module is configured to insert a reference to the compressed data into the log records and remove the uncompressed data logged outside of a predetermined temporal range.

2. The IED of claim 1, wherein at least one script generates a drawing, a table of the log records, and/or a chart from the at least one measured parameter.

3. The IED of claim 1, wherein at least one script generates at least one scalable vector graphics (SVG) object from the at least one measured parameter, and wherein the at least one script uses the at least one SVG object to generate at least one of text/graphic chart and/or diagram.

4. The IED of claim 3, wherein the at least one measured parameter is formatted in accordance with at least one of javascript object notation (JSON), comma-separated values (CSV) and/or geographic JSON (geoJSON) format.

5. The IED of claim 3, wherein the library of scripts is a D3.js library.

6. The IED of claim 1, wherein the library of scripts is a JavaScript library, and wherein the JavaScript library is at least one of jQuery library, Dojo Toolkit, D3.js library and/or Protovis library.

7. The IED of claim 1, wherein a first at least one script is configured to read a list of the measured at least one parameter and a second at least one script is configured to draw a waveform from the list of the measured at least one parameter.

8. The IED of claim 1, wherein the at least one script is configured to periodically query the IED for new data.

9. The IED of claim 1, wherein the communication device operates on at least one of HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol) and/or Telnet.

10. The IED of claim 1, wherein the intelligent electronic device is an electrical energy meter, a Programmable Logic Controller (PLC), a Remote Terminal Unit, a protective relay or a fault recorder.

11. The IED of claim 1, wherein the intelligent electronic device is a socket type meter, a panel mounted meter, a switchboard mounted meter or a circuit breaker meter.

12. A system for presenting data from a meter on a webpage, the system comprising:

at least one meter including:

at least one sensor configured to measure at least one parameter of an electrical distribution system and provide an output signal indicative of the at least one measured parameter;

at least one analog-to-digital converter configured to receive the output signal and convert the output signal to a digital signal;

at least one processing device configured to execute a plurality of instructions to implement a general purpose operating system;

a system architecture employing the general purpose operating system, the system architecture including a plurality of layers, each layer adding functionality to the layers below, wherein the general purpose operating system is configured for executing a plurality of applications, each application configured to implement predetermined functionality based on the at least one measured parameter, wherein each of the applications is configured to execute independently of the other applications, wherein one of the applications is a web server application configured to generate a web page at the client device, the web server application including a library of scripts, each script configured to execute at the client device to manipulate the at least one measured parameter; and a communication device that transmits at least one script and/or the measured at least one parameter to the client device; and the at least one client device including at least one browser application that executes the at least one script to generate and/or manipulate a web page in the at least one browser application, wherein the at least script includes at least one application programming interface (API) that enables the at least one script to operate on at least two different browser applications, wherein at least another one script generates log records from the at least one measured parameter, wherein the plurality of applications includes a logging module configured to analyze the log records and reduce an amount of storage space occupied by the log records by combining the log records for a given time interval into a single, time sorted, binary array and by compressing the binary array, and wherein the logging module is configured to query the log records to determine if any data corresponding to the at least one measured parameter was logged outside of a predetermined temporal range, wherein the logging module is configured to compress the data logged outside of a predetermined temporal range, and wherein the logging module is configured to insert a reference to the compressed data into the log records and remove the uncompressed data logged outside of a predetermined temporal range.

13. The system of claim 12, wherein a first at least one script is configured to read a list of the measured at least one parameter from the meter and a second at least one script is configured to draw a waveform from the list of the measured at least one parameter.

14. The system of claim 12, wherein the communication device operates on at least one of HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol) and/or Telnet.

15. The system of claim 12, wherein the at least one script is configured to periodically query the meter for new data.

16. The system of claim 12, wherein the library of scripts is a JavaScript Dojo Toolkit library.

17. An intelligent electronic device (IED) comprising:
- at least one sensor configured to measure at least one parameter of an electrical distribution system and provide an output signal indicative of the at least one measured parameter;
- at least one analog-to-digital converter configured to receive the output signal and convert the output signal to a digital signal;
- at least one processing device configured to execute a plurality of instructions to implement a general purpose operating system;
- a system architecture employing the general purpose operating system, the system architecture including a plurality of layers, each layer adding functionality to the layers below, wherein the general purpose operating system is configured for executing a plurality of applications, each application configured to implement predetermined functionality based on the at least one measured parameter, wherein each of the applications is configured to execute independently of the other applications, wherein one of the applications is a web server application configured to generate a web page at a client device, the web server application including a library of scripts, each script configured to execute in at least one browser application at the client device to manipulate the at least one measured parameter; and
- a communication device that transmits at least one script and/or the measured at least one parameter to the client device,
- wherein the at least one script includes at least one application programming interface (API) that enables the at least one script to operate on at least two different browser applications,
- wherein at least another one script generates log records with first data from the at least one measured parameter,
- wherein the plurality of applications includes a logging module configured to analyze the log records and compress at least a portion of the first data into second data to reduce an amount of storage space occupied by the log records,
- wherein the logging module is configured to insert a reference to the second data into the log records so the log records includes both uncompressed first data and the reference to the second data, and
- wherein the log records include a table having a first column and a second column, wherein the first column includes a time, the time for the first data is a shorter temporal period than the time for the second data, wherein the second column includes a value measured at the time for the first data, and wherein the second column includes the reference to the second data at the time for the second data.

18. The IED of claim 17, wherein the logging module is configured to query the log records to determine if any of the first data corresponding to the at least one measured parameter was logged outside of a predetermined temporal range, wherein the logging module is configured to compress the first data logged outside of a predetermined temporal range into the second data, and wherein the logging module is configured to insert the reference to the second data into the log records and remove the uncompressed first data logged outside of a predetermined temporal range.

19. The IED of claim 17, wherein:
- the logging module is configured to reduce the amount of storage space occupied by the log records by combining the log records for the first data of a given time interval into a single, time sorted, binary array; and
- the logging module is configured to reduce the amount of storage space occupied by the log records by compressing the binary array into the second data.

20. The IED of claim 17, wherein at least one script generates at least one scalable vector graphics (SVG) object from the at least one measured parameter, and wherein the at least one script uses the at least one SVG object to generate at least one of text/graphic chart and/or diagram.

21. The IED of claim 17, wherein the communication device operates on at least one of HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol) and/or Telnet.

22. The IED of claim 17, wherein the at least one script is configured to periodically query the IED for new data.

* * * * *